(12) United States Patent
Ohshima

(10) Patent No.: US 9,570,445 B2
(45) Date of Patent: Feb. 14, 2017

(54) SEMICONDUCTOR DEVICE

(71) Applicant: Semiconductor Energy Laboratory Co., Ltd., Atsugi-shi, Kanagawa-ken (JP)

(72) Inventor: Kazuaki Ohshima, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/339,948

(22) Filed: Jul. 24, 2014

(65) Prior Publication Data

US 2014/0332805 A1 Nov. 13, 2014

Related U.S. Application Data

(63) Continuation of application No. 13/473,014, filed on May 16, 2012, now Pat. No. 8,791,516.

(30) Foreign Application Priority Data

May 20, 2011 (JP) .................. 2011-112957

(51) Int. Cl.
*H01L 27/108* (2006.01)
*H01L 27/105* (2006.01)
(Continued)

(52) U.S. Cl.
CPC ......... *H01L 27/105* (2013.01); *H01L 27/0605* (2013.01); *H01L 27/0688* (2013.01);
(Continued)

(58) Field of Classification Search
CPC ................. H01L 27/00; H03K 19/00
(Continued)

(56) References Cited

U.S. PATENT DOCUMENTS 5,465,235 A  11/1995  Miyamoto
5,731,856 A   3/1998  Kim et al.
(Continued)

FOREIGN PATENT DOCUMENTS

EP   0942535 A    9/1999
EP   1737044 A   12/2006
(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.
(Continued)

*Primary Examiner* — Telly Green
(74) *Attorney, Agent, or Firm* — Robinson Intellectual Property Law Office; Eric J. Robinson

(57) ABSTRACT

A semiconductor device having a novel structure is provided. The semiconductor device includes a first p-type transistor, a second n-type transistor, a third transistor, and a fourth transistor. One of a source and a drain of the third transistor is connected to a wiring supplying first potential, and the other is connected to one of a source and a drain of the first transistor. One of a source and a drain of the second transistor is connected to the other of the source and the drain of the first transistor, and the other is connected to one of a source and a drain of the fourth transistor. The other of the source and the drain of the fourth transistor is connected to a wiring supplying second potential lower than the first potential. An oxide semiconductor material is used in channel formation regions of the third transistor and the fourth transistor.

15 Claims, 27 Drawing Sheets

(51) Int. Cl.
*H01L 27/06* (2006.01)
*H01L 27/092* (2006.01)
*H01L 27/12* (2006.01)
*H03K 19/00* (2006.01)
*H03K 19/177* (2006.01)

(52) U.S. Cl.
CPC .......... *H01L 27/092* (2013.01); *H01L 27/108* (2013.01); *H01L 27/1203* (2013.01); *H03K 19/0013* (2013.01); *H03K 19/1776* (2013.01); *H03K 19/17772* (2013.01)

(58) Field of Classification Search
USPC ........... 326/102, 41, 38; 257/43, 296, 57, 59
See application file for complete search history.

(56) References Cited

U.S. PATENT DOCUMENTS

| | | | |
|---|---|---|---|
| 5,744,864 | A | 4/1998 | Cillessen et al. |
| 6,034,563 | A | 3/2000 | Mashiko |
| 6,181,165 | B1 | 1/2001 | Hanson et al. |
| 6,294,274 | B1 | 9/2001 | Kawazoe et al. |
| 6,307,397 | B1 | 10/2001 | Mueller et al. |
| 6,313,663 | B1 | 11/2001 | Mueller et al. |
| 6,359,471 | B1 | 3/2002 | Mueller et al. |
| 6,472,291 | B1 | 10/2002 | Page et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,843,243 | B2 | 11/2010 | Kim |
| 7,929,332 | B2 | 4/2011 | Fujita |
| 8,222,092 | B2 | 7/2012 | Yamazaki et al. |
| 8,294,212 | B2 | 10/2012 | Wang et al. |
| 8,304,298 | B2 | 11/2012 | Ofuji et al. |
| 8,399,935 | B2 | 3/2013 | Liaw |
| 8,476,927 | B2 | 7/2013 | Nishijima |
| 8,884,651 | B2 * | 11/2014 | Yamazaki et al. .............. 326/81 |
| 9,136,390 | B2 | 9/2015 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2005/0205880 | A1 | 9/2005 | Anzai et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0084235 | A1* | 4/2008 | Russell ............ H03K 3/356156 327/218 |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0143410 | A1 | 6/2008 | Onishi et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0045179 | A1* | 2/2010 | Sano et al. .................. 313/505 |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0109708 | A1* | 5/2010 | Koyama ............ H01L 27/1225 326/96 |
| 2011/0084267 | A1 | 4/2011 | Yamazaki et al. |
| 2011/0090184 | A1* | 4/2011 | Yamazaki ........... H01L 27/1225 345/204 |
| 2011/0210328 | A1 | 9/2011 | Yamazaki et al. |
| 2011/0212571 | A1 | 9/2011 | Yamazaki et al. |
| 2011/0215318 | A1 | 9/2011 | Yamazaki et al. |
| 2011/0221475 | A1* | 9/2011 | Koyama et al. .............. 326/120 |
| 2012/0063206 | A1 | 3/2012 | Furutani et al. |
| 2012/0274355 | A1 | 11/2012 | Nishijima |
| 2012/0293201 | A1* | 11/2012 | Fujita et al. .................... 326/38 |
| 2016/0005876 | A1 | 1/2016 | Yamazaki et al. |

FOREIGN PATENT DOCUMENTS

| | | |
|---|---|---|
| EP | 2226847 A | 9/2010 |
| JP | 60-198861 A | 10/1985 |
| JP | 62-011322 A | 1/1987 |
| JP | 63-120522 A | 5/1988 |
| JP | 63-210022 A | 8/1988 |

(56) References Cited

FOREIGN PATENT DOCUMENTS

| | | | |
|---|---|---|---|
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 02-119422 A | 5/1990 | |
| JP | 02-232577 A | 9/1990 | |
| JP | 04-271516 A | 9/1992 | |
| JP | 05-251705 A | 9/1993 | |
| JP | 08-264794 A | 10/1996 | |
| JP | 09-116417 A | 5/1997 | |
| JP | 11-505377 A | 5/1999 | |
| JP | 11-298313 A | 10/1999 | |
| JP | 2000-044236 A | 2/2000 | |
| JP | 2000-150900 A | 5/2000 | |
| JP | 2001-223563 A | 8/2001 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2005-064701 A | 3/2005 | |
| JP | 2005-339590 A | 12/2005 | |
| JP | 2009-004733 A | 1/2009 | |
| JP | 2010-171404 A | 8/2010 | |
| JP | 2011-100994 A | 5/2011 | |
| TW | 200908558 | 2/2009 | |
| TW | 201112404 | 4/2011 | |
| WO | WO-01/56031 | 8/2001 | |
| WO | WO-01/56032 | 8/2001 | |
| WO | WO-01/56070 | 8/2001 | |
| WO | WO-01/56155 | 8/2001 | |
| WO | WO-2004/114391 | 12/2004 | |
| WO | WO-2008/143304 | 11/2008 | |
| WO | WO-2011/043194 | 4/2011 | |

OTHER PUBLICATIONS

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m =3, 4, and 5), $InGaO_3(ZnO)_3$, and $Ga_2O_3(ZnO)_m$ (m =7, 8, 9, and 16) in the $In_2O_3$-$ZnGa_2O_4$-ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (1.5-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ As a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

(56) References Cited

OTHER PUBLICATIONS

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT", SID Digest '09: SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer", SID Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YbFe2O4, and Yb2Fe3O7 Types of Structures for Compounds in the IN2O3 and Sc2O3—A2O3—Bo Systems [A; Fe, Ga, or Al; B: Mg, Mn, Fe, Ni, Cu,Or Zn] At Temperatures Over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janottla et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Janotti.A et al., "Oxygen Vacancies In ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B. (Physical Review. B), 2008, vol. 77, pp. 245202-1-245202-6.

Orita.M et al., "Amorphous transparent conductive oxide InGaO3(ZnO)m (m <4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08: Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

(56) References Cited

OTHER PUBLICATIONS

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
International Search Report (Application No. PCT/JP2012/061781) Dated Jul. 17, 2012.
Written Opinion (Application No. PCT/JP2012/061781) Dated Jul. 17, 2012.

* cited by examiner

FIG. 13A　　FIG. 13B
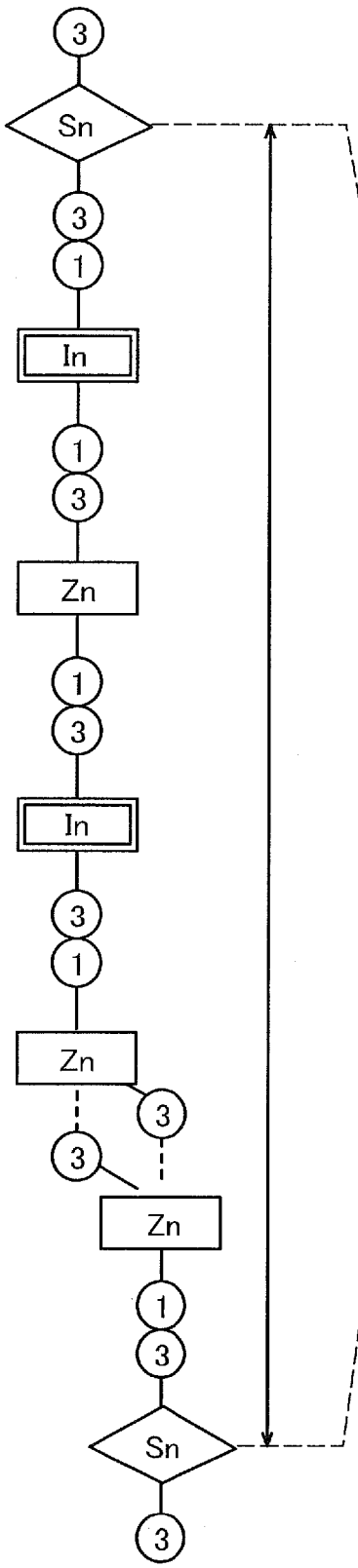
FIG. 13C
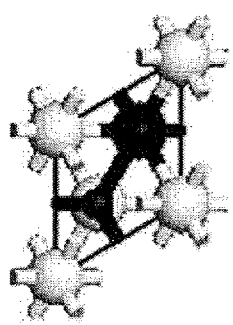
● In
◐ Sn
◌ Zn
● O

● In
○ Ga
○ Zn
● O

FIG. 27A
$$\mu = \mu_0 \exp(-\frac{E}{kT})$$

FIG. 27B
$$E = \frac{e^2 N^2}{8\varepsilon\, n} = \frac{e^3 N^2 t}{8\varepsilon\, C_{ox} V_g}$$

FIG. 27C
$$I_d = \frac{W \mu\, V_g V_d C_{ox}}{L} \exp(-\frac{E}{kT})$$

FIG. 27D
$$\ln(\frac{I_d}{V_g}) = \ln\left(\frac{W \mu\, V_d C_{ox}}{L}\right) - \frac{E}{kT} = \ln\left(\frac{W \mu\, V_d C_{ox}}{L}\right) - \frac{e^3 N^2 t}{8kT\varepsilon\, C_{ox} V_g}$$

FIG. 27E
$$\frac{1}{\mu_1} = \frac{1}{\mu_0} + \frac{D}{B} \exp\left(-\frac{x}{G}\right)$$

SEMICONDUCTOR DEVICE

TECHNICAL FIELD

The present invention relates to a semiconductor device. In particular, the present invention relates to a semiconductor device including an inverter circuit. The present invention also relates to an electronic device including the semiconductor device.

BACKGROUND ART

In recent years, a semiconductor device with low power consumption has started to be used as a component in an electronic device for a reduction in the power consumption of the electronic device. An electronic device includes a variety of circuits such as a CPU, an interface circuit, and a memory element. These circuits are connected by an input circuit, an output circuit, or an input/output circuit.

As an input circuit, an output circuit, and an input/output circuit, a buffer circuit or a three-state inverter (also referred to as "tri-state inverter") circuit is used. In the three-state inverter circuit, output is set to the following three states: "High (HI)," "Low (LO)," and "High impedance (HIZ)."

"High" of the three-state inverter circuit means that the potential of an output terminal is set to the highest potential of the power supply voltage terminal; "Low" thereof means that the potential of the output terminal is set to the lowest potential; and "High impedance" thereof means that the output terminal is set in a floating state.

Transistors included in a three-state inverter each have leakage current, so that leakage of charges or inflow of charges occurs even when the transistor is not selected. Thus, even when the three-state inverter is brought into a high impedance state, leakage current flows to an output terminal through the transistor included in the three-state inverter, which results in an insufficient reduction in power consumption. Further, voltage drop occurs, which causes malfunction.

Patent Document 1 discloses a flip-flop circuit using a three-state inverter in which a transistor with high threshold voltage and a transistor with low threshold voltage are provided together to reduce leakage current flowing when the flip-flip circuit does not operate.

However, in Patent Document 1, high power supply voltage is needed in consideration of the transistor with high threshold voltage in order to secure the operation of the transistor with high threshold voltage. Further, the transistors are each thought to be a transistor formed using a silicon material, and leakage current is kept flowing in the transistors even when the transistors are turned off. Thus, a sufficient reduction in power consumption is not achieved.

REFERENCE

[Patent Document 1] Japanese Published Patent Application No. 2001-223563

DISCLOSURE OF INVENTION

In view of the above problem, an object of one embodiment of the disclosed invention is to provide a semiconductor device in which leakage current in high impedance can be suppressed to reduce power consumption.

Another object of one embodiment of the disclosed invention is to provide a semiconductor device in which an increase in size of a circuit can be suppressed and leakage current can be suppressed.

Another object of one embodiment of the disclosed invention is to provide a semiconductor device in which a circuit can be downsized and leakage current can be suppressed.

In the disclosed invention, a semiconductor device is formed using a purified oxide semiconductor. A transistor formed using a purified oxide semiconductor has extremely small leakage current; thus, power consumption can be reduced. Further, malfunctions of the semiconductor device at the time of high impedance due to leakage current can be prevented.

One embodiment of the disclosed invention is a semiconductor device which includes a first p-type transistor, a second n-type transistor, a third transistor, and a fourth transistor. A gate of the first transistor is electrically connected to a gate of the second transistor. One of a source and a drain of the first transistor is electrically connected to one of a source and a drain of the second transistor. One of a source and a drain of the third transistor is electrically connected to the other of the source and the drain of the first transistor. The other of the source and the drain of the third transistor is electrically connected to a high-potential wiring. A gate of the third transistor is electrically connected to a gate of the fourth transistor. One of a source and a drain of the fourth transistor is electrically connected to the other of the source and the drain of the second transistor. The other of the source and the drain of the fourth transistor is electrically connected to a low-potential wiring. Channel formation regions of the third transistor and the fourth transistor are each formed using an oxide semiconductor material.

In the above structure, the third transistor and the fourth transistor can be provided over the first transistor and the second transistor.

Another embodiment of the disclosed invention is a semiconductor device which includes a first p-type transistor, a second n-type transistor, a third transistor, a fourth transistor, a fifth transistor, and a capacitor. A gate of the first transistor is electrically connected to a gate of the second transistor. One of a source and a drain of the first transistor is electrically connected to one of a source and a drain of the second transistor. One of a source and a drain of the third transistor is electrically connected to the other of the source and the drain of the first transistor. The other of the source and the drain of the third transistor is electrically connected to a high-potential wiring. A gate of the third transistor is electrically connected to a first terminal of the capacitor and one of a source and a drain of the fifth transistor. One of a source and a drain of the fourth transistor is electrically connected to the other of the source and the drain of the second transistor. The other of the source and the drain of the fourth transistor is electrically connected to a low-potential wiring. A gate of the fourth transistor is electrically connected to a second terminal of the capacitor and a first wiring. The other of the source and the drain of the fifth transistor is electrically connected to the high-potential wiring. A gate of the fifth transistor is electrically connected to a second wiring. An oxide semiconductor is used at least in the third transistor, the fourth transistor, and the fifth transistor.

Another embodiment of the disclosed invention is a semiconductor device which includes a first p-type transistor, a second n-type transistor, a third transistor, a fourth transistor, a fifth transistor, a sixth transistor, and a capacitor. A gate of the first transistor is electrically connected to a gate of the second transistor. One of a source and a drain of the first transistor is electrically connected to one of a source and a drain of the second transistor. One of a source and a drain of the third transistor is electrically connected to the other of the source and the drain of the first transistor. The other of the source and the drain of the third transistor is electrically connected to a high-potential wiring. A gate of the third transistor is electrically connected to a first terminal of the capacitor, one of a source and a drain of the fifth transistor, and one of a source and a drain of the sixth transistor. One of a source and a drain of the fourth transistor is electrically connected to the other of the source and the drain of the second transistor. The other of the source and the drain of the fourth transistor is electrically connected to a low-potential wiring. A gate of the fourth transistor is electrically connected to a second terminal of the capacitor and a first wiring. The other of the source and the drain of the fifth transistor is electrically connected to the high-potential wiring. A gate of the fifth transistor is electrically connected to a second wiring. The other of the source and the drain of the sixth transistor is electrically connected to a low-potential wiring. A gate of the sixth transistor is electrically connected to a third wiring. An oxide semiconductor is used at least in the third transistor, the fourth transistor, the fifth transistor, and the sixth transistor.

In the above structure, the third transistor and the fourth transistor can be provided over the first transistor and the second transistor. Furthermore, the capacitor can be provided over the third transistor and the fourth transistor.

In the above structure, a material other than an oxide semiconductor can be used in a transistor other than the transistors including an oxide semiconductor.

In this specification and the like, a "semiconductor device" generally refers to a device which can function by utilizing semiconductor characteristics: an electro-optical device, a liquid crystal display device, a light-emitting device, a semiconductor circuit, and an electronic device are all included in the category of the semiconductor device.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an object having any electric function. There is no particular limitation on an "object having any electric function" as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

In the semiconductor device according to one embodiment of the present invention, an oxide semiconductor material is used in at least one of the channel formation regions of the transistors. This makes it possible to suppress leakage current and achieve a reduction in the power consumption of the semiconductor device.

In one embodiment of the disclosed invention, a voltage application unit is additionally provided for the gate of the first transistor including an oxide semiconductor which is connected to the high-potential wiring of a three-state inverter including the first to fourth transistors, so that a decrease in the potential of the source of the first transistor from Vdd by threshold voltage of the first transistor can be suppressed.

In one embodiment of the disclosed invention, an oxide semiconductor material is used in at least one of the channel formation regions of the transistors included in a three-state inverter. Further, by providing the transistor including an oxide semiconductor and a transistor including a material other than an oxide semiconductor so as to overlap with each other, the size of the semiconductor device can be reduced.

BRIEF DESCRIPTION OF DRAWINGS

FIGS. 13A to 13C illustrate a structure of an oxide material.

FIGS. 27A to 27E are formulas for calculating mobility.

BEST MODE FOR CARRYING OUT THE INVENTION

Figure 1A:
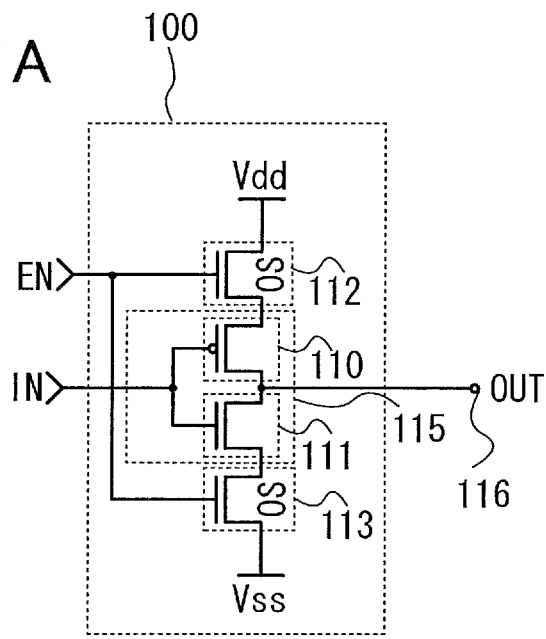
FIGS. 1A and 1B illustrate an example of a semiconductor device and an example of a timing chart thereof, respectively.

Examples of the embodiment of the present invention will be specifically described with reference to the drawings. In the structures described below, the same portions or portions having similar functions are denoted by the same reference numerals in different drawings, and description thereof will not be repeated.

The present invention is not limited to the description below and it is readily understood by those skilled in the art that the modes and details of the present invention can be modified in various ways without departing from the spirit and scope of the present invention. Therefore, the present invention should not be construed as being limited to the description in the embodiments described below.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first," "second," and "third" are used in order to avoid confusion among components, and the terms do not mean limitation of the number of components.

In this specification and the like, "voltage" and "potential" are used in the same meaning in some cases.

(Embodiment 1)

In this embodiment, a structure of a semiconductor device according to one embodiment of the disclosed invention will be described with reference to FIGS. 1A and 1B. Note that in each of the circuit diagrams, "OS" is written beside a transistor in order to indicate that the transistor includes an oxide semiconductor.

FIG. 1A illustrates a semiconductor device of this embodiment. A semiconductor device 100 includes a transistor 110, a transistor 111, a transistor 112, and a transistor 113. The transistor 110 has p-type conductivity, and the transistor 111, the transistor 112, and the transistor 113 have n-type conductivity. The semiconductor device 100 described here can also be referred to as a "three-state inverter circuit," a "tri-state inverter circuit," or a "signal processing circuit."

A gate of the transistor 110 is electrically connected to a gate of the transistor 111. One of a source and a drain of the transistor 110 is electrically connected to one of a source and a drain of the transistor 111.

One of a source and a drain of the transistor 112 is electrically connected to the other of the source and the drain of the transistor 110. The other of the source and the drain of the transistor 112 is electrically connected to a high-potential wiring ("Vdd" in FIG. 1A, also referred to as "high-potential line," "power supply voltage line," "voltage line," "power supply," "power supply line," "Vdd," "wiring," "wiring to which first potential is supplied," "wiring having a function of supplying first potential," and the like). A gate of the transistor 112 is electrically connected to a gate of the transistor 113.

One of a source and a drain of the transistor 113 is electrically connected to the other of the source and the drain of the transistor 111. The other of the source and the drain of the transistor 113 is electrically connected to a low-potential wiring (Vss in FIG. 1A, also referred to as "low-potential line," "ground wiring," "GND," "Vss," "grounding wiring," "wiring," "wiring to which second potential is supplied," "wiring having a function of supplying second potential," "wiring to which second potential lower than first potential is supplied," "wiring having a function of supplying second potential lower than first potential," and the like). The low-potential wiring is a wiring to which potential lower than the potential supplied to the high-potential wiring is supplied and may be grounded.

A wiring is electrically connected to the gates of the transistor 112 and the transistor 113, and an enable signal (EN) is supplied to the wiring.

A wiring is electrically connected to the gates of the transistor 110 and the transistor 111, and an input signal (IN) is supplied to the wiring. The one of the source and the drain of the transistor 110 and the one of the source and the drain of the transistor 111 are electrically connected to an output terminal 116, so that an output signal is output.

When the enable signal is at "High" level, the transistor 112 and the transistor 113 are both turned on, and the transistor 110 and the transistor 111 can be regarded as forming a general inverter 115.

Figure 1B:
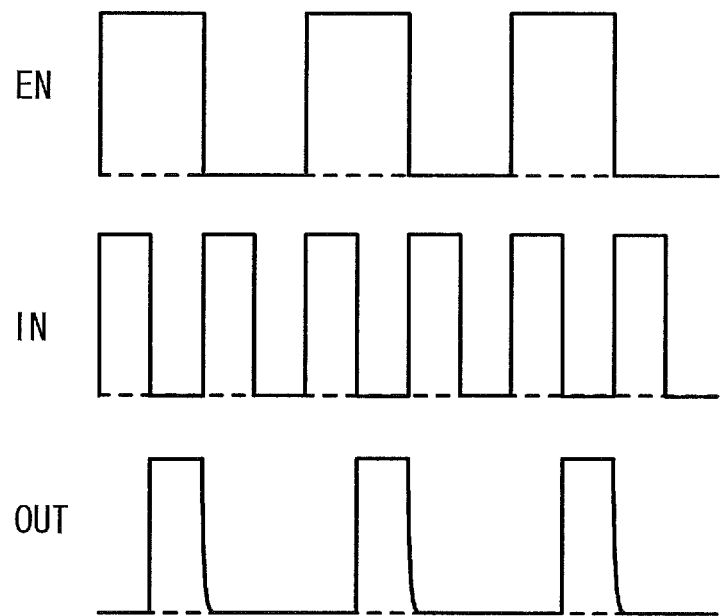

FIG. 1B is a timing chart of FIG. 1A.

In the case where a "High" signal is output to the output terminal 116, the "High" signal is input as an enable signal to turn on the transistors 112 and 113. By inputting a "Low" signal as an input signal (IN), the transistor 111 is turned off and the transistor 110 is turned on. Since the transistors 110 and 112 are in a conduction state, a "High" level signal is supplied from Vdd to the output terminal 116.

In the case where a "Low" signal is output to the output terminal 116, the "High" signal is input as an enable signal to turn on the transistors 112 and 113. By inputting a "High" signal as an input signal (IN), the transistor 111 is turned on and the transistor 110 is turned off. Since the transistors 111 and 113 are in a conduction state, a "Low" level signal is supplied from Vss to the output terminal 116.

In the case where output is brought into a high impedance state, a "Low" signal is input as an enable signal to turn off the transistors 112 and 113. Accordingly, the supply of potential from Vdd to the output terminal 116 and from Vss to the output terminal 116 is blocked, so that the output is brought into a high impedance state.

Transistors having extremely small off-state current are used as the transistor 112 and the transistor 113. By using an oxide semiconductor in a transistor, the transistor can have small off-state current. The transistor including an oxide semiconductor can have off-state current much smaller than off-state current of a transistor including silicon having crystallinity. The off-state current per unit channel width (1 μm) of the transistor 112 and the transistor 113 at room temperature (25° C.) may be less than or equal to 100 zA (zeptoampere), preferably less than or equal to 10 zA, more preferably less than or equal to 1 zA ($1\times10^{-21}$ A). Hence, in the case where an enable signal is at "Low" level and output is in a high impedance state, supply of potential from the high-potential wiring and the low-potential wiring to the output terminal 116 through the transistor 110 and the transistor 111 can be blocked, which makes it possible to prevent generation of leakage current. Accordingly, the power consumption of the semiconductor device can be reduced. Note that the transistor 112 and the transistor 113 are enhancement-mode (normally-off) n-channel transistors.

Note that in the above structure, connection between the wirings may be physically disconnected using a MEMS switch instead of the transistor so that leakage current from power supply potential can be prevented.

In FIG. 1A, each of the transistors 110 and 111 can be a transistor in which a channel region is formed in a layer or a substrate which is formed using a semiconductor other than an oxide semiconductor. For example, each of the transistors 110 and 111 can be a transistor in which a channel region is formed in a silicon layer or a silicon substrate.

The transistor 110 can also be formed using an oxide semiconductor material as in the case of the transistors 112 and 113. The transistor 111 can also be formed using an oxide semiconductor material as in the case of the transistors 112 and 113.

For example, in the case where the transistor 110 and/or the transistor 111 are/is formed using an oxide semiconductor material, the transistor 110 and/or the transistor 111 are/is preferably formed using an In—Sn—Zn-based oxide semiconductor having high field-effect mobility. Further, the transistor 112 and the transistor 113 are preferably formed using an In—Ga—Zn-based oxide semiconductor having significantly small off-state current.

Figure 2A:
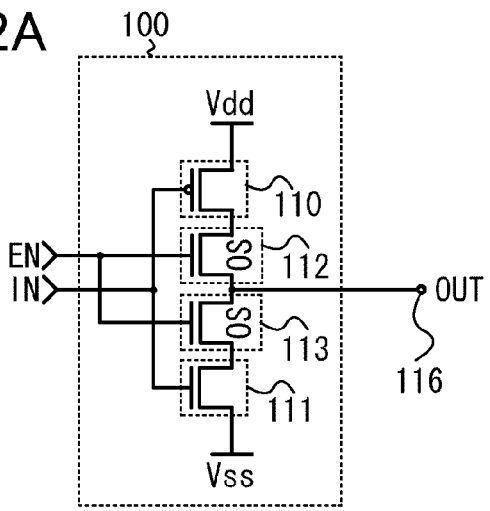
FIGS. 2A to 2C illustrate examples of semiconductor devices.
Figure 2B:
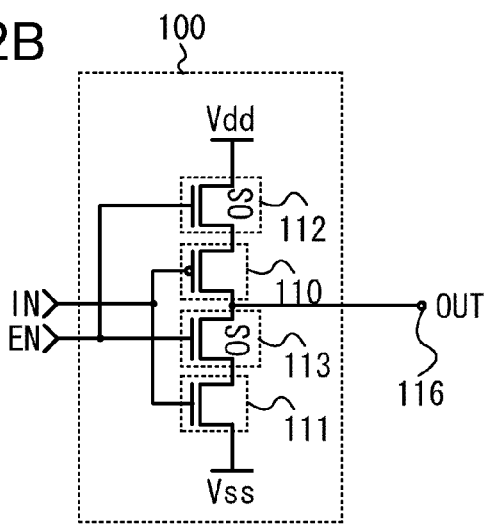
Figure 2C:
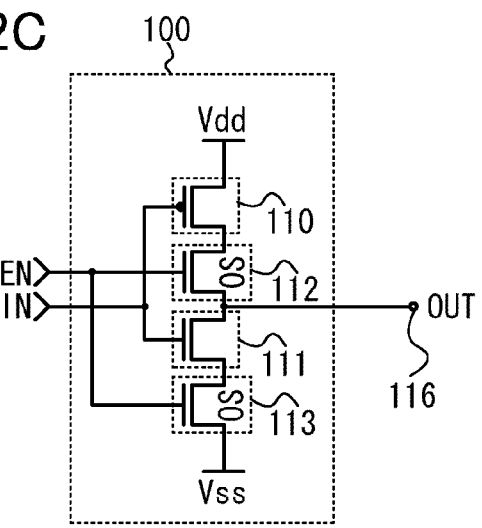

Although the semiconductor device of this embodiment is described with reference to FIGS. 1A and 1B, the structure of the semiconductor device is not limited to the structure illustrated in FIG. 1A. FIGS. 2A to 2C each illustrate a semiconductor device in which arrangement of the transistors 110 to 113 is changed.

In FIG. 2A, one of the source and the drain of the p-channel transistor 110 is electrically connected to the high-potential wiring Vdd, and one of the source and the drain of the n-channel transistor 111 is electrically connected to the low-potential wiring. The other of the source and the drain of the transistor 110 is electrically connected to the output terminal 116 through the transistor 112 including an oxide semiconductor material. The other of the source and the drain of the transistor 111 is electrically connected to the output terminal 116 through the transistor 113 including an oxide semiconductor material.

A wiring is electrically connected to gates of the transistor 112 and the transistor 113, and an enable signal (EN) is supplied to the wiring. When the transistor 112 and the transistor 113 are on, the transistor 110 and the transistor 111 can be regarded as forming a general inverter.

In FIG. 2A, the transistor 112 and the transistor 113 are formed using an oxide semiconductor material; thus, when the transistor 112 and the transistor 113 are turned off so that output is brought into a high impedance state, output of leakage current from the high-potential wiring Vdd or the low-potential wiring Vss to the output terminal can be suppressed. The transistors 112 and 113 including an oxide semiconductor are provided closer to the output terminal than the transistors 110 and 111, whereby output of an abnormal signal to the output terminal 116 immediately after the transistors 112 and 113 are turned off can be more prevented than in the case of FIG. 1A.

In FIG. 2B, one of the source and the drain of the p-channel transistor 110 is electrically connected to the high-potential wiring Vdd through the transistor 112 including an oxide semiconductor, and one of the source and the drain of the n-channel transistor 111 is electrically connected to the low-potential wiring Vss. The other of the source and the drain of the transistor 111 is electrically connected to the output terminal 116 and the other of the source and the drain of the transistor 110 through the transistor 113 including an oxide semiconductor.

A wiring is electrically connected to gates of the transistor 112 and the transistor 113, and an enable signal is supplied to the wiring. When the transistor 112 and the transistor 113 are on, the transistor 110 and the transistor 111 can be regarded as forming a general inverter.

In FIG. 2B, the transistor 112 and the transistor 113 are formed using an oxide semiconductor material; thus, when the transistor 112 and the transistor 113 are turned off so that output is brought into a high impedance state, output of leakage current from the high-potential wiring Vdd or the low-potential wiring Vss to the output terminal can be suppressed. The transistor 112 is provided closer to the high-potential wiring Vdd than the transistor 110; thus, leakage current which can flow through the transistor 110 can be prevented by the transistor 112 without fail. In the case where the transistor 111 is turned on and a "Low" signal is output to the output terminal 116, and then a "Low" signal is output as an enable signal and the transistors 112 and 113 are turned off, leakage current might flow to the output terminal 116 through the transistor 111. However, when the arrangement illustrated in FIG. 2B is employed, current leaking from the transistor 111 can be blocked by the transistor 113 without fail.

In FIG. 2C, one of the source and the drain of the n-channel transistor 111 is electrically connected to the low-potential wiring Vss through the transistor 113 including an oxide semiconductor, and one of the source and the drain of the p-channel transistor 110 is electrically connected to the high-potential wiring Vdd. The other of the source and the drain of the transistor 110 is electrically connected to the output terminal 116 and the other of the source and the drain of the transistor 111 through the transistor 112 including an oxide semiconductor.

A wiring is electrically connected to gates of the transistor 112 and the transistor 113, and an enable signal is supplied to the wiring. When the transistor 112 and the transistor 113 are on, the transistor 110 and the transistor 111 can be regarded as forming a general inverter.

In FIG. 2C, the transistor 112 and the transistor 113 are formed using an oxide semiconductor material; thus, when the transistor 112 and the transistor 113 are turned off so that output is brought into a high impedance state, output of leakage current from the high-potential wiring Vdd or the low-potential wiring Vss to the output terminal can be suppressed. The transistor 113 is provided closer to the low-potential wiring Vss than the transistor 111; thus, leakage current which can flow through the transistor 111 can be prevented by the transistor 113 without fail. In the case where the transistor 110 is turned on and a "High" signal is output to the output terminal 116, and then a "Low" signal is output as an enable signal and the transistors 112 and 113 are turned off, leakage current might flow to the output terminal 116 through the transistor 110. However, when the arrangement illustrated in FIG. 2C is employed, current leaking from the transistor 110 can be blocked by the transistor 112 without fail.

As described above, the connection relation between the transistors 110 to 113 can be changed as appropriate. Note that as illustrated in FIG. 1A, the transistor 112 and the transistor 113, which include an oxide semiconductor, are preferably provided closer to the power supply potential Vdd and Vss, respectively. Alternatively, the transistor 110 may include an oxide semiconductor, and the transistor 111 may include an oxide semiconductor.

In the semiconductor device of this embodiment, an oxide semiconductor is used in the channel regions of the transistors included in the semiconductor device, whereby leakage current from a power supply to the output terminal or the transistor including a material other than an oxide semiconductor can be suppressed. Thus, the power consumption of the semiconductor device can be reduced.

(Embodiment 2)

Figure 3A:
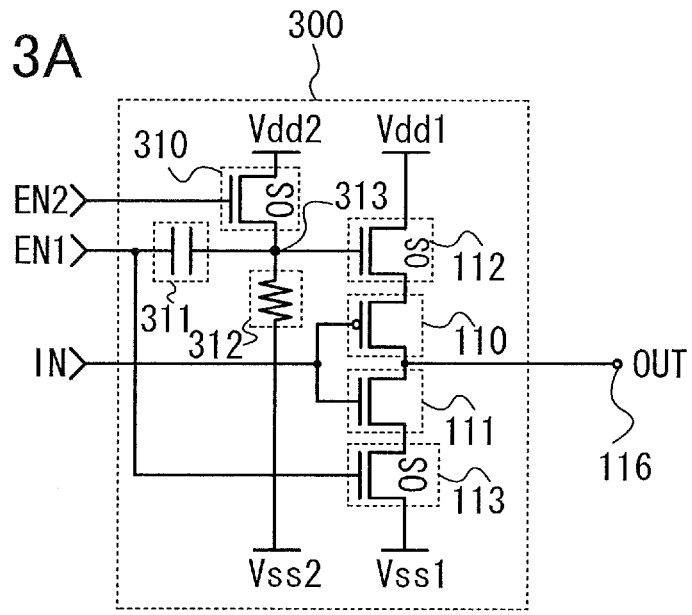
FIGS. 3A and 3B illustrate an example of a semiconductor device and an example of a timing chart thereof, respectively.

In this embodiment, a semiconductor device having a structure different from the structures of the semiconductor device described in Embodiment 1 will be described with reference to FIGS. 3A and 3B.

A semiconductor device 300 includes the transistor 110, the transistor 111, the transistor 112, the transistor 113, a transistor 310, a capacitor 311, and a resistor 312. The transistor 110 has p-type conductivity, and the transistor 111, the transistor 112, the transistor 113, and the transistor 310 have n-type conductivity.

The gate of the transistor 110 is electrically connected to the gate of the transistor 111. One of the source and the drain of the transistor 110 is electrically connected to one of the source and the drain of the transistor 111.

One of the source and the drain of the transistor 112 is electrically connected to the other of the source and the drain of the transistor 110. The other of the source and the drain of the transistor 112 is electrically connected to a high-potential wiring Vdd1. The gate of the transistor 112 is electrically connected to one of a source and a drain of the transistor 310, one terminal of the capacitor 311, and one terminal of the resistor 312.

One of the source and the drain of the transistor 113 is electrically connected to the other of the source and the drain of the transistor 111, and the other of the source and the drain of the transistor 113 is electrically connected to a low-potential wiring Vss1. The gate of the transistor 113 is electrically connected to the other terminal of the capacitor 311.

The other of the source and the drain of the transistor 310 is electrically connected to a high-potential wiring Vdd2. Vdd1 and Vdd2 may be supplied with power from a common power supply or from different power supplies. For example, Vdd2 may have potential higher or lower than Vdd1, or may have potential higher or lower than the potential of the sum of the potential of Vdd1 and threshold voltage of the transistor 112.

The other terminal of the resistor 312 is electrically connected to the low-potential wiring Vss. Although Vss1 and Vss2 are supplied with power from a common power supply here, Vss1 and Vss2 may be supplied with power from different power supplies.

A wiring is electrically connected to the gate of the transistor 113 and the other terminal of the capacitor 311, and a first enable signal (EN1) is supplied to the wiring.

A wiring is electrically connected to a gate of the transistor 310, and a second enable signal (EN2) is supplied to the wiring.

Next, operation of FIG. 3A will be described. FIG. 3B is a timing chart of the semiconductor device illustrated in FIG. 3A.

The case of outputting a "High" or "Low" signal to the output terminal 116 will be described.

First, a "High" signal is output as the second enable signal to turn on the transistor 310. At this time, potential divided in accordance with the ratio of the resistance value of the transistor 310 to the resistance value of the resistor 312 is supplied to a node 313.

After that, a "High" signal is input as the first enable signal to turn on the transistor 112 and the transistor 113, so that the transistor 112 and the transistor 113 are in a conduction state. At this time, potential in which the "High" level signal as the first enable signal is added to the potential of the node 313 is supplied to the gate of the transistor 112.

In the case where a "High" signal is output to the output terminal 116, a "Low" signal is input as an input signal (IN), so that the transistor 111 is turned off and the transistor 110 is turned on. Since the transistor 110 and the transistor 112 are in a conduction state, a "High" level signal is supplied from Vdd to the output terminal 116.

In the case where a "Low" signal is output to the output terminal 116, a "High" signal is input as an input signal, so that the transistor 111 is turned on and the transistor 110 is turned off. Since the transistor 111 and the transistor 113 are in a conduction state, a "Low" level signal is supplied from Vss to the output terminal 116.

In the case where output is brought into a high impedance state, a "Low" signal is input as the second enable signal to turn off the transistor 310, and a "Low" signal is input as the first enable signal to turn off the transistor 112 and the transistor 113. Accordingly, supply of potential from the high-potential wiring Vdd1 to the output terminal 116 and from the low-potential wiring Vss1 to the output terminal 116 is blocked, so that the output is brought into a high impedance state.

Through the above operation, the signals in the three states of "High," "Low," and "High impedance" can be output to the output terminal 116.

Figure 3B:
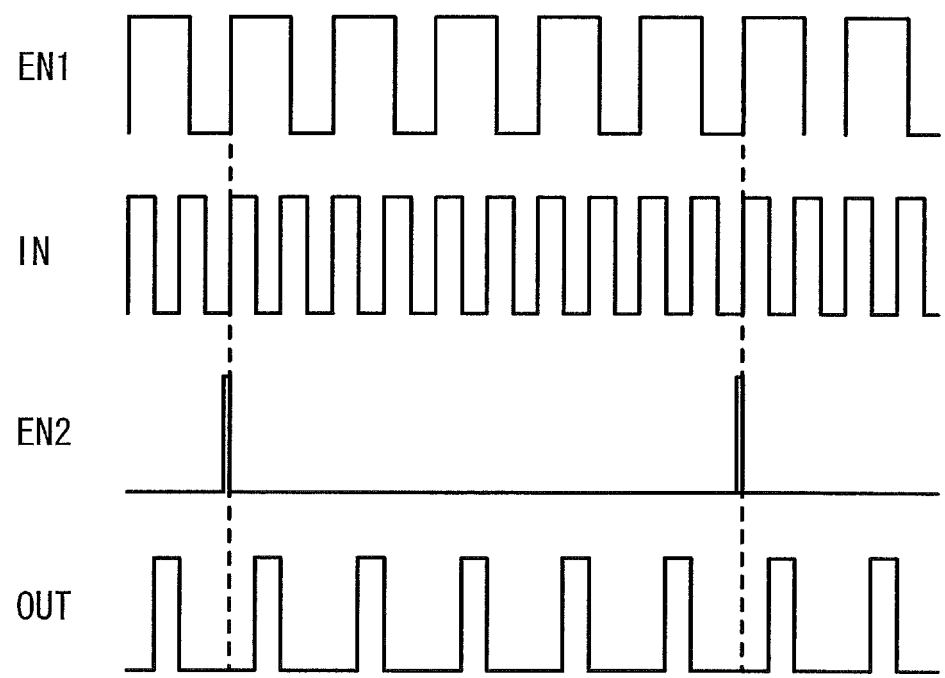

Note that in FIG. 3B, the "Low" signal is input immediately after the "High" signal is input as the second enable signal to turn on the transistor 310. In contrast, the "High" signal may be input as the first enable signal while the "High" signal is being input as the second enable signal, so that the transistor 112 and the transistor 113 are turned on to be in a conduction state. Also in this case, potential in which the "High" level signal as the first enable signal is added to the potential of the node 313 is supplied to the gate of the transistor 112. In the case where output is brought into a high impedance state, a "High" signal continuing to be input as the second enable signal is switched to a "Low" signal to turn off the transistor 310. After that, a "Low" signal may be input as the first enable signal to turn off the transistor 112 and the transistor 113. Accordingly, supply of potential from the high-potential wiring Vdd1 to the output terminal 116 and from the Vss1 to the output terminal 116 is blocked, so that the output is brought into a high impedance state.

In the semiconductor device of this embodiment, an oxide semiconductor having extremely small off-state current is used in the transistor 112, the transistor 113, and the transistor 310, and a material other than an oxide semiconductor is used in the transistor 110 and the transistor 111.

In the case where a "Low" signal is input as the first enable signal to turn off the transistor 112 and the transistor 113, so that output is brought into a high impedance state, a path from the high-potential wiring Vdd1 to the output terminal 116 can be blocked by the transistor 112 including an oxide semiconductor. Accordingly, leakage current does not flow, which results in a reduction in power consumption. In addition, output of an abnormal signal due to leakage current can be suppressed.

Further, a path from the low-potential wiring Vss1 to the output terminal 116 can be blocked by the transistor 113 including an oxide semiconductor. Accordingly, leakage current does not flow, which results in a reduction in power consumption. In addition, output of an abnormal signal due to leakage current can be suppressed.

An oxide semiconductor is also used in the transistor 310; thus, leakage current from Vdd2 can also be prevented.

Further, in the semiconductor device of this embodiment, in the case where a "High" signal is output from the output terminal 116, a decrease in the potential of the source of the transistor 112 from Vdd1 by threshold voltage of the transistor 112 can be suppressed, so that the potential of Vdd1 can be effectively supplied to the transistor 110.

Specifically, for example, a "High" signal is input as the second enable signal to turn on the transistor 310, and shortly after that the "High" signal is switched to a "Low"

signal, whereby a decrease in the potential of the source of the transistor 112 from Vdd1 by threshold voltage of the transistor 112 can be suppressed utilizing a predetermined potential which is the potential of the node 313 before completely dropping to Vss2.

This embodiment can be implemented in combination with any of the other embodiments as appropriate.

(Embodiment 3)

In this embodiment, a semiconductor device having a structure different from the structures of the semiconductor devices described in Embodiments 1 and 2 will be described with reference to FIGS. 4A and 4B.

Figure 4A:
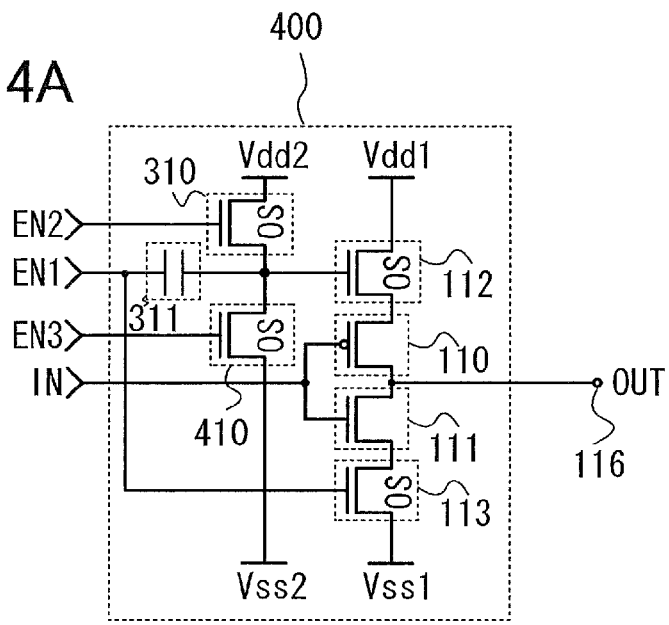
FIGS. 4A and 4B illustrate an example of a semiconductor device and an example of a timing chart thereof, respectively.

A semiconductor device 400 illustrated in FIG. 4A includes the transistor 110, the transistor 111, the transistor 112, the transistor 113, a transistor 310, a transistor 410, and the capacitor 311.

The transistor 110 has p-type conductivity, and the transistor 111, the transistor 112, the transistor 113, the transistor 310, and the transistor 410 have n-type conductivity.

The gate of the transistor 110 is electrically connected to the gate of the transistor 111. One of the source and the drain of the transistor 110 is electrically connected to one of the source and the drain of the transistor 111.

One of the source and the drain of the transistor 112 is electrically connected to the other of the source and the drain of the transistor 110. The other of the source and the drain of the transistor 112 is electrically connected to a high-potential wiring Vdd1. The gate of the transistor 112 is electrically connected to one of the source and the drain of the transistor 310, one of a source and a drain of the transistor 410, and one terminal of the capacitor 311.

One of the source and the drain of the transistor 113 is electrically connected to the other of the source and the drain of the transistor 111, and the other of the source and the drain of the transistor 113 is electrically connected to a low-potential wiring Vss1. The gate of the transistor 113 is electrically connected to the other terminal of the capacitor 311.

The other of the source and the drain of the transistor 310 is electrically connected to a high-potential wiring Vdd2. Vdd1 and Vdd2 may be supplied with power from a common power supply or from different power supplies. For example, Vdd2 may have potential higher or lower than Vdd1, or may have potential higher or lower than the potential of the sum of the potential of Vdd1 and threshold voltage of the transistor 112.

The other of the source and the drain of the transistor 410 is electrically connected to the low-potential wiring Vss2. Although Vss1 and Vss2 are supplied with power from a common power supply here, Vss1 and Vss2 may be supplied with power from different power supplies.

A wiring is electrically connected to the gate of the transistor 113 and the other terminal of the capacitor 311, and a first enable signal (EN1) is supplied to the wiring.

A wiring is electrically connected to a gate of the transistor 310, and a second enable signal (EN2) is supplied to the wiring.

A wiring is electrically connected to a gate of the transistor 410, and a third enable signal (EN3) is supplied to the wiring.

An input signal (IN) is supplied to the gates of the transistor 110 and the transistor 111.

Figure 4B:
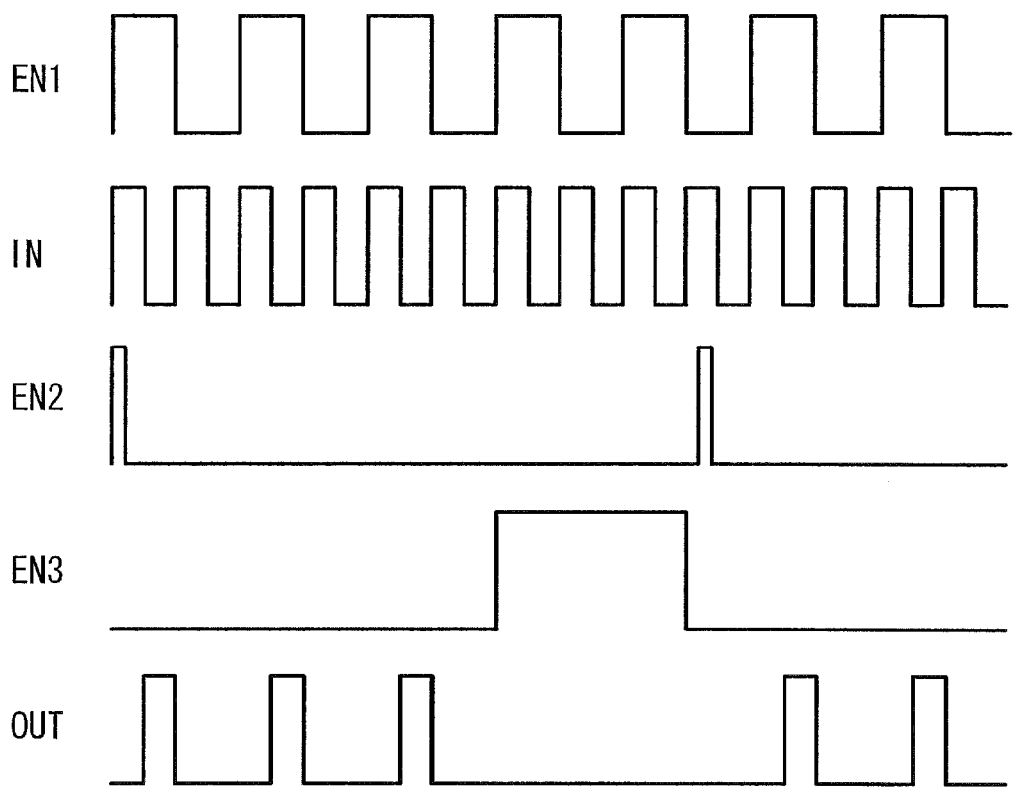

FIG. 4B is a timing chart of FIG. 4A.

First, the case of outputting a "High" or "Low" signal to the output terminal 116 will be described.

First, a "Low" signal is input as the third enable signal to turn off the transistor 410, and a "High" signal is input as the second enable signal to turn on the transistor 310.

Potential obtained by subtracting the threshold voltage of the transistor 310 from the potential supplied to the high-potential wiring Vdd2 is supplied to the gate of the transistor 112.

After that, a "Low" signal is input as the second enable signal to turn off the transistor 310, whereby charge is retained between the gate of the transistor 112 and the one terminal of the capacitor 311.

Then, a "High" signal is input as the first enable signal to bring the transistors 112 and 113 into a conduction state.

In the case where a "High" signal is output to the output terminal 116, a "Low" signal is input as an input signal, so that the transistor 111 is turned off and the transistor 110 is turned on. Since the transistor 110 and the transistor 112 are in a conduction state, a "High" level signal is supplied from Vdd to the output terminal 116.

In the case where a "Low" signal is output to the output terminal 116, a "High" signal is input as an input signal, so that the transistor 111 is turned on and the transistor 110 is turned off. Since the transistor 111 and the transistor 113 are in a conduction state, a "Low" level signal is supplied from Vss to the output terminal 116.

In the case where output is brought into a high impedance state, a "Low" signal is input as the second enable signal to turn off the transistor 310, and a "High" signal is input as the third enable signal to turn on the transistor 410. Accordingly, the charge retained at the one terminal of the capacitor 311 flows to Vss2 through the transistor 410.

After that, a "Low" signal is input as the first enable signal to turn off the transistors 112 and 113. Accordingly, supply of potential from the high-potential wiring Vdd1 to the output terminal 116 and from the low-potential wiring Vss1 to the output terminal 116 is blocked, so that the output is brought into a high impedance state.

Through the above operation, the signals in the three states of "High," "Low," and "High impedance" can be output to the output terminal 116.

In the case where a "High" signal is input as the second enable signal and a "Low" signal is input as the third enable signal in order to accumulate charge in the capacitor 311, the first enable signal may be a "High" signal or a "Low" signal.

In the semiconductor device of this embodiment, an oxide semiconductor having extremely small off-state current is used in the transistor 112, the transistor 113, the transistor 310, and the transistor 410, and a material other than an oxide semiconductor is used in the transistor 110 and the transistor 111.

In the case where a "Low" signal is input as the first enable signal to turn off the transistor 112 and the transistor 113, so that output is brought into a high impedance state, a path from the high-potential wiring Vdd1 to the output terminal 116 can be blocked by the transistor 112 including an oxide semiconductor. Accordingly, leakage current does not flow, which results in a reduction in the power consumption. In addition, output of an abnormal signal due to leakage current can be suppressed.

Further, a path from the low-potential wiring Vss1 to the output terminal 116 can be blocked by the transistor 113 including an oxide semiconductor. Accordingly, leakage current does not flow, which results in a reduction in the power consumption. In addition, output of an abnormal signal due to leakage current can be suppressed.

An oxide semiconductor is also used in the transistor 310 and the transistor 410; thus, leakage current from Vdd2 and Vss2 can also be prevented.

Further, in the semiconductor device of this embodiment, in the case where a "High" signal is output from the output terminal 116, a decrease in the potential of the source of the transistor 112 from Vdd1 by threshold voltage of the transistor 112 can be suppressed, so that the potential of Vdd1 can be effectively supplied to the transistor 110.

This embodiment can be implemented in combination with any of the other embodiments as appropriate. For example, as illustrated in FIGS. 2A to 2C, the arrangement of the transistors 110 to 113 can be changed.

(Embodiment 4)

In this embodiment, a semiconductor device having structures different from the structures of the semiconductor devices described in Embodiments 1 to 3 will be described with reference to FIGS. 5A and 5B.

A semiconductor device 500 includes the transistor 110, the transistor 111, a transistor 512, the transistor 113, and an inverter 520.

Figure 5A:
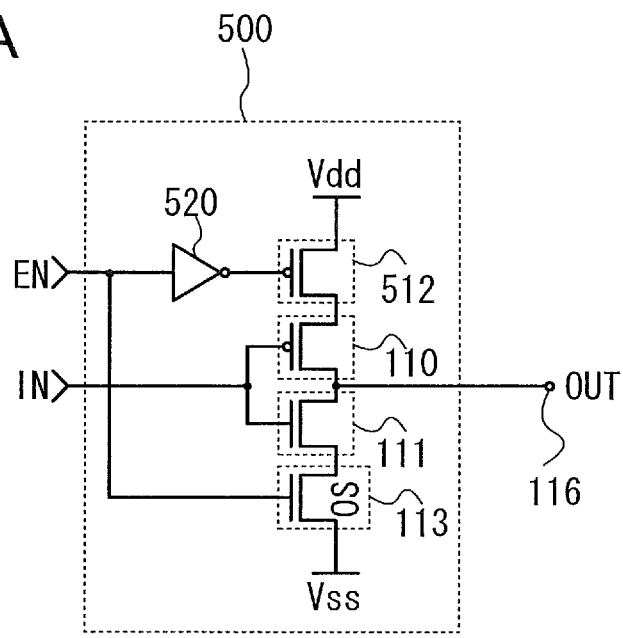
FIGS. 5A and 5B illustrate examples of semiconductor devices.
Figure 5B:
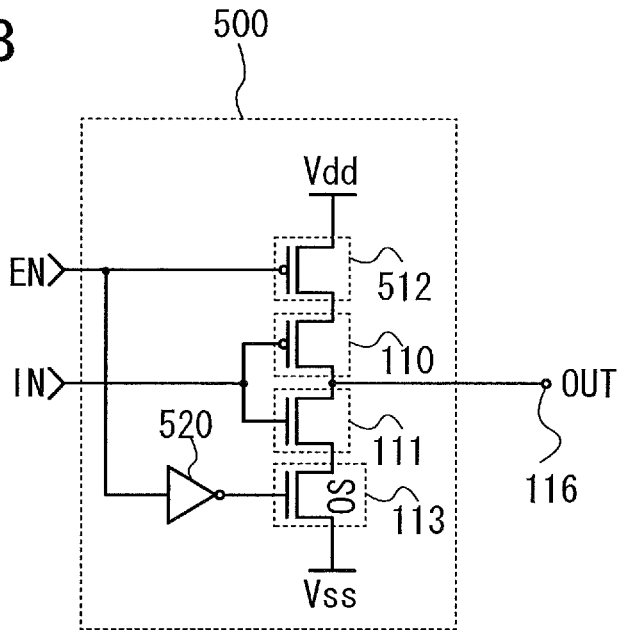

FIGS. 5A and 5B are different from FIG. 1A in that the p-channel transistor 512 including a material other than an oxide semiconductor and the inverter 520 are provided instead of the transistor 112 including an oxide semiconductor, which is connected to the high-potential wiring Vdd.

In FIG. 5A, one of a source and a drain of the p-channel transistor 512 is electrically connected to one of the source and the drain of the transistor 110; the other of the source and the drain of the transistor 512 is electrically connected to a high-potential wiring Vdd; and a gate of the transistor 512 is electrically connected to an output terminal of the inverter 520. A gate of the transistor 113 is electrically connected to an input terminal of the inverter 520.

In FIG. 5B, the gate of the transistor 512 is electrically connected to the input terminal of the inverter 520. The gate of the transistor 113 is electrically connected to the output terminal of the inverter 520.

Description will be given below with reference to FIG. 5A. A wiring is electrically connected to the input terminal of the inverter 520 and the gate of the transistor 113, so that an enable signal (EN) is supplied to the wiring.

When the enable signal is at "High" level, the transistor 512 and the transistor 113 are both turned on, and the transistor 110 and the transistor 111 can be regarded as forming a general inverter 115.

A wiring is electrically connected to a gate of the transistor 110 and a gate of the transistor 111, so that an input signal (IN) is supplied to the wiring. The one of the source and the drain of the transistor 110 and one of the source and the drain of the transistor 111 are electrically connected to the output terminal 116, so that an output signal is output.

In the case where a "High" signal is output to the output terminal 116, the "High" signal is input as an enable signal to turn on the transistors 512 and 113. By inputting a "Low" signal as an input signal (IN), the transistor 111 is turned off and the transistor 110 is turned on. Since the transistors 110 and 112 are in a conduction state, a "High" level signal is supplied from Vdd to the output terminal 116.

In the case where a "Low" signal is output to the output terminal 116, the "High" signal is input as an enable signal to turn on the transistors 512 and 113. By inputting a "High" signal as an input signal (IN), the transistor 111 is turned on and the transistor 110 is turned off. Since the transistors 111 and 113 are in a conduction state, a "Low" level signal is supplied from Vss to the output terminal 116.

In the case where output is brought into a high impedance state, a "Low" signal is input as the enable signal to turn off the transistors 512 and 113. Accordingly, the supply of potential from Vdd to the output terminal 116 and from Vss to the output terminal 116 is blocked, so that the output is brought into a high impedance state.

A transistor having extremely small off-state current is used as the transistor 113. By using an oxide semiconductor in a transistor, the transistor can have small off-state current. The transistor including an oxide semiconductor can have off-state current much smaller than off-state current of a transistor including silicon having crystallinity. In the case where output is in a high impedance state, leakage current between the low-potential wiring Vss and the output terminal 116 can be prevented by the transistor 113 including an oxide semiconductor.

This embodiment can be implemented in combination with any of the other embodiments as appropriate.

(Embodiment 5)

In this embodiment, an example in which a semiconductor device is applied to a bidirectional buffer circuit will be described with reference to FIGS. 6A and 6B.

Figure 6A:
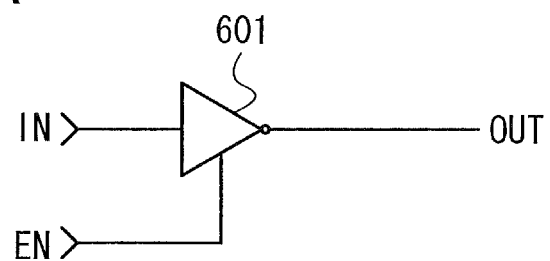
FIGS. 6A and 6B illustrate examples of semiconductor devices.

A three-state inverter circuit 601 is illustrated in FIG. 6A. Any of the structures described in Embodiments 1 to 4 can be applied to the three-state inverter circuit.

Figure 6B:
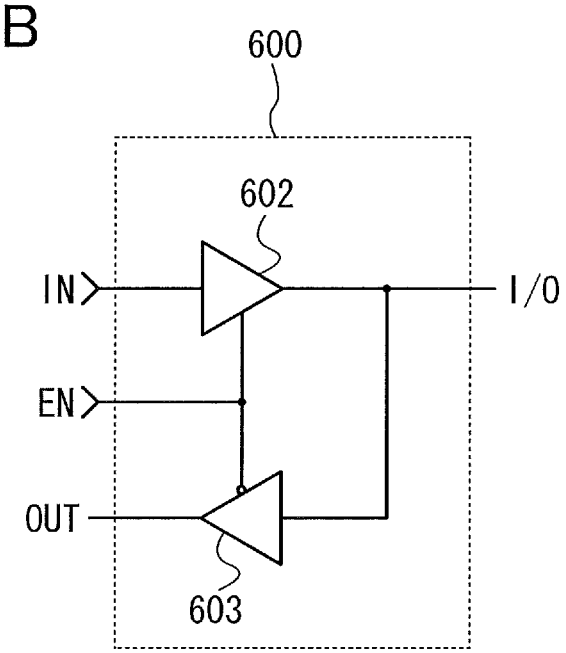

FIG. 6B illustrates a semiconductor device 600 which is a bidirectional buffer circuit in which two three-state circuits are combined. The semiconductor device 600 includes a three-state inverter circuit 602 and a three-state inverter circuit 603. An output terminal of the three-state inverter circuit 602 is electrically connected to an input terminal of the three-state inverter circuit 603. Any of the structures described in Embodiments 1 to 4 can be applied to the three-state inverter circuits 602 and 603 as appropriate. For example, the structure illustrated in FIG. 1A can be applied to the three-state inverter circuit 602, and the structure illustrated in FIG. 4A can be applied to the three-state inverter circuit 603.

By applying any of the structures described in Embodiments 1 to 4 to the bidirectional buffer circuit described in this embodiment, leakage current of the semiconductor device can be suppressed, so that the power consumption of the semiconductor device can be reduced.

This embodiment can be implemented in combination with any of the other embodiments as appropriate.

(Embodiment 6)

In this embodiment, a method of manufacturing a semiconductor device will be described using a transistor in which a channel is formed in an oxide semiconductor layer and a transistor in which a channel is formed using a material other than an oxide semiconductor as examples. In this embodiment, the case where the transistor formed using a material other than an oxide semiconductor is a transistor in which a channel is formed in a silicon layer will be described as an example.

Note that the transistors formed using an oxide semiconductor, which are described in Embodiments 1 to 5, can be formed in a manner similar to that of a transistor 11 described in this embodiment. Further, the transistors formed using a material other than an oxide semiconductor, which are described in Embodiments 1 to 5, can be formed in a manner similar to that of a transistor 133 described in this embodiment. Further, the capacitor included in the semiconductor device (the capacitor 311 in FIG. 3A and FIG. 4A) can be formed in a manner similar to that of a capacitor 12 described in this embodiment.

Figure 7A:
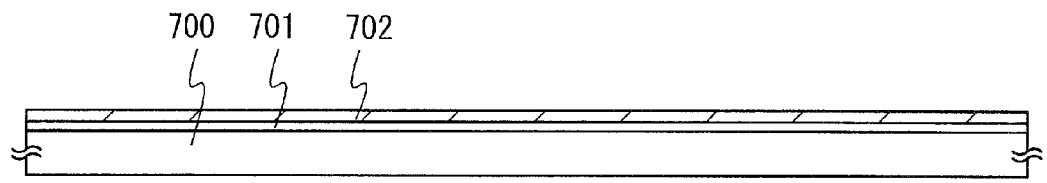
FIGS. 7A to 7D illustrate an example of a manufacturing process of a semiconductor device.

First, as illustrated in FIG. 7A, an insulating film 701 and a semiconductor film 702 separated from a single crystal semiconductor substrate are formed over a substrate 700.

Although there is no particular limitation on a material that can be used as the substrate 700, it is necessary that the material have at least heat resistance high enough to withstand heat treatment performed later. For example, a glass substrate formed by a fusion process or a float process, a quartz substrate, a semiconductor substrate, a ceramic substrate, or the like can be used as the substrate 700. In the case where a glass substrate is used and the temperature of heat treatment performed later is high, a glass substrate whose strain point is higher than or equal to 730° C. is preferably used.

In this embodiment, an example in which the semiconductor film 702 is formed using single crystal silicon is given below as the method for forming the transistor 133.

Note that a specific example of a method for forming the single crystal semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate.

The depth at which the fragile layer is formed can be adjusted by the acceleration energy of the ion beam and the angle at which the ion beam enters.

Then, the bond substrate and the substrate 700 which is provided with the insulating film 701 are attached to each other so that the insulating film 701 is sandwiched therebetween.

After the bond substrate and the substrate 700 overlap with each other, a pressure of approximately 1 N/cm² to 500 N/cm², preferably 11 N/cm² to 20 N/cm² is applied to part of the bond substrate and part of the substrate 700 so that the substrates are attached to each other. When the pressure is applied, bonding between the bond substrate and the insulating film 701 starts from the parts, which results in bonding of the entire surface where the bond substrate and the insulating film 701 are in close contact with each other.

After that, heat treatment is performed, so that microvoids that exist in the fragile layer are combined and the microvoids increase in volume.

Accordingly, a single crystal semiconductor film which is part of the bond substrate is separated from the bond substrate along the fragile layer.

The heat treatment is performed at a temperature not exceeding the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which is not etched to have a predetermined shape or may be added to the semiconductor film 702 which is etched to have a predetermined shape. Alternatively, the impurity element for controlling the threshold voltage may be added to the bond substrate. Alternatively, the impurity element may be added to the bond substrate in order to roughly control the threshold voltage, and the impurity element may be further added to the semiconductor film which is not etched to have a predetermined shape or the semiconductor film 702 which is etched to have a predetermined shape in order to finely control the threshold voltage.

Note that although an example in which a single crystal semiconductor film is used is described in this embodiment, the present invention is not limited to this structure. For example, a bulk semiconductor substrate that is isolated by shallow trench isolation (STI) or the like may be used. For example, a polycrystalline, microcrystalline, or amorphous semiconductor film which is formed over the insulating film 701 by vapor deposition may be used. Alternatively, the semiconductor film may be crystallized by a known technique. As the known techniques of crystallization, a laser crystallization method using a laser beam and a crystallization method using a catalytic element are given. Alternatively, a crystallization method using a catalytic element and a laser crystallization method may be used in combination. In the case of using a heat-resistant substrate such as a quartz substrate, it is possible to combine any of the following crystallization methods: a thermal crystallization method using an electrically heated oven, a lamp heating crystallization method using infrared light, a crystallization method using a catalytic element, and a high-temperature heating method at approximately 950° C.

Figure 7B:
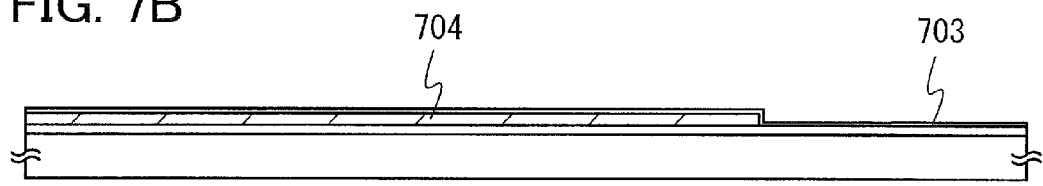

Next, as illustrated in FIG. 7B, a semiconductor layer 704 is formed using the semiconductor film 702. Then, a gate insulating film 703 is formed over the semiconductor layer 704.

The gate insulating film 703 can be a single layer or a stack of layers containing silicon oxide, silicon nitride oxide, silicon oxynitride, silicon nitride, hafnium oxide, aluminum oxide, tantalum oxide, yttrium oxide, hafnium silicate (HfSi$_x$O$_y$, (x>0, y>0)), hafnium silicate (HfSi$_x$O$_y$N$_z$ (x>0, y>0, z>0)) to which nitrogen is added, hafnium aluminate (HfAl$_x$O$_y$N$_z$, (x>0, y>0, z>0)) to which nitrogen is added, or the like by, for example, a plasma CVD method or a sputtering method.

Note that, in this specification, an oxynitride refers to a material in which the oxygen content is higher than the nitrogen content, and a nitride oxide refers to a material in which the nitrogen content is higher than the oxygen content.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is formed as the gate insulating film 703 by a plasma CVD method.

Figure 7C:
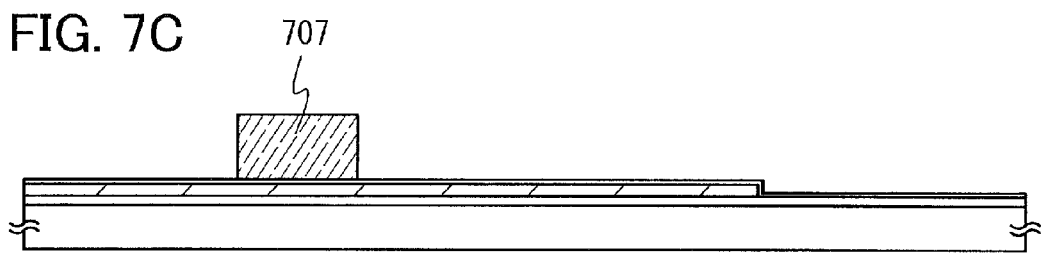

Then, a gate electrode 707 is formed as illustrated in FIG. 7C.

A conductive film is formed and then is processed into a predetermined shape, so that the gate electrode 707 can be formed. The conductive film can be formed by a CVD method, a sputtering method, a vapor deposition method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing any of the above metals as a main component or a compound containing any of the above metals may be used. Alternatively, the conductive film may be formed using a semiconductor such as polycrystalline silicon doped with an impurity element such as phosphorus which imparts conductivity to the semiconductor film.

Note that although the gate electrode 707 is formed of a single-layer conductive film in this embodiment, this embodiment is not limited to this structure. The gate electrode 707 may be formed of a plurality of stacked conductive films.

As a combination of two conductive films, tantalum nitride or tantalum can be used for a first conductive film and tungsten can be used for a second conductive film. Other examples of the combination of two conductive films are tungsten nitride and tungsten, molybdenum nitride and molybdenum, aluminum and tantalum, and aluminum and titanium. Since tungsten and tantalum nitride have high heat resistance, heat treatment aimed at thermal activation can be performed in subsequent steps after formation of the two conductive films. Alternatively, as a combination of the two conductive films, for example, nickel silicide and silicon doped with an impurity element which imparts n-type conductivity, tungsten silicide and silicon doped with an impurity element which imparts n-type conductivity, or the like may be used.

In the case of employing a three-layer structure in which three or more conductive films are stacked, a stacked-layer structure of a molybdenum film, an aluminum film, and a molybdenum film is preferable.

A light-transmitting oxide conductive film of indium oxide, indium tin oxide, indium zinc oxide, zinc oxide, zinc aluminum oxide, zinc aluminum oxynitride, gallium zinc oxide, or the like can be used as the gate electrode 707.

Alternatively, the gate electrode 707 may be selectively formed by a droplet discharge method without using a mask. A droplet discharge method is a method for forming a predetermined pattern by discharge or ejection of a droplet containing a predetermined composition from a pore, and includes an inkjet method in its category.

The gate electrode 707 can be formed in such a manner that the conductive film is etched into a desired tapered shape by an inductively coupled plasma (ICP) etching method in which the etching condition (e.g., the amount of electric power applied to a coil-shaped electrode layer, the amount of electric power applied to an electrode layer on the substrate side, and the electrode temperature on the substrate side) is controlled as appropriate. Further, an angle and the like of the tapered shape may be controlled by the shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 7D:
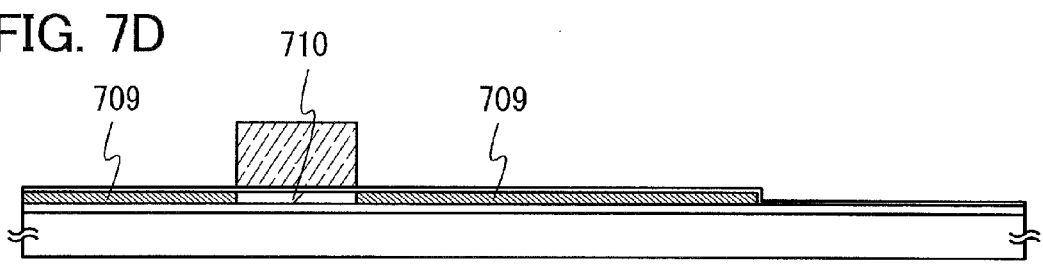

Next, as illustrated in FIG. 7D, an impurity element imparting one conductivity is added to the semiconductor layer 704 with the gate electrode 707 used as a mask, whereby a channel formation region 710 overlapping with the gate electrode 707, and a pair of impurity regions 709 between which the channel formation region 710 is placed are formed in the semiconductor layer 704.

In this embodiment, the case where an impurity element imparting p-type conductivity (e.g., boron) is added to the semiconductor layer 704 is described as an example.

Figure 8A:
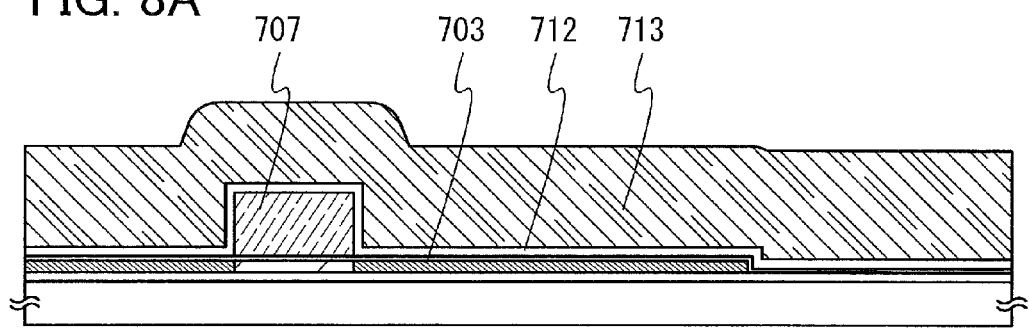
FIGS. 8A to 8C illustrate an example of a manufacturing process of the semiconductor device.

Next, as illustrated in FIG. 8A, an insulating film 712 and an insulating film 713 are formed so as to cover the gate insulating film 703 and the gate electrode 707. Specifically, an inorganic insulating film of silicon oxide, silicon nitride, silicon nitride oxide, silicon oxynitride, aluminum nitride, aluminum nitride oxide, or the like can be used as the insulating film 712 and the insulating film 713. In particular, the insulating film 712 and the insulating film 713 are preferably formed using a low dielectric constant (low-k) material because capacitance due to overlapping of electrodes or wirings can be sufficiently reduced. Note that a porous insulating film including such a material may be employed as the insulating film 712 and the insulating film 713. Since the porous insulating film has lower dielectric constant than a dense insulating layer, parasitic capacitance due to electrodes or wirings can be further reduced.

In this embodiment, an example in which silicon oxynitride is used for the insulating film 712 and silicon nitride oxide is used for the insulating film 713 is described. In addition, an example in which the insulating film 712 and the insulating film 713 are formed over the gate electrode 707 is described in this embodiment; however, in the present invention, only one insulating film may be formed over the gate electrode 707 or a plurality of insulating films of three or more layers may be stacked.

Figure 8B:
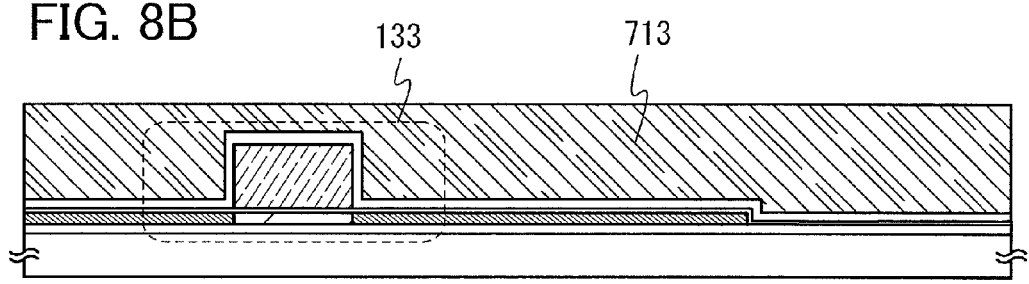

Next, as illustrated in FIG. 8B, the insulating film 713 is subjected to chemical mechanical polishing (CMP) or etching, so that a top surface of the insulating film 713 is planarized. Note that in order to improve the characteristics of the transistor 11 which is formed later, a surface of the insulating film 713 is preferably planarized as much as possible.

Through the above steps, the transistor 133 can be manufactured.

Figure 8C:
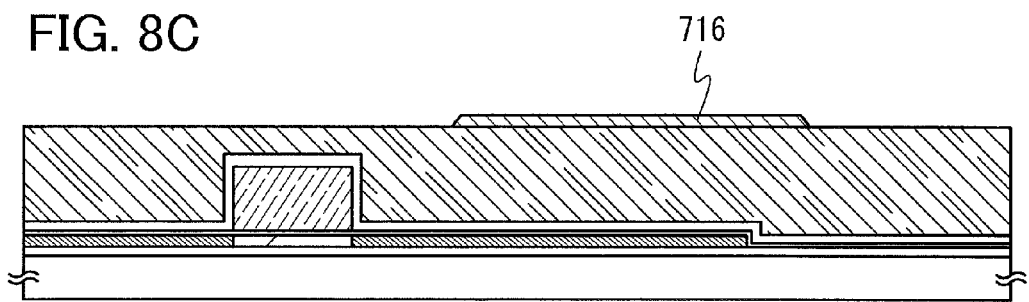

Next, a method of manufacturing the transistor 11 will be described. First, as illustrated in FIG. 8C, an oxide semiconductor layer 716 is formed over the insulating film 713.

The oxide semiconductor layer preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. In addition, any of the above oxide semiconductors may contain an element other than In, Ga, Sn, and Zn, for example, $SiO_2$.

Note that here, for example, an "In—Ga—Zn—O-based oxide" means an oxide containing In, Ga, and Zn as a main component and there is no particular limitation on the ratio of In to Ga and Zn. The In—Ga—Zn-based oxide may contain a metal element other than the In, Ga, and Zn. The In—Ga—Zn-based oxide has sufficiently high resistance when there is no electric field; thus, off-state current can be sufficiently reduced. In addition, also having high field-effect mobility, the In—Ga—Zn-based oxide is suitable for a semiconductor material used in a semiconductor device.

Further, for example, an "In—Sn—Zn-based oxide" means an oxide containing In, Sn, and Zn as a main component and there is no particular limitation on the ratio of In to Sn and Zn. The In—Sn—Zn-based oxide may contain a metal element other than In, Sn, and Zn.

Alternatively, a material represented by a chemical formula, $InMO_3(ZnO)_m$ (m>0 is satisfied, and m is not an integer) may be used for an oxide semiconductor layer. Here, M represents one or more metal elements selected from Ga, Fe, Mn, and Co. Alternatively, as the oxide semiconductor, a material expressed by a chemical formula, $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain required semiconductor characteristics, it is preferable that the carrier density, the impurity concentration, the defect density, the atomic ratio between a metal element and oxygen, the interatomic distance, the density, and the like be set to appropriate values.

The oxide semiconductor may be either single crystal or non-single-crystal.

In the case where the oxide semiconductor is non-single-crystal, the oxide semiconductor may be either amorphous or polycrystalline. Further, the oxide semiconductor may have a structure including a crystalline portion in an amorphous portion. Note that the amorphous structure has many defects; therefore, a non-amorphous structure is preferred.

Note that the oxide semiconductor layer 716 is preferably purified (intrinsic or substantially intrinsic) by a reduction in impurities such as moisture or hydrogen which serve as electron donors, in which case current generated in a state where a channel is not formed in the oxide semiconductor layer 716 can be reduced. Specifically, the concentration of hydrogen in the highly purified oxide semiconductor layer 716 which is measured by secondary ion mass spectrometry (SIMS) is $5\times10^{19}/cm^3$ or lower, preferably $5\times10^{18}/cm^3$ or lower, further preferably $5\times10^{17}/cm^3$ or lower, still further preferably $1\times10^{16}/cm^3$ or lower. The carrier density of the oxide semiconductor layer measured by Hall effect measurement is less than $1\times10^{14}/cm^3$, preferably less than $1\times10^{12}/cm^3$, further preferably less than $1\times10^{11}/cm^3$.

The analysis of the hydrogen concentration in the oxide semiconductor layer is described here. The hydrogen concentration in the semiconductor layer is measured by secondary ion mass spectrometry. It is known that it is difficult, in principle, to obtain correct data in the proximity of a surface of a sample or in the proximity of an interface between stacked layers formed using different materials by the SIMS analysis. Thus, in the case where the distribution of the concentration of hydrogen in the layer in a thickness direction is analyzed by SIMS, an average value in a region of the layer in which the value is not greatly changed and substantially the same value can be obtained is employed as the hydrogen concentration. Further, in the case where the thickness of the layer is small, a region where substantially the same value can be obtained cannot be found in some cases due to the influence of the concentration of hydrogen in the layers adjacent to each other. In that case, the maximum value or the minimum value of the hydrogen concentration in the region of the layer is employed as the hydrogen concentration of the layer. Further, in the case where a mountain-shaped peak having the maximum value or a valley-shaped peak having the minimum value does not exist in the region of the layer, the value at the inflection point is employed as the hydrogen concentration.

The oxide semiconductor layer 716 can be formed by processing an oxide semiconductor film formed over the insulating film 713 into a desired shape. The thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm. The oxide semiconductor film is formed by a sputtering method using an oxide semiconductor as a target. Moreover, the oxide semiconductor film can be formed by a sputtering method in a rare gas (e.g., argon) atmosphere, an oxygen atmosphere, or a mixed atmosphere of a rare gas (e.g., argon) and oxygen.

In the case where the oxide semiconductor layer 716 is formed by a sputtering method, it is important to reduce not only the concentration of hydrogen in the target but also water and hydrogen in a chamber as much as possible. Specifically, for example, it is effective to perform baking of the chamber before formation of the oxide semiconductor layer, to reduce the concentration of water and hydrogen in a gas introduced into the chamber, and to prevent the counter flow in an evacuation system for exhausting a gas from the chamber.

Before the oxide semiconductor film is formed by a sputtering method, dust on the surface of the insulating film 713 may be removed by reverse sputtering in which an argon gas is introduced and plasma is generated. The reverse sputtering is a method in which voltage is applied to a substrate, not to a target side, under an argon atmosphere by using an RF power supply and plasma is generated in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

In order that the oxide semiconductor film contains as little hydrogen, a hydroxyl group, and moisture as possible, impurities adsorbed on the substrate 700, such as moisture or hydrogen, may be eliminated and removed by preheating the substrate 700, over which the insulating films 712 and 713 are formed, in a preheating chamber of a sputtering apparatus as a pretreatment for film formation. The temperature for the preheating is higher than or equal to 100° C. and lower than or equal to 400° C., preferably higher than or equal to 150° C. and lower than or equal to 300° C. As an evacuation unit, a cryopump is preferably provided in the preheating chamber. Note that this preheating treatment can be omitted. This preheating may be similarly performed on the substrate 700 over which conductive layer 719 and the conductive layer 720 are formed before the formation of a gate insulating film 721.

In this embodiment, a 30 nm thick In—Ga—Zn—O-based oxide semiconductor thin film which is obtained by sputtering using a target including indium (In), gallium (Ga), and zinc (Zn), is used as the oxide semiconductor film. As the target, for example, a target having a composition ratio of In:Ga:Zn=2:2:1, In:Ga:Zn=1:1:1, or In:Ga:Zn=1:1:2 can be used. The filling rate of the target including In, Ga, and Zn is greater than or equal to 90% and less than or equal to 100%, preferably greater than or equal to 95% and less than 100%. With the use of the target with high filling rate, a dense oxide semiconductor film is formed. Other than the above, a target having a composition ratio, in an In—Ga—Zn-based oxide, of In:Ga:Zn=2:1:3, In:Ga:Zn=3:1:2, In:Ga:Zn=4:2:3, or In:Ga:Zn=3:1:4 is preferably used. By making the proportion of In higher than that of Ga, the field-effect mobility of an In—Ga—Zn-based oxide can be further increased. Note that the composition ratio of metal elements is not necessarily the above integer ratios. Some deviations from the above integer ratios are allowed as long as the tendency in which the proportion of In is higher than that of Ga can be seen.

Alternatively, the oxide semiconductor film may be formed by a sputtering method using a target including In, Sn, and Zn. In that case, an oxide target which has a composition ratio of In:Sn:Zn=1:2:2, 2:1:3, 1:1:1, 20:45:35, or the like in an atomic ratio is used.

In this embodiment, the oxide semiconductor film is deposited in such a manner that the substrate is held in a treatment chamber kept in a reduced-pressure state, a sputtering gas from which hydrogen and moisture are removed is introduced while moisture remaining in the treatment chamber is removed, and the target is used. The substrate temperature may be higher than or equal to 100° C. and lower than or equal to 600° C., preferably higher than or equal to 200° C. and lower than or equal to 400° C. in film formation. By forming the oxide semiconductor film in a state where the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film formed in the treatment chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power supply is preferably used, in which case dust generated in deposition can be reduced and the film thickness can be uniform.

Moreover, when the leakage rate of the treatment chamber of the sputtering apparatus is set to lower than or equal to $1\times10^{-10}$ Pa·m³/second, entry of impurities such as an alkali metal or hydride into the oxide semiconductor film that is being formed by a sputtering method can be reduced.

Further, with the use of an entrapment vacuum pump as an exhaustion system, counter flow of impurities, such as alkali metal, hydrogen atoms, hydrogen molecules, water, a hydroxyl group, or hydride, from the exhaustion system can be reduced.

When the purity of the target is set to 99.99% or higher, alkali metal, hydrogen atoms, hydrogen molecules, water, a hydroxyl group, hydride, or the like mixed to the oxide semiconductor film can be reduced. In addition, when the target is used, the concentration of alkali metal such as lithium, sodium, or potassium can be reduced in the oxide semiconductor film.

Note that the oxide semiconductor layer may be amorphous or may have crystallinity. As an oxide semiconductor layer having crystallinity, a crystalline oxide semiconductor having c-axis alignment (also referred to as c-axis aligned crystalline oxide semiconductor: CAAC-OS) is also preferable because the effect of improving the reliability of a transistor can be obtained.

Specifically, in a broad sense, the CAAC-OS is non-single-crystal, has triangular, hexagonal, equilateral triangular, or regular hexagonal atomic arrangement when seen from the direction perpendicular to the a-b plane, and has a phase in which metal atoms are arranged in a layered manner or a phase in which metal atoms and oxygen atoms are arranged in a layered manner when seen from the direction perpendicular to the c-axis direction.

In CAAC-OS, metal atoms and oxygen atoms are bonded in an orderly manner in comparison with an amorphous oxide semiconductor. In other words, in the case where an oxide semiconductor is amorphous, the coordination numbers might vary according to the kind of metal atom. In contrast, in the case of CAAC-OS, the coordination numbers of metal atoms are substantially the same. Therefore, microscopic defects of oxygen can be reduced and instability and movement of charge due to attachment and detachment of hydrogen atoms (including hydrogen ions) or alkali metal atoms can be reduced.

The CAAC-OS is not a single crystal oxide, but this does not mean that the CAAC-OS is composed of only an amorphous component. Although the CAAC-OS includes a crystallized portion (crystalline portion), a boundary between one crystalline portion and another crystalline portion is not clear in some cases.

In the case where oxygen is contained in the CAAC-OS, nitrogen may be substituted for part of oxygen contained in the CAAC-OS. The c-axes of individual crystalline portions included in the CAAC-OS may be aligned in one direction (e.g., a direction perpendicular to a surface of a substrate over which the CAAC-OS is formed or a surface of the CAAC-OS). Alternatively, the normals of the a-b planes of the individual crystalline portions included in the CAAC-OS may be aligned in one direction (e.g., a direction perpendicular to a surface of a substrate over which the CAAC-OS is formed or a surface of the CAAC-OS).

The CAAC-OS becomes a conductor, a semiconductor, or an insulator depending on its composition or the like. The CAAC-OS transmits or does not transmit visible light depending on its composition or the like.

For example, when the CAAC-OS in a film shape has a triangular or hexagonal atomic arrangement when observed in the direction perpendicular to a top surface of the film or a surface of a substrate over which the CAAC-OS is formed with an electron microscope.

Further, when the cross section of the film is observed by an electron microscope, metal atoms are arranged in a layered manner or metal atoms and oxygen atoms (or nitrogen atoms) are arranged in a layered manner.

An example of a crystal structure of the CAAC-OS will be described with reference to FIGS. 12A to 12E, FIGS. 13A to 13C, and FIGS. 14A to 14C.

In FIGS. 12A to 12E, FIGS. 13A to 13C, and FIGS. 14A to 14C, the vertical direction corresponds to the c-axis direction and a plane perpendicular to the c-axis direction corresponds to the a-b plane. In this embodiment, an "upper half" and a "lower half" refer to an upper half above the a-b plane and a lower half below the a-b plane (an upper half and a lower half with respect to the a-b plane). In FIGS. 12A to 12E, O surrounded by a circle represents tetracoordinate O and O surrounded by a double circle represents tricoordinate O.

Figure 12A:
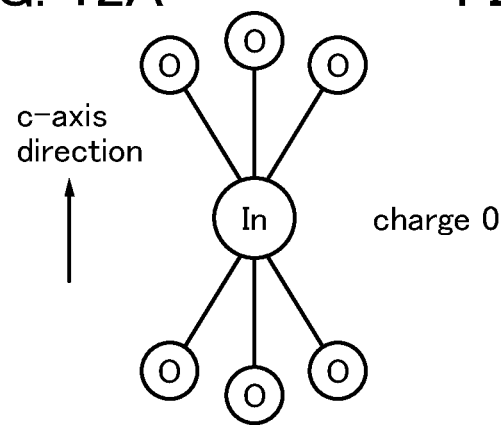
FIGS. 12A to 12E illustrate structures of oxide materials.

FIG. 12A illustrates a structure including one hexacoordinate In atom and six tetracoordinate oxygen (hereinafter referred to as tetracoordinate O) atoms proximate to the In atom. Here, a structure including one metal atom and oxygen atoms proximate to the metal is referred to as a small group.

The structure in FIG. 12A is an octahedral structure, but is illustrated as a planar structure for simplicity.

Note that in the structure in FIG. 12A, three tetracoordinate O atoms exist in each of an upper half and a lower half. In the small group of the structure in FIG. 12A, electric charge is 0.

Figure 12D:
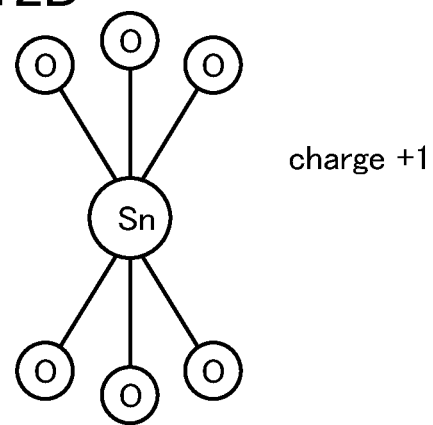
Figure 12B:
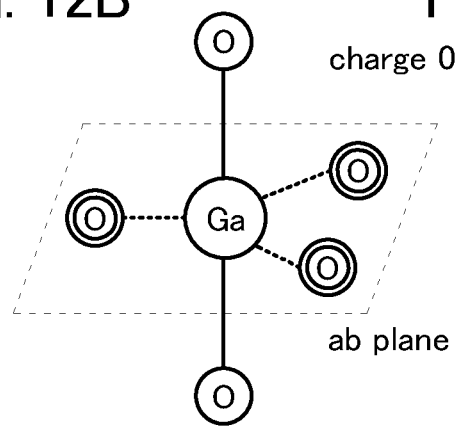

FIG. 12B illustrates a structure including one pentacoordinate Ga atom, three tricoordinate oxygen (hereinafter referred to as tricoordinate O) atoms proximate to the Ga atom, and two tetracoordinate O atoms proximate to the Ga atom.

All the tricoordinate O atoms exist on the a-b plane. In the structure in FIG. 12B, one tetracoordinate O atom exists in each of an upper half and a lower half. An In atom can also have the structure in FIG. 12B because an In atom can have five ligands. In the small group of the structure in FIG. 12B, electric charge is 0.

Figure 12E:
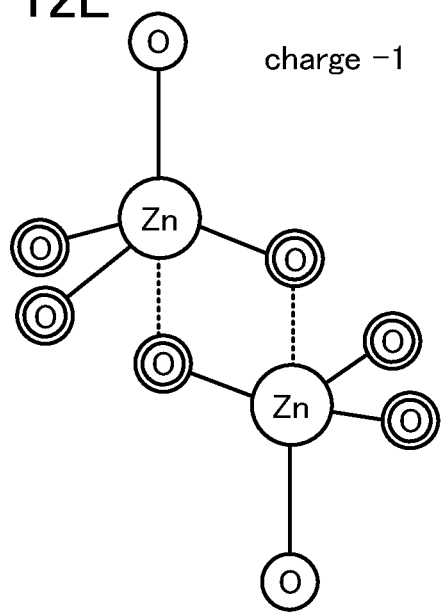
Figure 12C:
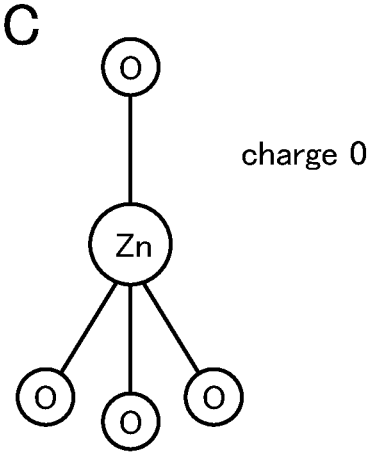

FIG. 12C illustrates a structure including one tetracoordinate Zn atom and four tetracoordinate O atoms proximate to the Zn atom.

In the structure in FIG. 12C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 12C. In the small group of the structure in FIG. 12C, electric charge is 0.

FIG. 12D illustrates a structure including one hexacoordinate Sn atom and six tetracoordinate O atoms proximate to the Sn atom. In the structure in FIG. 12D, three tetracoordinate O atoms exist in each of an upper half and a lower half.

In the small group of the structure in FIG. 12D, electric charge is +1.

FIG. 12E illustrates a structure including two Zn atoms.

In the structure in FIG. 12E, one tetracoordinate O atom exists in each of an upper half and a lower half. In the small group of the structure in FIG. 12E, electric charge is −1.

In this embodiment, a plurality of small groups form a medium group, and a plurality of medium groups form a large group (also referred to as a unit cell).

Now, a rule of bonding between the small groups is described.

The three O atoms in the upper half with respect to the hexacoordinate In atom in FIG. 12A each have three proximate In atoms in the downward direction, and the three O atoms in the lower half each have three proximate In atoms in the upward direction.

The one O atom in the upper half with respect to the pentacoordinate Ga atom in FIG. 12B has one proximate Ga atom in the downward direction, and the one O atom in the lower half has one proximate Ga atom in the upward direction.

The one O atom in the upper half with respect to the tetracoordinate Zn atom in FIG. 12C has one proximate Zn atom in the downward direction, and the three O atoms in the lower half each have three proximate Zn atoms in the upward direction.

In this manner, the number of the tetracoordinate O atoms below the metal atom is equal to the number of the metal atoms proximate to and above each of the tetracoordinate O atoms.

Since the coordination number of the tetracoordinate O atom is 4, the sum of the number of the metal atoms proximate to and below the O atom and the number of the metal atoms proximate to and above the O atom is 4. Therefore, when the sum of the number of tetracoordinate O atoms above a metal atom and the number of tetracoordinate O atoms below another metal atom is 4, the two kinds of small groups including the metal atoms can be bonded.

The reason is described below. For example, in the case where the hexacoordinate metal (In or Sn) atom is bonded through three tetracoordinate O atoms in the upper half, it is bonded to tetracoordinate O atoms in the upper half of the pentacoordinate metal (Ga or In) atom, tetracoordinate O atoms in the lower half of the pentacoordinate metal (Ga or In) atom, or tetracoordinate O atoms in the upper half of the tetracoordinate metal (Zn) atom.

A metal atom whose coordination number is 4, 5, or 6 is bonded to another metal atom through a tetracoordinate O atom in the c-axis direction.

In addition to the above, a medium group can be formed in a different manner by combining a plurality of small groups so that the total electric charge of the layered structure is 0.

FIG. 13A illustrates a model of a medium group included in a layered structure of an In—Sn—Zn—O-based material. FIG. 13B illustrates a large group including three medium groups.

Note that FIG. 13C illustrates an atomic arrangement in the case where the layered structure in FIG. 13B is observed from the c-axis direction.

In the medium group in FIG. 13A, a tricoordinate O atom is omitted, only the number of tetracoordinate O atoms is shown. For example, three tetracoordinate O atoms existing in each of an upper half and a lower half with respect to a Sn atom are denoted by circled 3.

In a similar manner, in the medium group in FIG. 13A, one tetracoordinate O atom existing in each of an upper half and a lower half with respect to an In atom is denoted by circled 1.

In addition, the medium group in FIG. 13A illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group in FIG. 13A included in the layered structure of the In—Sn—Zn—O-based material, in the order starting from the top, a Sn atom proximate to three tetracoordinate O atoms in each of an upper half and a lower half is bonded to an In atom proximate to one tetracoordinate O atom in each of an upper half and a lower half.

The In atom is bonded to a Zn atom proximate to three tetracoordinate O atoms in an upper half.

The Zn atom is bonded to an In atom proximate to three tetracoordinate O atoms in each of an upper half and a lower half through one tetracoordinate O atom in a lower half with respect to the Zn atom.

The In atom is bonded to a small group that includes two Zn atoms and is proximate to one tetracoordinate O atom in an upper half.

The small group is bonded to a Sn atom proximate to three tetracoordinate O atoms in each of an upper half and a lower half through one tetracoordinate O atom in a lower half with respect to the small group.

A plurality of such medium groups are bonded, so that a large group is formed.

Here, electric charge for one bond of a tricoordinate O atom and electric charge for one bond of a tetracoordinate O atom can be assumed to be −0.667 and −0.5, respectively.

For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Therefore, electric charge in a small group including a Sn atom is +1. Therefore, electric charge of −1, which cancels +1, is needed to form a layered structure including a Sn atom.

As a structure having electric charge of −1, the small group including two Zn atoms as illustrated in the structure in FIG. 12E can be given.

For example, with one small group including two Zn atoms, electric charge of one small group including a Sn atom can be cancelled, so that the total electric charge of the layered structure can be 0.

Specifically, when the large group B is repeated, an In—Sn—Zn—O-based crystal ($In_2SnZn_3O_8$) can be obtained.

A layered structure of the obtained In—Sn—Zn—O-based crystal can be expressed as a composition formula, $In_2SnZn_2O_7(ZnO)_m$ (m is 0 or a natural number).

The same applies to the case where an oxide semiconductor other than the In—Sn—Zn—O-based material is used.

Figure 14A:
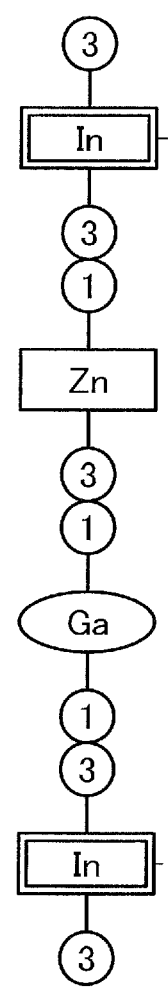
FIGS. 14A to 14C illustrate a structure of an oxide material.

For example, FIG. 14A illustrates a model of a medium group included in a layered structure of an In—Ga—Zn—O-based material.

In the medium group in FIG. 14A included in the layered structure of the In—Ga—Zn—O-based material, in the order starting from the top, an In atom proximate to three tetracoordinate O atoms in each of an upper half and a lower half is bonded to a Zn atom proximate to one tetracoordinate O atom in an upper half.

The Zn atom is bonded to a Ga atom proximate to one tetracoordinate O atom in each of an upper half and a lower half through three tetracoordinate O atoms in a lower half with respect to the Zn atom.

The Ga atom is bonded to an In atom proximate to three tetracoordinate O atoms in each of an upper half and a lower half through one tetracoordinate O atom in a lower half with respect to the Ga atom.

A plurality of such medium groups are bonded, so that a large group is formed.

Figure 14B:
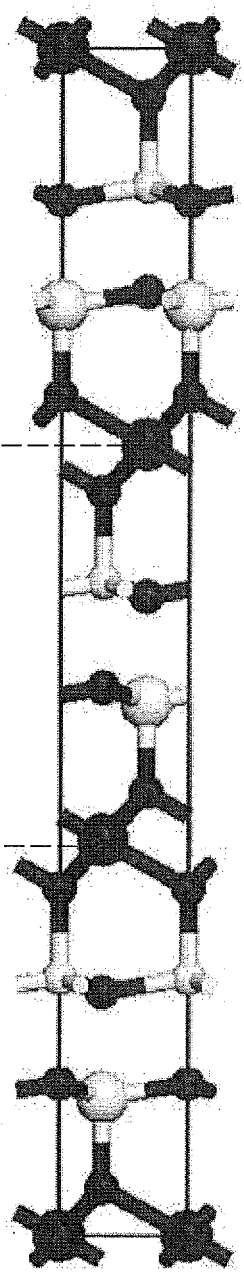
Figure 14C:
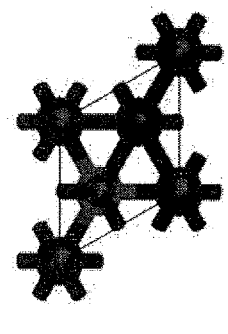

FIG. 14B illustrates a large group including three medium groups. Note that FIG. 14C illustrates an atomic arrangement in the case where the layered structure in FIG. 14B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0.

As a result, the total electric charge of a medium group having a combination of such small groups is always 0.

In order to form the layered structure of the In—Ga—Zn—O-based material, a large group can be formed using not only the medium group in FIG. 14A but also a medium group in which the arrangement of the In atom, the Ga atom, and the Zn atom is different from that of the medium group in FIG. 14A.

Specifically, when the large group in FIG. 14B is repeated, an In—Ga—Zn—O-based crystal can be obtained. Note that a layered structure of the obtained In—Ga—Zn—O-based crystal can be expressed as a composition formula, $InGaO_3(ZnO)_n$ (n is a natural number).

Figure 15A:
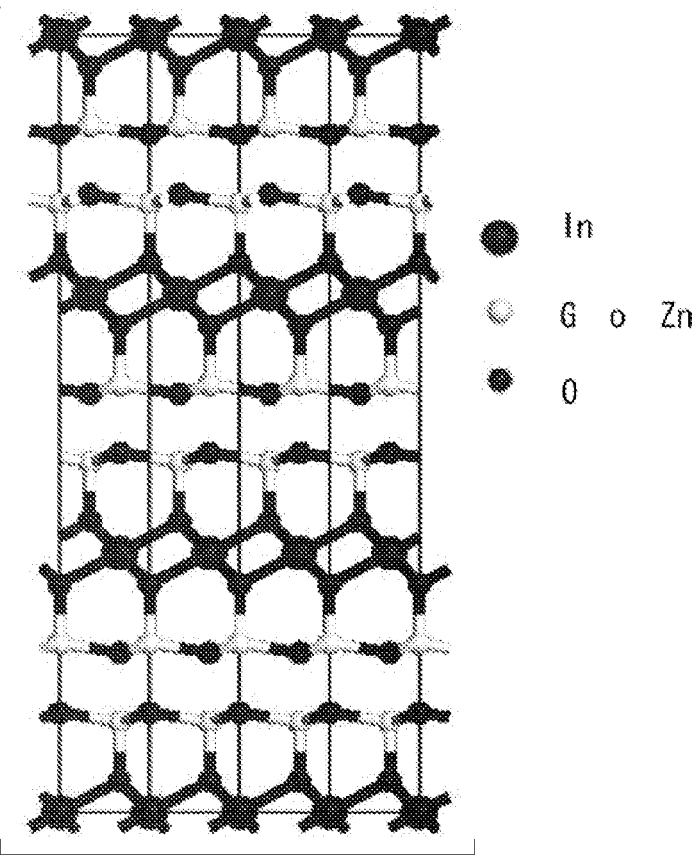
FIGS. 15A and 15B illustrate structures of oxide semiconductor materials.

In the case where n=1 ($InGaZnO_4$), a crystal structure illustrated in FIG. 15A can be obtained, for example. Note that in the crystal structure in FIG. 15A, since a Ga atom and an In atom each have five ligands as described in FIG. 12B, a structure in which Ga is replaced with In can be obtained.

Figure 15B:
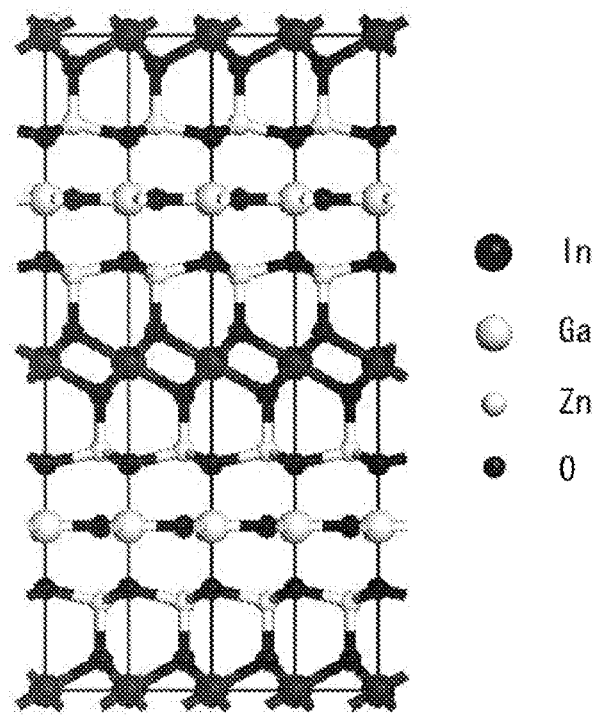

In the case where n=2 ($InGaZn_2O_5$), a crystal structure illustrated in FIG. 15B can be obtained, for example. Note that in the crystal structure in FIG. 15B, since a Ga atom and an In atom each have five ligands as described in FIG. 12B, a structure in which Ga is replaced with In can be obtained.

A transistor is formed using an oxide semiconductor film including the CAAC-OS in such a manner, whereby the amount of shift of the threshold voltage of the transistor, which occurs after light irradiation and a bias-temperature (BT) stress test are performed on the transistor, can be reduced. Thus, a transistor having stable electric characteristics can be manufactured.

An oxide semiconductor film including the CAAC-OS (hereinafter also referred to as CAAC-OS film) can be formed by a sputtering method. In the case where the CAAC-OS film is formed by a sputtering method, the proportion of oxygen gas in an atmosphere is preferably high. For sputtering in a mixed gas atmosphere of argon and oxygen, for example, the proportion of oxygen gas is preferably set to 30% or higher, more preferably 40% or higher. This is because supply of oxygen from atmosphere promotes the crystallization of the CAAC-OS.

In the case where a CAAC-OS film is formed by a sputtering method, a substrate over which the CAAC-OS film is formed is heated preferably to 150° C. or higher, further preferably to 170° C. or higher. This is because the crystallization of the CAAC-OS is promoted with an increase in the substrate temperature.

Further, after being subjected to heat treatment in a nitrogen atmosphere or in vacuum, the CAAC-OS film is preferably subjected to heat treatment in an oxygen atmosphere or a mixed atmosphere of oxygen and another gas. This is because oxygen deficiency due to the former heat treatment can be corrected by supply of oxygen from atmosphere in the latter heat treatment.

A film surface on which the CAAC-OS film is formed (deposition surface) is preferably flat. This is because roughness of the deposition surface causes generation of grain boundaries in the CAAC-OS film because the c-axis approximately perpendicular to the deposition surface exists in the CAAC-OS film. For that reason, the deposition surface is preferably subjected to planarization such as chemical mechanical polishing (CMP) before the CAAC-OS film is formed. The average roughness of the deposition surface is preferably less than or equal to 1 nm, more preferably less than or equal to 0.3 nm, further preferably less than or equal to 0.1 nm.

The oxide semiconductor film formed in the above-described manner is etched, thereby forming the oxide semiconductor layer 716. Etching for forming the oxide semiconductor layer 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate reactive ion etching (RIE) method or an inductively coupled plasma (ICP) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor layer 716 may be formed by an inkjet method. Formation of the resist mask by an inkjet method needs no photomask; thus, manufacturing cost can be reduced.

Note that it is preferable to perform reverse sputtering before the formation of a conductive film in a subsequent step to remove resist residues and the like that attach onto surfaces of the oxide semiconductor layer 716 and the insulating film 713.

Note that the oxide semiconductor film deposited by sputtering or the like contains a large amount of moisture or hydrogen (including a hydroxyl group) as an impurity in some cases. Moisture or hydrogen easily forms donor levels and thus serves as an impurity in the oxide semiconductor. Therefore, in one embodiment of the present invention, in order to reduce impurities such as moisture and hydrogen in the oxide semiconductor film (dehydration or dehydrogenation), the oxide semiconductor layer 716 is subjected to heat treatment in a reduced-pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) method).

By performing heat treatment on the oxide semiconductor layer 716, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for 3 to 6 minutes. When RTA is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may have a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is preferably less than or equal to 1 ppm, more preferably less than or equal to 0.1 ppm).

Note that it has been pointed out that an oxide semiconductor is insensitive to impurities, there is no problem when a considerable amount of metal impurities is contained in the film, and therefore, soda-lime glass which contains a large amount of alkali metal such as sodium (Na) and is inexpensive can be used (Kamiya, Nomura, and Hosono, "Carrier Transport Properties and Electronic Structures of Amorphous Oxide Semiconductors: The present status," *KOTAI BUTSURI* (*SOLID STATE PHYSICS*), 2009, Vol. 44, pp. 621-633). However, this is not a proper consideration. Alkali metal is not an element included in an oxide semiconductor, and therefore, is an impurity. Also, alkaline earth metal is impurity in the case where alkaline earth metal is not included in an oxide semiconductor. Alkali metal, in particular, Na becomes $Na^+$ when an insulating film in contact with the oxide semiconductor layer is an oxide and Na diffuses into the insulating layer. Further, in the oxide semiconductor layer, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. In addition, variation in characteristics also occurs. Such deterioration of characteristics of the transistor and variation in characteristics due to the impurity remarkably appear when the hydrogen concentration in the oxide semiconductor layer is very low. Specifically, a measurement value of a Na concentration by secondary ion mass spectrometry is preferably less than or equal to $5\times10^{16}/cm^3$, more preferably less than or equal to $1\times10^{16}/cm^3$, still more preferably less than or equal to $1\times10^{15}/cm^3$. In a similar manner, a measurement value of a Li concentration is preferably less than or equal to $5\times10^{15}/cm^3$, more preferably less than or equal to $1\times10^{15}/cm^3$. In a similar manner, a measurement value of a K concentration is preferably less than or equal to $5\times10^{15}/cm^3$, more preferably less than or equal to $1\times10^{15}/cm^3$.

Through the above steps, the concentration of hydrogen in the oxide semiconductor layer 716 can be reduced and the oxide semiconductor layer can be purified. Consequently, the oxide semiconductor layer can be stable. In addition, heat treatment at a temperature which is lower than or equal to the glass transition temperature makes it possible to form an oxide semiconductor layer with extremely low carrier density and a wide band gap. Therefore, the transistor can be manufactured using a large-sized substrate, so that the productivity can be increased. In addition, by using the oxide semiconductor layer in which the hydrogen concentration is reduced and the purity is improved, it is possible to manufacture a transistor with high withstand voltage and an extremely low off-state current. The above heat treatment can be performed at any time as long as it is performed after the oxide semiconductor layer is formed.

Figure 9A:
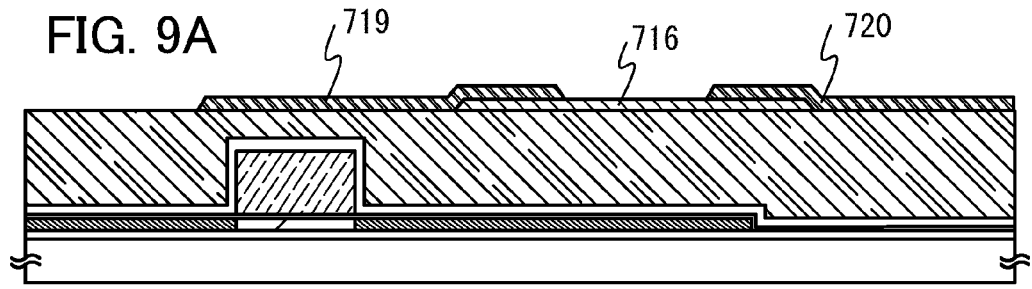
FIGS. 9A to 9D illustrate an example of a manufacturing process of the semiconductor device.

Then, as illustrated in FIG. 9A, the conductive layer 719 which is in contact with the oxide semiconductor layer 716, and the conductive layer 720 which is in contact with the oxide semiconductor layer 716 are formed. The conductive layer 719 and the conductive layer 720 function as source and drain electrodes.

Specifically, the conductive layer 719 and the conductive layer 720 can be formed in such a manner that a conductive film is formed by a sputtering method or a vacuum evaporation method and then processed into a predetermined shape.

Note that before forming a conductive film serving as the conductive layer 719 and the conductive layer 720, an opening is formed in the gate insulating film 703, the insulating film 712, and the insulating film 713 is formed to expose part of the semiconductor layer 704 and a conductive film can be formed so as to be connected to the semiconductor layer 704. By processing the conductive film into a predetermined shape, the conductive layer 719 and the conductive layer 720 can serve as a source electrode and a drain electrode which are connected to the pair of impurity regions 709 in the semiconductor layer 704. Alternatively, a source electrode and a drain electrode of the transistor 133 may be formed of a conductive film different from the conductive layer 719 and the conductive layer 720 to be connected to the conductive layer 719 and the conductive layer 720.

As the conductive film which serves as the conductive layer 719 and the conductive layer 720, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum or copper. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive layer 719 and the conductive layer 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesiveness with an oxide film. Thus, for the conductive layer 719 and the conductive layer 720, a layered structure is employed in which a conductive film including a Cu—Mg—Al alloy, a Mo—Ti alloy, Ti, or Mo is used for a lower layer and a conductive film including Cu is used for an upper layer. Consequently, the adhesion between an insulating film which is an oxide film and the conductive layer 719 and the conductive layer 720 can be increased.

For the conductive film which serves as the conductive layer 719 and the conductive layer 720, a conductive metal oxide may be used. As the conductive metal oxide, indium oxide, tin oxide, zinc oxide, indium tin oxide, indium zinc oxide, or the metal oxide material to which silicon or silicon oxide is added can be used.

In the case where heat treatment is performed after formation of the conductive film, the conductive film preferably has heat resistance enough to withstand the heat treatment.

Note that the material and etching conditions are adjusted as appropriate so that the oxide semiconductor layer 716 is not removed in etching of the conductive film as much as possible. Depending on the etching conditions, there are some cases in which an exposed portion of the oxide semiconductor layer 716 is partially etched and thus a groove (a depression portion) is formed.

In this embodiment, a titanium film is used for the conductive film. Therefore, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask formed using a multi-tone mask which is a light-exposure mask through which light is transmitted so as to have a plurality of intensities. A resist mask formed using a multi-tone mask has a plurality of thicknesses and can be changed in shape by etching; thus, the resist mask can be used in a plurality of etching processes for processing films into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Further, an oxide conductive film functioning as source and drain regions may be provided between the oxide semiconductor layer 716, and the conductive layer 719 and the conductive layer 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, etching for forming the oxide conductive film and etching for forming the conductive layer 719 and the conductive layer 720 may be performed concurrently.

With provision of the oxide conductive film functioning as source and drain regions, resistance between the oxide semiconductor layer 716, and the conductive layer 719 and the conductive layer 720 can be lowered, so that the transistor can operate at high speed. In addition, with provision of the oxide conductive film functioning as a source region and a drain region, the withstand voltage of the transistor can be increased.

Next, plasma treatment may be performed using a gas such as $N_2O$, $N_2$, or Ar. By this plasma treatment, water or the like adhering to an exposed surface of the oxide semiconductor layer is removed. Plasma treatment may be performed using a mixture gas of oxygen and argon as well.

Figure 9B:
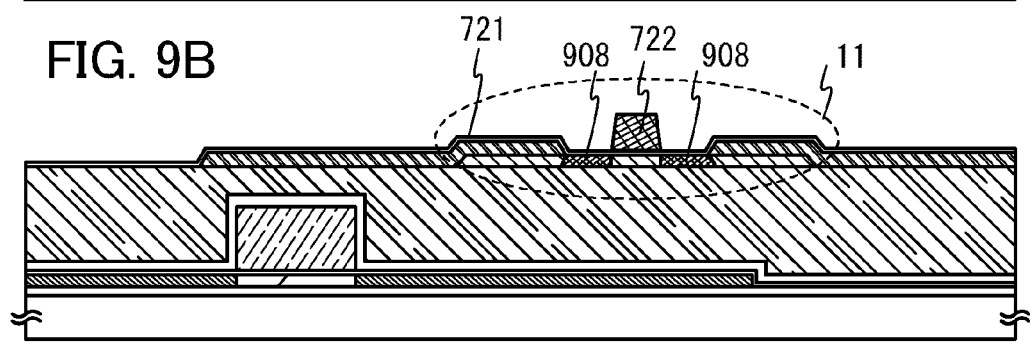

After the plasma treatment, as illustrated in FIG. 9B, the gate insulating film 721 is formed so as to cover the conductive layer 719, the conductive layer 720, and the oxide semiconductor layer 716. Then, a gate electrode 722 is formed over the gate insulating film 721 to overlap with the oxide semiconductor layer 716.

Then, a pair of high-concentration regions 908 is formed by adding a dopant imparting n-type conductivity to the oxide semiconductor layer 716, using the gate electrode 722 as a mask, after the gate electrode 722 is formed. Note that a region of the oxide semiconductor layer 716, which overlaps with the gate electrode 722 with the gate insulating film 721 provided therebetween, is a channel formation region. The oxide semiconductor layer 716 includes the channel formation region between the pair of high-concentration regions 908. The dopant for forming the high-concentration regions 908 can be added by an ion implantation method. A rare gas such as helium, argon, and xenon; an atom belonging to Group 15, such as nitrogen, phosphorus, arsenic, and antimony; or the like can be used as the dopant. For example, when nitrogen is used as the dopant, it is preferable that the high concentration regions 908 have a nitrogen atom concentration higher than or equal to $5 \times 10^{19}/cm^3$ and lower than or equal to $1 \times 10^{22}/cm^3$. The high-concentration region 908 to which the dopant imparting n-type conductivity is added has higher conductivity than other regions in the oxide semiconductor layer 716. Therefore, by providing the high-concentration regions 908 in the oxide semiconductor layer 716, the resistance between the source electrode and the drain electrode (the conductive layer 719 and the conductive layer 720) can be lowered.

When the resistance between the source and drain electrodes (the conductive layer 719 and the conductive layer 720) is lowered, high on-state current and high-speed operation can be secured even when the transistor 11 is miniaturized. In addition, by the miniaturization of the transistor 11, the semiconductor device 300 can be downsized.

In the case where an In—Ga—Zn—O-based oxide semiconductor is used for the oxide semiconductor layer 716, heat treatment is performed at a temperature higher than or equal to 300° C. and lower than or equal to 600° C. for 1 hour after nitrogen is added. Consequently, the oxide semiconductor in the high-concentration regions 908 has a wurtzite crystal structure. Since the oxide semiconductor in the high-concentration regions 908 has a wurtzite crystal structure, the conductivity of the high-concentration regions 908 can be further increased and the resistance between the source and drain electrodes (the conductive layer 719 and the conductive layer 720) can be decreased. Note that in order to effectively lower the resistance between the source and drain electrodes (the conductive layer 719 and the conductive layer 720) by forming an oxide semiconductor with a wurtzite crystal structure, the concentration of nitrogen atoms in the high-concentration region 908 is preferably higher than or equal to $1 \times 10^{20}/cm^3$ and lower than or equal to 7 at. % in the case where nitrogen is used as the dopant.

However, even when the nitrogen atom concentration is lower than the above range, the oxide semiconductor having a wurtzite crystal structure can be obtained in some cases.

The gate insulating film 721 can be formed using a material and a layered structure which are similar to those of the gate insulating film 703.

Note that the gate insulating film 721 preferably includes impurities such as moisture or hydrogen as little as possible, and the gate insulating film 721 may be formed using a single-layer insulating film or a plurality of insulating films stacked. When hydrogen is contained in the gate insulating film 721, hydrogen enters the oxide semiconductor layer 716 or oxygen in the oxide semiconductor layer 716 is extracted by hydrogen, whereby the oxide semiconductor layer 716 has lower resistance (n-type conductivity); thus, a parasitic channel might be formed.

Thus, it is important that a deposition method in which hydrogen is not used be employed in order to form the gate insulating film 721 containing hydrogen as little as possible.

A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having a lower proportion of nitrogen such as a silicon oxide film or a silicon oxynitride film is formed on the side closer to the oxide semiconductor layer 716 than the insulating film having a high barrier property. Then, the insulating film having a high barrier property is formed to overlap with the conductive layer 719 and the conductive layer 720, and the oxide semiconductor layer 716 with the insulating film having low proportion of nitrogen provided therebetween. When the insulating film having a high barrier property is used, impurities such as moisture and hydrogen can be prevented from entering the oxide semiconductor layer 716, the gate insulating film 721, or the interface between the oxide semiconductor layer 716 and another insulating film and the vicinity thereof.

In addition, the insulating film having a lower proportion of nitrogen such as a silicon oxide film or a silicon oxynitride film formed in contact with the oxide semiconductor layer 716 can prevent the insulating film formed using a material having a high barrier property from being in direct contact with the oxide semiconductor layer 716.

In this embodiment, the gate insulating film 721 has a structure in which a 100-nm-thick silicon nitride film formed by sputtering is stacked over a 200-nm-thick silicon oxide film formed by sputtering. The substrate temperature in film formation may be higher than or equal to room temperature and lower than or equal to 300° C. and in this embodiment, is 100° C.

After the gate insulating film 721 is formed, heat treatment may be performed. The heat treatment is performed in a nitrogen atmosphere, ultra-dry air, or a rare gas (e.g., argon or helium) atmosphere preferably at 200 to 400° C., for example, 250 to 350° C. It is preferable that the water content in the gas be 20 ppm or less, more preferably 1 ppm or less, further preferably 10 ppb or less.

In this embodiment, for example, heat treatment is performed at 250° C. in a nitrogen atmosphere for 1 hour. Alternatively, RTA treatment for a short time at a high temperature may be performed before the conductive layer 719 and the conductive layer 720 are formed in a manner similar to that of the heat treatment performed on the oxide semiconductor layer for reduction of moisture or hydrogen. Even when oxygen deficiency is generated in the oxide semiconductor layer 716 by the previous heat treatment performed on the oxide semiconductor layer 716 by performing heat treatment after providing the gate insulating film 721 containing oxygen, oxygen is supplied to the oxide semiconductor layer 716 from the gate insulating film 721. By supplying oxygen to the oxide semiconductor layer 716, oxygen deficiency that serves as a donor can be reduced in the oxide semiconductor layer 716 and the stoichiometric ratio can be satisfied. It is preferable that the proportion of oxygen in the oxide semiconductor layer 716 be higher than that in the stoichiometric composition. As a result, the oxide semiconductor layer 716 can be made to be substantially i-type and variation in electrical characteristics of the transistor due to oxygen deficiency can be reduced; thus, electrical characteristics can be improved. The timing of this heat treatment is not particularly limited as long as it is after the formation of the gate insulating film 721. When this heat treatment doubles as another step such as heat treatment for formation of a resin film or heat treatment for reduction of the resistance of a transparent conductive film, the oxide semiconductor layer 716 can be made to be substantially i-type without the number of steps increased.

Moreover, the oxygen deficiency that serves as a donor in the oxide semiconductor layer 716 may be reduced by subjecting the oxide semiconductor layer 716 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not contain water, hydrogen, or the like. Alternatively, the purity of the oxygen gas which is introduced into the heat treatment apparatus is preferably greater than or equal to 6N (99.9999%), more preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor layer 716 by an ion implantation method, an ion doping method, or the like to reduce oxygen deficiency serving as a donor. For example, oxygen which is made into a plasma state with a microwave at 2.45 GHz may be added to the oxide semiconductor layer 716.

The gate electrode 722 can be formed in a manner such that a conductive film is formed over the gate insulating film 721 and then is etched. The gate electrode 722 can be formed using a material similar to that of the gate electrode 707 and the conductive layer 719 and the conductive layer 720.

The thickness of the gate electrode 722 is greater than or equal to 10 nm and less than or equal to 400 nm, preferably greater than or equal to 100 nm and less than or equal to 200 nm. In this embodiment, after a 150-nm-thick conductive film for the gate electrode is formed by sputtering using a tungsten target, the conductive film is etched into a desired shape, so that the gate electrode 722 is formed. Note that a resist mask may be formed by an inkjet method. Formation of the resist mask by an inkjet method needs no photomask; thus, manufacturing cost can be reduced.

Through the above steps, the transistor 11 is manufactured.

In the transistor 11, the source electrode and drain electrodes (the conductive layer 719 and the conductive layer 720) do not overlap with the gate electrode 722. In other words, a gap which is larger than the thickness of the gate insulating film 721 is provided between the source and drain electrodes (the conductive layer 719 and the conductive layer 720) and the gate electrode 722. Thus, in the transistor 11, parasitic capacitance formed between the source and drain electrodes and the gate electrode can be reduced. Consequently, high-speed operation can be performed.

Note that the transistor 11 is not limited to a transistor whose channel is formed in an oxide semiconductor layer, and it is possible to use a transistor that includes a semiconductor material whose band gap is wider than that of silicon and whose intrinsic carrier density is lower than that of silicon in a channel formation region. As such a semiconductor material, for example, silicon carbide, gallium nitride, or the like can be used instead of an oxide semiconductor. With a channel formation region including such a semiconductor material, a transistor whose off-state current is extremely low can be obtained.

Although the transistor 11 is a single-gate transistor, a multi-gate transistor including a plurality of channel formation regions can be formed when a plurality of gate electrodes electrically connected to each other are included when needed.

Note that an insulating film in contact with the oxide semiconductor layer 716 (which corresponds to the gate insulating film 721 in this embodiment) may be formed using an insulating material containing a Group 13 element and oxygen. Many of oxide semiconductor materials contain elements of Group 13, and an insulating material containing an element of Group 13 is compatible with an oxide semiconductor. Thus, when an insulating material containing an element of Group 13 is used for the insulating film in contact with the oxide semiconductor layer, the state of the interface between the oxide semiconductor layer and the insulating film can be kept favorable.

An insulating material containing an element that belongs to Group 13 is an insulating material containing one or more elements that belong to Group 13. As the insulating material containing a Group 13 element, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, when a material containing gallium oxide is used for an insulating film that is in contact with an oxide semiconductor layer containing gallium, characteristics at the interface between the oxide semiconductor layer and the insulating film can be kept favorable. For example, the oxide semiconductor layer and an insulating film containing gallium oxide are provided in contact with each other, so that pile up of hydrogen at the interface between the oxide semiconductor layer and the insulating film can be reduced. Note that a similar effect can be obtained in the case where an element in the same group as a constituent element of the oxide semiconductor is used in an insulating film. For example, it is effective to form an insulating film with the use of a material including aluminum oxide. Note that water is less likely to permeate an aluminum oxide. Thus, it is preferable to use a material containing an aluminum oxide in terms of preventing entry of water to the oxide semiconductor layer.

The insulating material of the insulating film in contact with the oxide semiconductor layer 716 is preferably made to contain oxygen in a proportion higher than that in the stoichiometric composition by heat treatment in an oxygen atmosphere or by oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by ion implantation or ion doping.

For example, in the case where the insulating film in contact with the oxide semiconductor layer 716 is formed using gallium oxide, the composition of gallium oxide can be set to be $Ga_2O_x$ ($x=3+\alpha$, $0<\alpha<1$) by heat treatment in an oxygen atmosphere or by oxygen doping.

In the case where the insulating film in contact with the oxide semiconductor layer 716 is formed using aluminum oxide, the composition of aluminum oxide can be set to be $Al_2O_x$ ($x=3+\alpha$, $0<\alpha<1$) by heat treatment in an oxygen atmosphere or by oxygen doping.

In the case where the insulating film in contact with the oxide semiconductor layer 716 is formed using gallium aluminum oxide (aluminum gallium oxide), the composition of gallium aluminum oxide (aluminum gallium oxide) can be set to be $Ga_xAl_{2-x}O_{3+\alpha}$ ($0<x<2$, $0<\alpha<1$) by heat treatment in an oxygen atmosphere or by oxygen doping.

By oxygen doping, an insulating film which includes a region where the proportion of oxygen is higher than that in the stoichiometric composition can be formed. When the insulating film including such a region is in contact with the oxide semiconductor layer, excess oxygen in the insulating film is supplied to the oxide semiconductor layer, and oxygen defects in the oxide semiconductor layer or at the interface between the oxide semiconductor layer and the insulating film are reduced. Thus, the oxide semiconductor layer can be made to be an i-type or substantially i-type oxide semiconductor.

Note that the insulating film which includes a region where the proportion of oxygen is higher than that in the stoichiometric composition may be applied to either the insulating film located on the upper side of the oxide semiconductor layer 716 or the insulating film located on the lower side of the oxide semiconductor layer 716 of the insulating films in contact with the oxide semiconductor layer 716; however, it is preferable to apply such an insulating film to both of the insulating films in contact with the oxide semiconductor layer 716. The above-described effect can be enhanced with a structure where the oxide semiconductor layer 716 is sandwiched between the insulating films each including a region where the proportion of oxygen is higher than that in the stoichiometric composition, which are used as the insulating films in contact with the oxide semiconductor layer 716 and located on the upper side and the lower side of the oxide semiconductor layer 716.

The insulating films on the upper side and the lower side of the oxide semiconductor layer 716 may contain the same constituent elements or different constituent elements. For example, the insulating films on the upper side and the lower side may be both formed of gallium oxide whose composition is $Ga_2O_x$ ($x=3+\alpha$, $0<\alpha<1$). Alternatively, one of the insulating films on the upper side and the lower side may be formed of $Ga_2O_x$ ($x=3+\alpha$, $0<\alpha<1$) and the other may be formed of aluminum oxide whose composition is $Al_2O_x$ ($x=3+\alpha$, $0<\alpha<1$).

The insulating film in contact with the oxide semiconductor layer 716 may be formed by stacking insulating films each including a region where the proportion of oxygen is higher than that in the stoichiometric composition. For example, the insulating film on the upper side of the oxide semiconductor layer 716 may be formed as follows: gallium oxide whose composition is $Ga_2O_x$ ($x=3+a$, $0<a<1$) is formed and gallium aluminum oxide (aluminum gallium oxide) whose composition is $Ga_xAl_{2-x}O_{3+a}$ ($0<x<2$, $0<a<1$) is formed thereover. Note that the insulating film on the lower side of the oxide semiconductor layer 716 may be formed by stacking insulating films each including a region where the proportion of oxygen is higher than that in the stoichiometric composition.

Figure 9C:
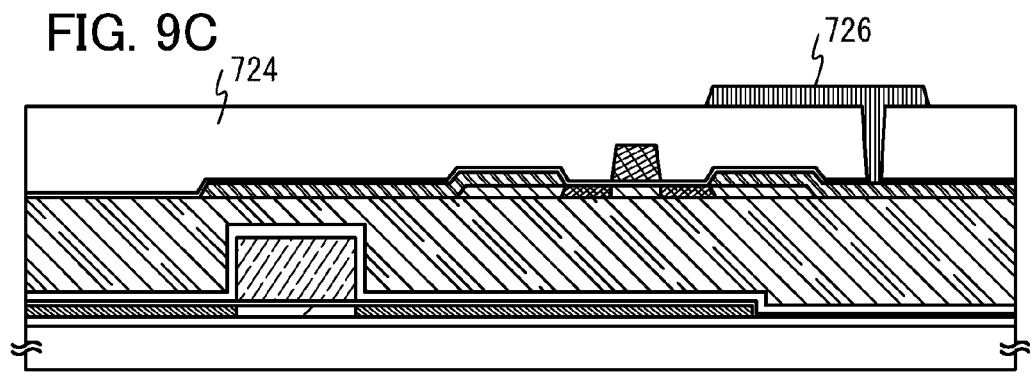

Next, as illustrated in FIG. 9C, an insulating film 724 is formed so as to cover the gate insulating film 721 and the gate electrode 722. The insulating film 724 can be formed by a PVD method, a CVD method, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this structure. The insulating film 724 may have a layered structure of two or more layers.

Next, an opening is formed in the gate insulating film 721 and the insulating film 724, so that part of the conductive layer 720 is exposed. After that, a wiring 726 which is in contact with the conductive layer 720 through the opening is formed over the insulating film 724.

The wiring 726 is formed in such a manner that a conductive film is formed by a PVD method or a CVD method and then the conductive film is processed by etching. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film is formed in a region including the opening of the insulating film 724 by a PVD method and a thin titanium film (with a thickness of approximately 5 nm) is formed by a PVD method, and then an aluminum film is formed so as to be embedded in the opening. Here, the titanium film formed by a PVD method has a function of reducing an oxide film (e.g., a native oxide film) formed on a surface over which the titanium film is formed, to decrease the contact resistance with the lower electrode or the like (here, the conductive layer 720). In addition, hillock of aluminum film can be prevented. A copper film may be formed by a plating method after the formation of the barrier film of titanium, titanium nitride, or the like.

Figure 9D:
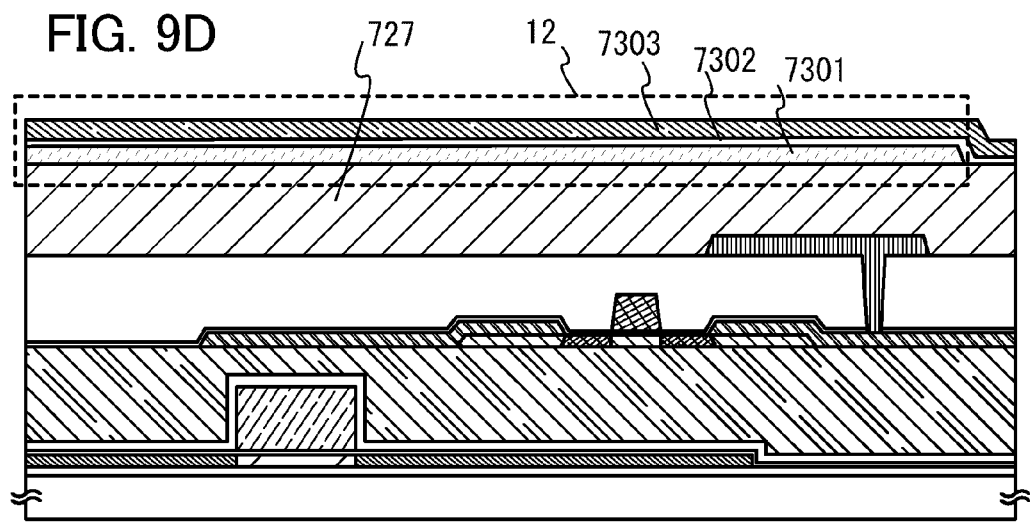

Next, as illustrated in FIG. 9D, an insulating film 727 is formed so as to cover the wiring 726. Further, a conductive film is formed over the insulating film 727 and then is etched, so that a conductive layer 7301 is formed. After that, an insulating film 7302 is formed so as to cover the conductive layer 7301, and a conductive film 7303 is formed over the insulating film 7302. In this manner, the capacitor 12 can be formed. One of a pair of electrodes of the capacitor 12 corresponds to the conductive layer 7301; the other of the pair of electrodes, the conductive film 7303; and a dielectric layer, the insulating film 7302. Here, the insulating film 727, the conductive layer 7301, the insulating film 7302, and the conductive film 7303 can be formed using materials similar to those of other insulating films and conductive layers. Note that the one of the pair of electrodes of the capacitor 12 can be electrically connected to the source, the drain, or the gate of the transistor 11.

Through the series of steps, the semiconductor device can be manufactured.

Through the above steps, in the semiconductor device, the transistor 11 including an oxide semiconductor can be provided over the transistor 133 including a material other than an oxide semiconductor. This makes it possible to downsize the semiconductor device. In the case where a capacitor 12 is provided, the capacitor is further provided over the transistor 133, which makes it possible to downsize the semiconductor device.

When an oxide semiconductor is used for a semiconductor layer in a transistor whose source or drain is connected to a capacitor (the transistor 310 in FIG. 3A and the transistors 310 and 410 in FIG. 4A), leakage of charge held in the capacitor can be prevented. Thus, even when the area of the capacitor 12 is small, the capacitor 12 can keep holding sufficient charge, and the semiconductor device can be downsized synergistically.

This embodiment can be implemented in combination with any of the other embodiments as appropriate.

(Embodiment 7)

In this embodiment, the transistor 11 including an oxide semiconductor layer with a structure different from the structure in Embodiment 6 will be described. Note that the same portions as those in FIGS. 9A to 9D are denoted by the same reference numerals, and description thereof is omitted.

Figure 10A:
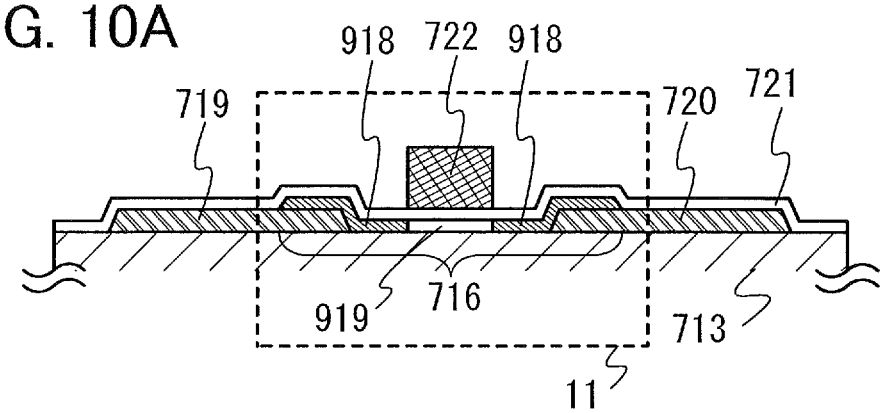
FIGS. 10A to 10C are each a cross-sectional view illustrating a structure of a transistor including an oxide semiconductor.

A transistor 11 illustrated in FIG. 10A is a top-gate transistor in which the gate electrode 722 is formed over the oxide semiconductor layer 716 and is also a bottom-contact transistor in which the source and drain electrodes (the conductive layer 719 and the conductive layer 720) are formed below the oxide semiconductor layer 716.

The oxide semiconductor layer 716 includes a pair of high-concentration regions 918 that can be obtained by adding a dopant imparting n-type conductivity to the oxide semiconductor layer 716 after the gate electrode 722 is formed. In addition, a region of the oxide semiconductor layer 716, which overlaps with the gate electrode 722 with the gate insulating film 721 interposed therebetween, is a channel formation region 919. The oxide semiconductor layer 716 includes the channel formation region 919 between the pair of high-concentration regions 918.

The high-concentration regions 918 can be formed in a manner similar to that of the high-concentration regions 908 in Embodiment 6.

Figure 10B:
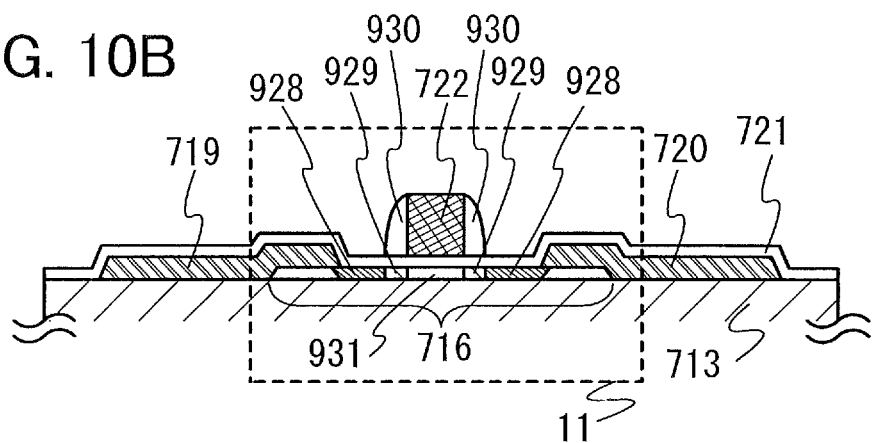

A transistor 11 illustrated in FIG. 10B is a top-gate transistor in which the gate electrode 722 is formed over the oxide semiconductor layer 716 and is also a bottom-contact transistor in which the source and drain electrodes (the conductive layer 719 and the conductive layer 720) are formed over the oxide semiconductor layer 716. The transistor 11 further includes sidewalls 930 that are provided at ends of the gate electrode 722 and are formed using an insulating film.

The oxide semiconductor layer 716 includes a pair of high-concentration regions 928 and a pair of low-concentration regions 929 that can be obtained by adding a dopant imparting n-type conductivity to the oxide semiconductor layer 716 after the gate electrode 722 is formed. In addition, a region of the oxide semiconductor layer 716, which overlaps with the gate electrode 722 with the gate insulating film 721 interposed therebetween, is a channel formation region 931. The oxide semiconductor layer 716 includes the pair of low-concentration regions 929 between the pair of high-concentration regions 928 and the channel formation region 931 between the pair of low-concentration regions 929. Further, the pair of low-concentration regions 929 is provided in a region of the oxide semiconductor layer 716, which overlaps with the sidewalls 930 with the gate insulating film 721 interposed therebetween.

The high-concentration regions 928 and the low-concentration regions 929 can be formed in a manner similar to that of the high-concentration regions 908 in Embodiment 6.

Figure 10C:
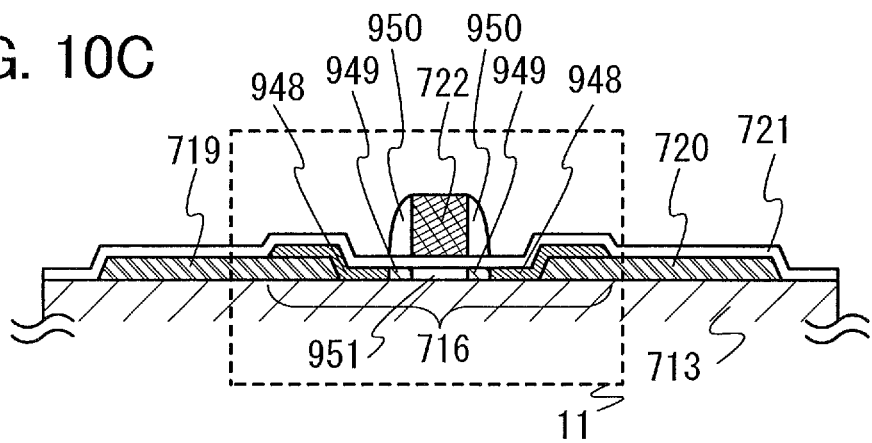

The transistor 11 illustrated in FIG. 10C is a top-gate transistor in which the gate electrode 722 is formed over the oxide semiconductor layer 716 and is also a bottom-contact transistor in which the source and drain electrodes (the conductive layer 719 and the conductive layer 720) are formed below the oxide semiconductor layer 716. The transistor 11 further includes sidewalls 950 that are provided at ends of the gate electrode 722 and are formed using an insulating film.

The oxide semiconductor layer 716 includes a pair of high-concentration regions 948 and a pair of low-concentration regions 949 that can be obtained by adding a dopant imparting n-type conductivity to the oxide semiconductor layer 716 after the gate electrode 722 is formed. In addition, a region of the oxide semiconductor layer 716, which overlaps with the gate electrode 722 with the gate insulating film 721 interposed therebetween, is a channel formation region 951. The oxide semiconductor layer 716 includes the pair of low-concentration regions 949 between the pair of high-concentration regions 948 and the channel formation region 951 between the pair of low-concentration regions 949. Further, the pair of low-concentration regions 949 is provided in a region of the oxide semiconductor layer 716, which overlaps with the sidewalls 950 with the gate insulating film 721 interposed therebetween.

The high-concentration regions 948 and the low-concentration regions 949 can be formed in a manner similar to that of the high-concentration regions 908 in Embodiment 6.

Note that as a method for forming high-concentration regions functioning as a source region and a drain region in a self-aligning process in a transistor including an oxide semiconductor, disclosed is a method in which a surface of an oxide semiconductor layer is exposed and argon plasma treatment is performed so that the resistivity of a region which is exposed to plasma in the oxide semiconductor layer is decreased (S. Jeon et al., "180 nm Gate Length Amorphous InGaZnO Thin Film Transistor for High Density Image Sensor Applications," *IEDM Tech. Dig.*, pp. 504-507, 2010).

However, in the manufacturing method, a gate insulating film needs to be partly removed after formation of the gate insulating film so that portions which are to serve as the source region and the drain region are exposed. Therefore, at the time of removing the gate insulating film, the oxide semiconductor layer which is below the gate insulating film is partially over-etched; thus, the thickness of the portion which is to be the source region and the drain region becomes small. As a result, the resistance of the source region and the drain region is increased, and defects of transistor characteristics due to overetching easily occur.

For further miniaturization of a transistor, it is suitable to adopt a dry-etching method with high process accuracy. However, the overetching easily occurs remarkably in the case where a dry etching method with which the selectivity of a gate insulating film to an oxide semiconductor layer is not sufficiently obtained is employed.

For example, the problem of overetching does not arise when the oxide semiconductor layer has a sufficient thickness. However, when the channel length is to be shorter than or equal to 200 nm, the thickness of the portion of the oxide semiconductor layer to be a channel formation region needs to be less than or equal to 20 nm, preferably less than or equal to 10 nm so as to prevent short-channel effect. When an oxide semiconductor layer has such a small thickness, overetching of the oxide semiconductor layer is unfavorable because the resistance of a source region and a drain region is increased and defects of transistor characteristics are caused as described above.

However, as in one embodiment of the present invention, addition of dopant to an oxide semiconductor layer is performed in the state where a gate insulating film is left so as not to expose the oxide semiconductor; thus, the overetching of the oxide semiconductor layer can be prevented and excessive damage to the oxide semiconductor layer can be reduced. In addition, the interface between the oxide semiconductor layer and the gate insulating film is kept clean. Therefore, the characteristics and reliability of the transistor can be improved.

This embodiment can be implemented in combination with any of the other embodiments as appropriate.

(Embodiment 8)

In this embodiment, a transistor including an oxide semiconductor layer with a structure different from the structure in Embodiment 6 or Embodiment 7 will be described. Note that the same portions as those in FIGS. 9A to 9D are denoted by the same reference numerals, and description thereof is omitted. In the transistor 11 in this embodiment, the gate electrode 722 is provided to overlap with the conductive layers 719 and 720. Further, the transistor 11 in this embodiment differs from the transistor 11 in Embodiment 6 or Embodiment 7 in that the oxide semiconductor layer 716 is not subjected to addition of an impurity element imparting conductivity with the use of the gate electrode 722 as a mask.

Figure 11A:
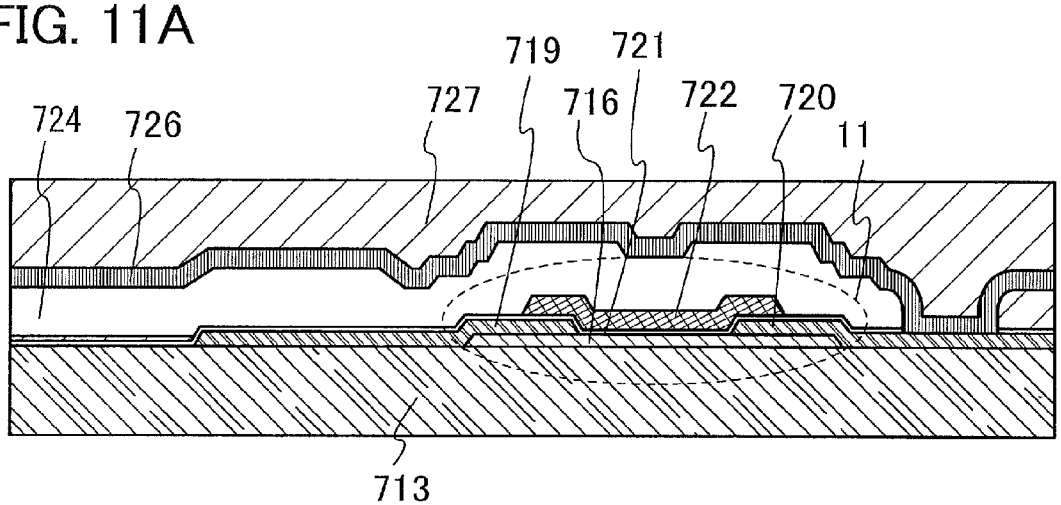
FIGS. 11A and 11B are each a cross-sectional view illustrating a structure of a transistor including an oxide semiconductor.
Figure 11B:
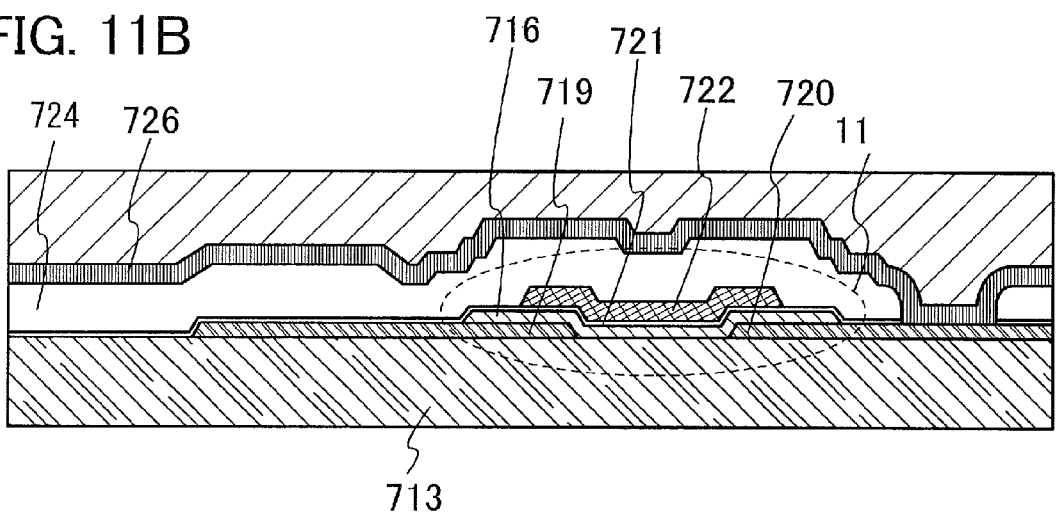

The transistor 11 in FIG. 11A includes the oxide semiconductor layer 716 below the conductive layer 719 and the conductive layer 720. The transistor 11 in FIG. 11B includes the oxide semiconductor layer 716 above the conductive layer 719 and the conductive layer 720. Note that although the upper surface of the insulating film 724 is not planarized in each of FIGS. 11A and 11B, the present invention is not limited to this structure. The upper surface of the insulating film 724 may be planarized.

This embodiment can be implemented in combination with any of the other embodiments as appropriate.

(Embodiment 9)

In this embodiment, a structure of a CPU, one of semiconductor devices according to one embodiment of the present invention, will be described.

Figure 16:
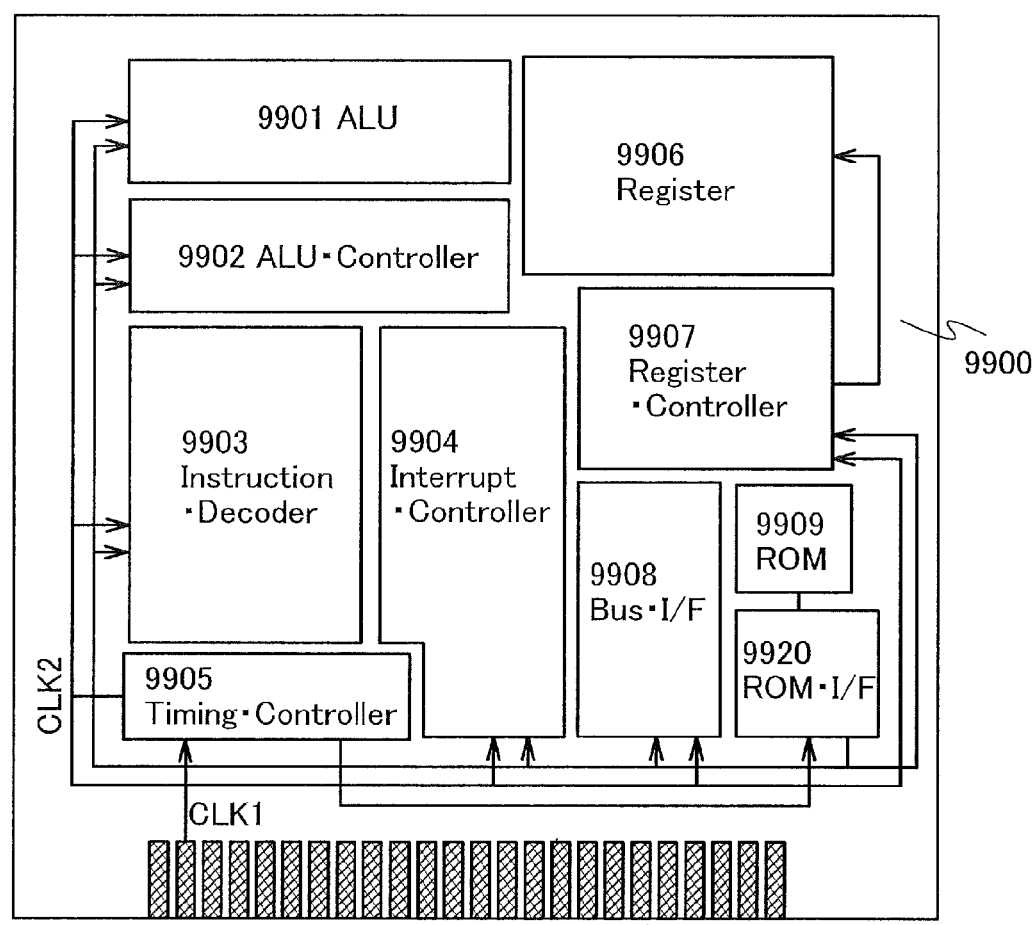
FIG. 16 illustrates a CPU.

FIG. 16 illustrates the structure of the CPU of this embodiment. The CPU illustrated in FIG. 16 mainly includes, over a substrate 9900, an arithmetic logic unit (ALU) 9901, an ALU controller 9902, an instruction decoder 9903, an interrupt controller 9904, a timing controller 9905, a register 9906, a register controller 9907, a bus interface (Bus I/F) 9908, a rewritable ROM 9909, and a ROM interface (ROM I/F) 9920. Further, the ROM 9909 and the ROM I/F 9920 may be provided over different chips. Needless to say, the CPU illustrated in FIG. 16 is just an example in which the structure is simplified, and an actual CPU may have various structures depending on the application.

An instruction which is input to the CPU through the Bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 perform various controls in accordance with the decoded instruction. Specifically, the ALU controller 9902 generates signals for controlling the drive of the ALU 9901. While the CPU is executing a program, the interrupt controller 9904 processes an interrupt request from an external input/output device or a peripheral circuit based on its priority or a mask state. The register controller 9907 generates an address of the register 9906, and reads/writes data from/to the register 9906 depending on the state of the CPU.

The timing controller 9905 generates signals for controlling operation timings of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and supplies the clock signal CLK2 to the above circuits.

In the CPU of this embodiment, any of the semiconductor devices having the structures described in the above embodiments is provided in an input portion, an output portion, or an input/output portion in at least one of the ALU 9901, the ALU controller 9902, the instruction decoder 9903, the interrupt controller 9904, the timing controller 9905, the register 9906, the register controller 9907, the Bus I/F 9908, the rewritable ROM 9909, and the ROM I/F 9920. For example, in the case where any of the semiconductor devices having the structures described in the above embodiments is provided in the register 9906, the register controller 9907 can keep the semiconductor device included in the register 9906 in a high impedance state in which leakage current is suppressed, in response to an instruction from the ALU 9901. As a result, power consumption can be reduced.

In such a manner, the operation of the CPU is stopped temporarily and supply of power supply voltage is stopped by a transistor including an oxide semiconductor, so that leakage current can be prevented, which results in a reduction in power consumption.

Although the CPU is given as an example in this embodiment, the semiconductor device according to one embodiment of the disclosed invention can be applied to an LSI such as a microprocessor, an image processing circuit, a digital signal processor (DSP), or a field programmable gate array (FPGA) without limitation to the CPU.

Further, by using a transistor including an oxide semiconductor, which is included in the semiconductor device according to one embodiment of the disclosed invention, a nonvolatile random access memory can be achieved.

A magnetic tunnel junction element (MTJ element) is known as a nonvolatile random access memory. The MTJ element stores data in a low resistance state when the spin directions in films provided above and below an insulating film are parallel, and stores data in a high resistance state when the spin directions are anti-parallel. Therefore, the MTJ element has a completely different principle from the memory including an oxide semiconductor, which is described in this embodiment. Table 1 shows the comparison between the MTJ element and the semiconductor device of this embodiment.

TABLE 1

| | Spintronics (MTJ element) | OS/Si |
|---|---|---|
| 1) Heat resistance | Curie temperature | Process temperature 500° C. (Reliable at 150° C.) |
| 2) Driving method | Current driving | Voltage drive |
| 3) Principle of writing operation | Changing Spin Direction of Magnetic Substance | On/off FET |
| 4) Si LSI | Suitable for bipolar LSI (MOS transistor is preferred in high integration circuit (Bipolar transistor is unsuitable for High Integration), W is large) | Suitable for MOS LSI |
| 5) Overhead | High (Due to large Joule heat) | Smaller by 2 to 3 or more orders of magnitude (Charge and discharge of parasitic capacitance) |
| 6) Non-volatility | Utilizing Spin | Utilizing small off-state current |
| 7) Number of times of reading operation | Unlimited | Unlimited |
| 8) 3D conversion | Difficult (2 layers at most) | Easy (No limitation on the number of layers) |
| 9) Degree of integration ($F^2$) | 4 $F^2$ to 15 $F^2$ | Depending on the number of layers for 3D conversion (Heat resistance in upper OSFET process is needed) |
| 10) Material | Rare earth with magnetic property | OS material |
| 11) Cost per bit | High | Low (A little high depending on material (e.g., In) for OS) |
| 12) Resistance to magnetic field | Low | High |

The MTJ element is disadvantageous in that its magnetic property is lost when the temperature is higher than or equal to the Curie temperature because it contains a magnetic material. In addition, the MTJ element is compatible with a silicon bipolar device because current driving is employed; however, the bipolar device is unsuitable for high integration. Further, there is a problem in that power consumption is increased by an increase of memory capacity, though the writing current of the MTJ element is extremely low.

In principle, the MTJ element has low resistance to a magnetic field, and the spin direction is easily changed when the MTJ element is exposed to a high magnetic field. In addition, it is necessary to control magnetic fluctuation which is caused by nanoscaling of a magnetic body used for the MTJ element.

Further, a rare earth element is used for the MTJ element; thus, it requires special attention to incorporate a process of forming the MTJ element in a process of forming a silicon semiconductor that is sensitive to metal contamination. Further, the MTJ element is expensive in terms of the material cost per bit.

On the other hand, the transistor including an oxide semiconductor, which is described in this embodiment, has the same element structure and operation principle as a silicon MOSFET except that a semiconductor material for a channel is a metal oxide. Further, the transistor including an oxide semiconductor is not affected by a magnetic field and does not cause soft errors. This shows that the transistor is highly compatible with a silicon integrated circuit.

As shown in Table 1, the memory in which the transistor including an oxide semiconductor and the transistor including silicon are combined has advantages over the spintronics device in many aspects such as the heat resistance, the 3D conversion (stacked-layer structure of three or more layers), and the resistance to a magnetic field.

Note that "overhead" refers to power consumed when data escapes and returns.

As described above, the use of the memory including an oxide semiconductor, which has more advantages than the spintronics device makes it possible to reduce power consumption of a CPU.

This embodiment can be implemented in combination with any of the other embodiments as appropriate.

(Embodiment 10)

The use of the semiconductor device according to one embodiment of the present invention makes it possible to provide electronic devices in which leakage current is suppressed and power consumption is low. In particular, in the case of a portable electronic device which has difficulty in continuously receiving power, an advantage of an increase in continuous operating time can be obtained when a semiconductor device with low power consumption according to an embodiment of the present invention is added as a component of the device.

The semiconductor device according to an embodiment of the present invention can be used for display devices, personal computers, or image reproducing devices provided with recording media (typically, devices which reproduce the content of recording media such as digital versatile discs (DVDs) and have displays for displaying the reproduced images). Other than the above, as examples of an electronic appliance which can include the semiconductor device according to one embodiment of the present invention, the following are given: mobile phones, game machines including portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multi-function printers, automated teller machines (ATM), vending machines, and the like.

Figure 17:
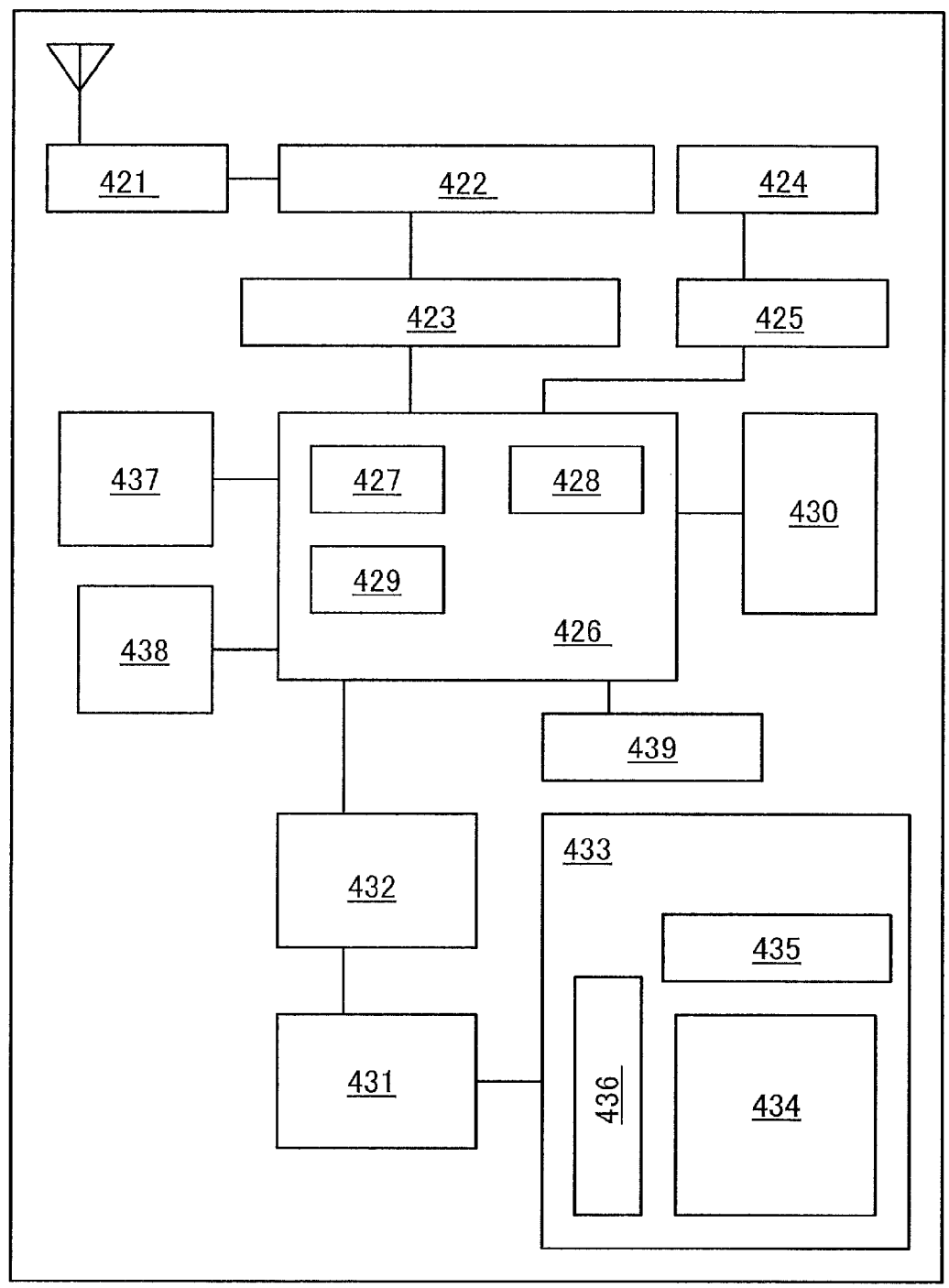
FIG. 17 illustrates a portable electronic device.

The case where the semiconductor device according to one embodiment of the present invention is applied to electronic devices such as a mobile phone, a smartphone, and an e-book reader will be described FIG. 17 is a block diagram of a portable electronic device. The portable electronic device illustrated in FIG. 17 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. For example, when any of the semiconductor devices described in the above embodiments is used for any or all of the CPU 427, the digital baseband circuit 423, the memory circuit 432, the DSP 428, the interface 429, the display controller 431, and the audio circuit 437, leakage current can be suppressed, which results in a reduction in the power consumption.

Figure 18:
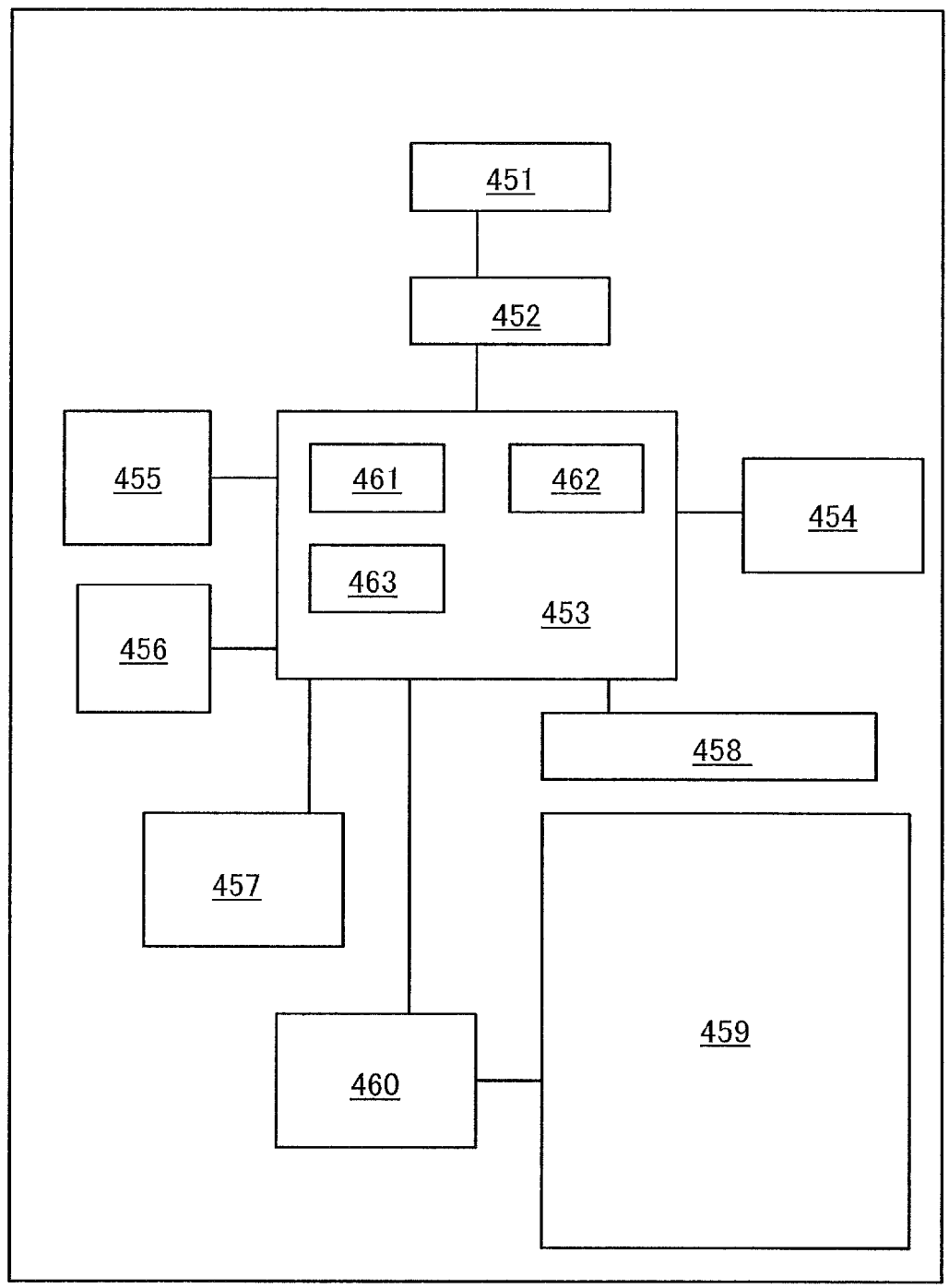
FIG. 18 illustrates an e-book reader.

FIG. 18 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. The microprocessor 453 includes a CPU 461, a DSP 462, and an interface (IF) 463. For example, when any of the semiconductor devices described in the above embodiments is used for any of or all of the CPU 461, the audio circuit 455, the memory circuit 457, the display controller 460, the DSP 462, and the interface 463, leakage current can be reduced, which results in a reduction in the power consumption.

This embodiment can be implemented in combination with any of the other embodiments as appropriate.

(Embodiment 11)

The actually measured field-effect mobility of an insulated gate transistor can be lower than its ideal mobility because of a variety of reasons; this phenomenon occurs not only in the case of using an oxide semiconductor.

One of the factors that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility is expressed as Formula A in FIG. 27A.

In Formula A, E represents the height of the potential barrier, k represents the Boltzmann constant, and T represents the absolute temperature.

When the potential barrier is assumed to be attributed to a defect, the height of the potential barrier is expressed as Formula B in FIG. 27B according to the Levinson model.

In Formula B, e represents the elementary charge, N represents the average defect density per unit area in a channel, $\in$ represents the permittivity of the semiconductor, n represents the number of carriers per unit area in the channel, $C_{ox}$ represents the capacitance per unit area, $V_g$ represents the gate voltage, and t represents the thickness of the channel.

In the case where the thickness of the semiconductor layer is less than or equal to 30 nm, the thickness of the channel may be regarded as being the same as the thickness of the semiconductor layer.

The drain current $I_d$ in a linear region is expressed by Formula C in FIG. 27C.

In Formula C, L represents the channel length and W represents the channel width, and L and W are each 10 μm.

In addition, $V_d$ represents the drain voltage.

When dividing both sides of the formula C by $V_g$ and then taking logarithms of both sides, Formula D in FIG. 27D can be obtained.

The right side of Formula C is a function of $V_g$.

From Formula D, it is found that the defect density N can be obtained from the slope of a line in a graph that is obtained by plotting actual measured values with $\ln(I_d/V_g)$ as the ordinate and $1/V_g$ as the abscissa.

In other words, the defect density can be evaluated from the $I_d$-$V_g$ characteristics of the transistor.

The defect density N of an oxide semiconductor in which the ratio of indium (In) to tin (Sn) and zinc (Zn) is 1:1:1 is approximately $1\times10^{12}/cm^2$.

On the basis of the defect density obtained in this manner, or the like, $\mu_0$ can be calculated to be 120 $cm^2/Vs$.

The measured mobility of an In—Sn—Zn oxide including a defect is approximately 35 $cm^2/Vs$.

However, assuming that no defect exists inside the semiconductor and at the interface between the semiconductor and an insulating film, the mobility $\mu_0$ of the oxide semiconductor is expected to be 120 $cm^2/Vs$.

Note that even when no defect exists inside a semiconductor, scattering at an interface between a channel and a gate insulating film affects the transport property of the transistor. In other words, the mobility $\mu_1$ at a position that is distance x away from the interface between the channel and the gate insulating film can be expressed by Formula E in FIG. 27E.

In Formula E, D represents the electric field in the gate direction, and B and G are constants. Note that B and G can be obtained from actual measurement results; according to the above measurement results, B is $4.75\times10^7$ cm/s and G is 10 nm (the depth to which the influence of interface scattering reaches).

When D is increased (i.e., when the gate voltage is increased), the second term of Formula E is increased and accordingly the mobility $\mu_1$ is decreased.

Figure 19:
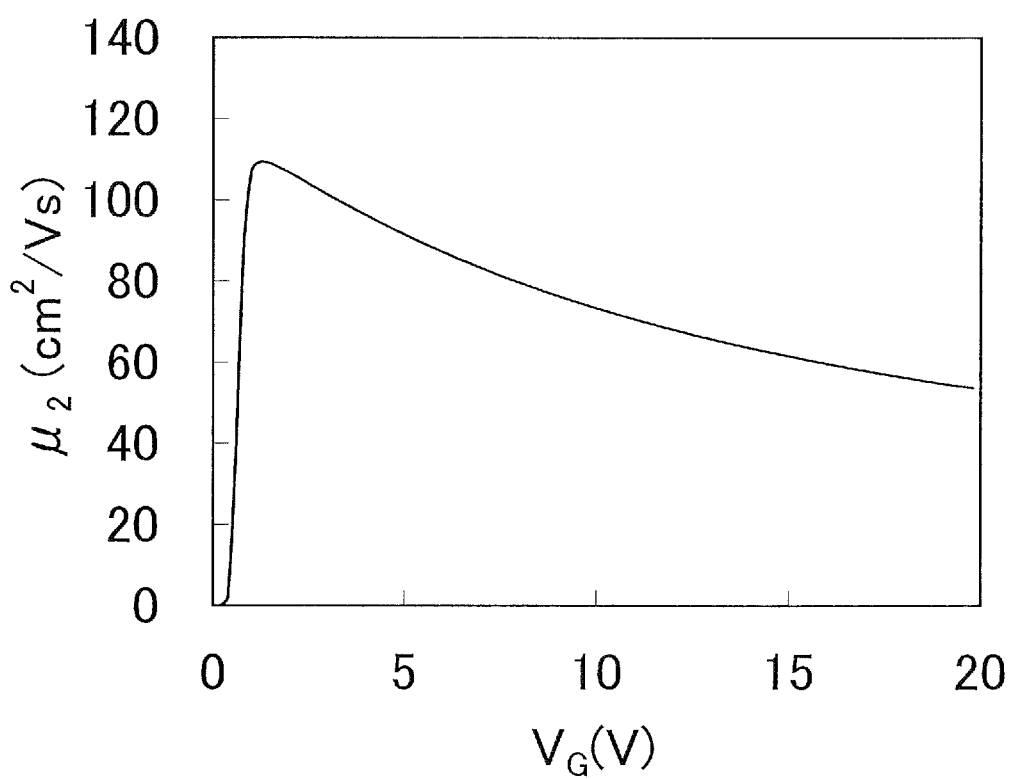
FIG. 19 shows relation between gate voltage and field-effect mobility.

FIG. 19 shows calculation results E of the mobility $\mu_2$ of a transistor whose channel includes an ideal oxide semiconductor without a defect inside the semiconductor.

For the calculation, Sentaurus Device which is software manufactured by Synopsys, Inc. was used.

For the calculation, the band gap, the electron affinity, the relative permittivity, and the thickness of the oxide semiconductor were assumed to be 2.8 eV, 4.7 eV, 15, and 15 nm, respectively.

These values were obtained by measurement of a thin film that was formed by a sputtering method.

Further, the work functions of a gate, a source, and a drain were assumed to be 5.5 eV, 4.6 eV, and 4.6 eV, respectively.

The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in the calculation results E, the mobility has a peak of greater than or equal to 100 $cm^2/Vs$ at a gate voltage that is a little over 1 V and is decreased as the gate voltage becomes higher because the influence of interface scattering is increased.

Note that in order to reduce interface scattering, it is desirable that a surface of the semiconductor layer be flat at the atomic level (atomic layer flatness).

Characteristics of minute transistors which are manufactured using an oxide semiconductor having such mobility were calculated.

The transistor used for calculation includes a channel formation region provided between a pair of n-type semiconductor regions in the oxide semiconductor layer.

The calculation was performed under the condition that the resistivity of the pair of n-type semiconductor regions is $2\times10^{-3}$ Ωcm.

The calculation was performed under the condition that the channel length was 33 nm and the channel width was 40 nm.

Further, a sidewall is provided on the side wall of the gate electrode.

The calculation was performed under the condition that part of the semiconductor region which overlaps with the sidewall is an offset region.

For the calculation, Sentaurus Device which is software manufactured by Synopsys, Inc. was used.

Figure 20A:
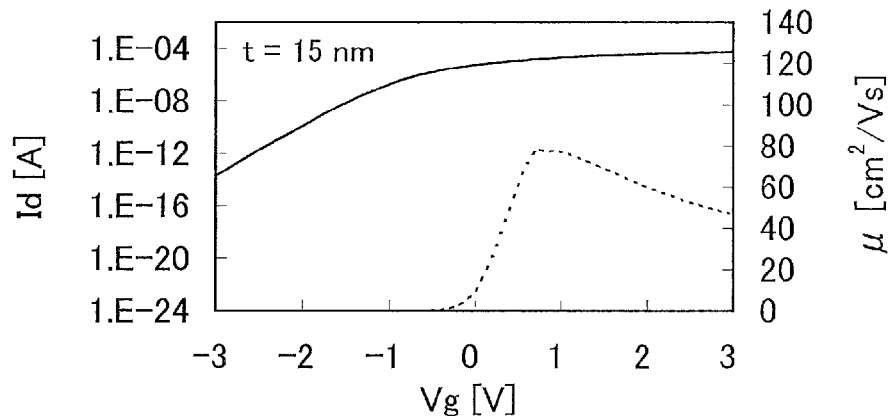
FIGS. 20A to 20C each show relation between gate voltage and drain current.
Figure 20B:
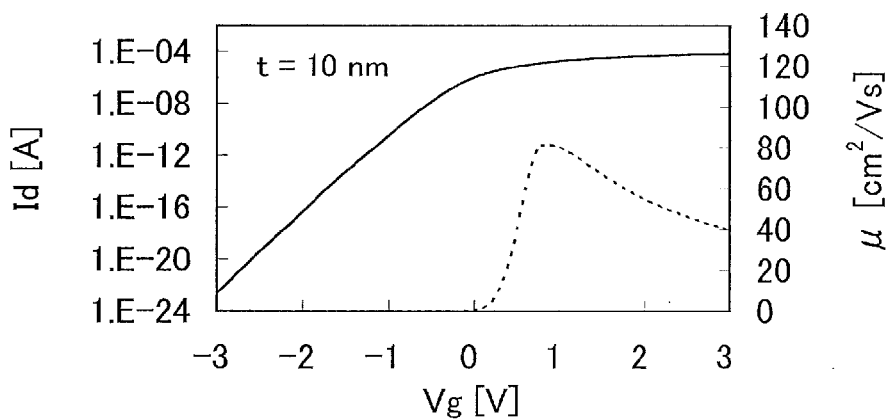
Figure 20C:
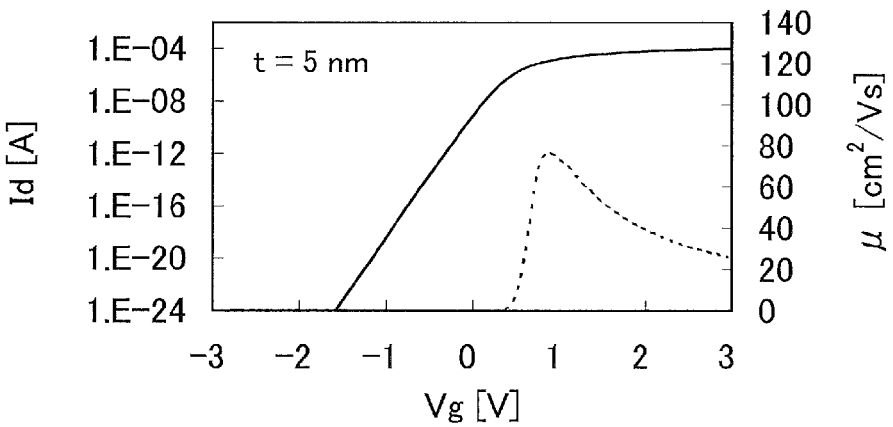

FIGS. 20A to 20C show the gate voltage ($V_g$: a potential difference between the gate and the source) dependence of the drain current ($I_d$, indicated by a solid line) and the mobility (μ, indicted by a dotted line) of the transistor.

The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 20A shows the calculation result under the condition that the thickness of the gate insulating film is 15 nm.

FIG. 20B shows the calculation result under the condition that the thickness of the gate insulating film is 10 nm.

FIG. 20C shows the calculation result under the condition that the thickness of the gate insulating film is 5 nm.

As the gate insulating film is thinner, the drain current $I_d$ (off-state current) particularly in an off state is significantly decreased.

In contrast, there is no noticeable change in the peak value of the mobility μ and the drain current $I_d$ (on-state current) in an on state.

Figure 21A:
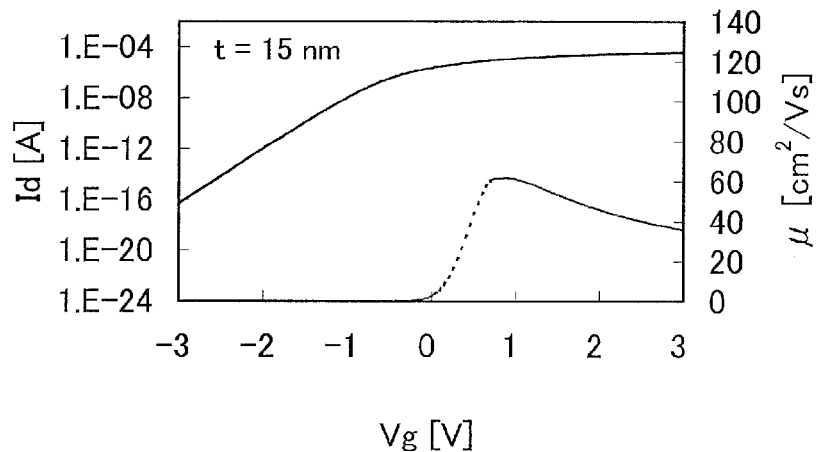
FIGS. 21A to 21C each show relation between gate voltage and drain current.
Figure 21B:
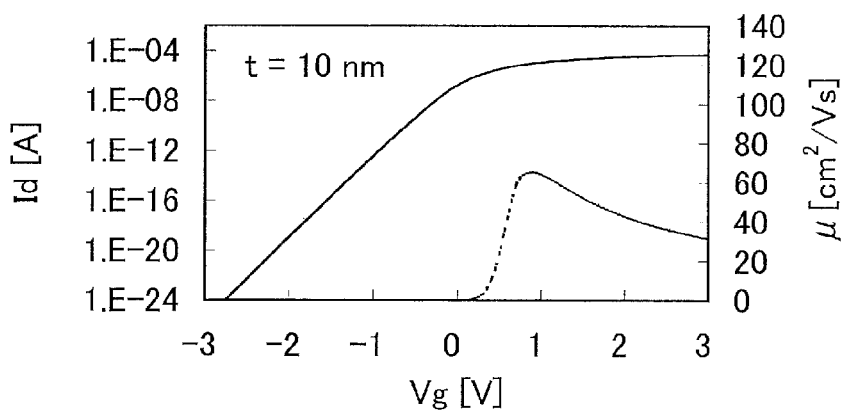
Figure 21C:
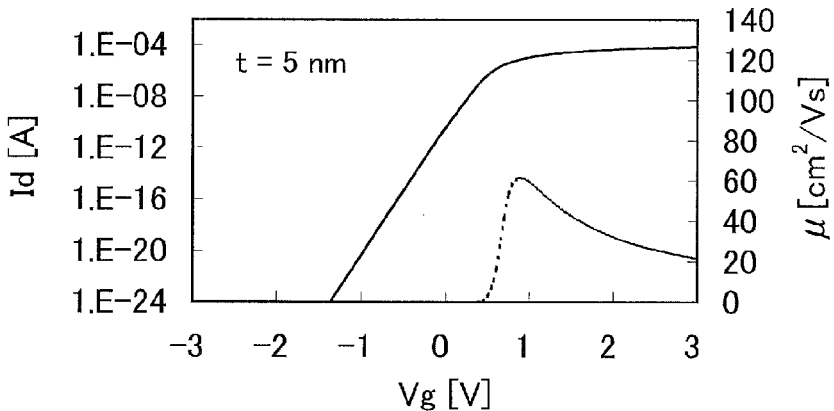

FIGS. 21A to 21C show the gate voltage $V_g$ dependence of the drain current $I_d$ (indicated by a solid line) and the mobility μ (indicated by a dotted line) of the transistor where the offset length (sidewall length) $L_{off}$ is 5 nm.

The drain current $I_d$ is obtained by calculation under the assumption that the drain voltage is +1 V and the mobility μ is obtained by calculation under the assumption that the drain voltage is +0.1 V.

Figure 22A:
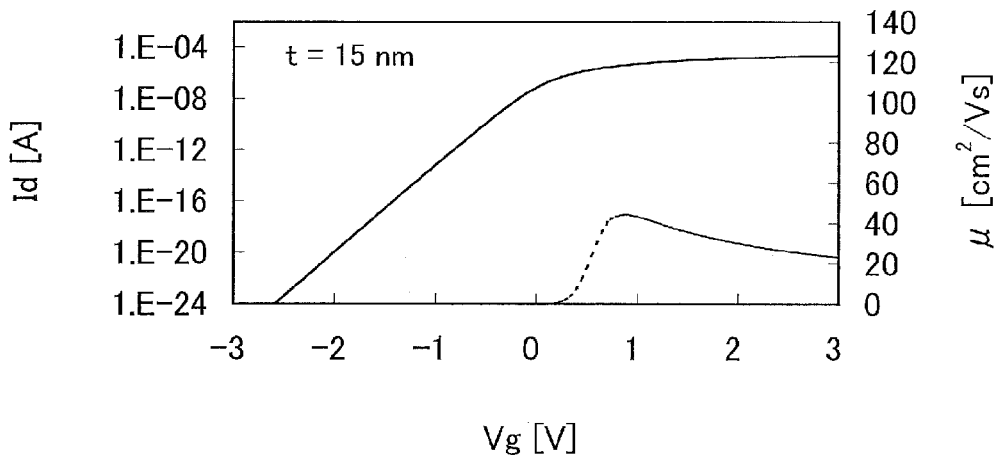
FIGS. 22A to 22C each show relation between gate voltage and drain current.
Figure 22B:
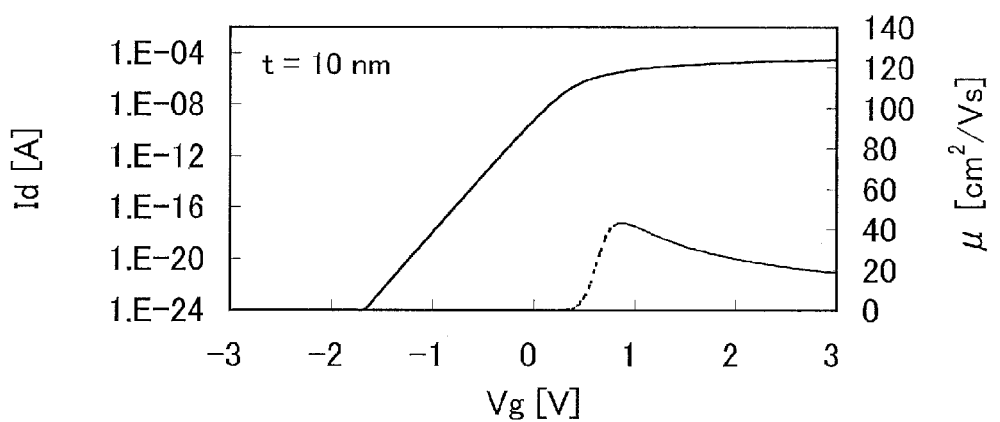
Figure 22C:
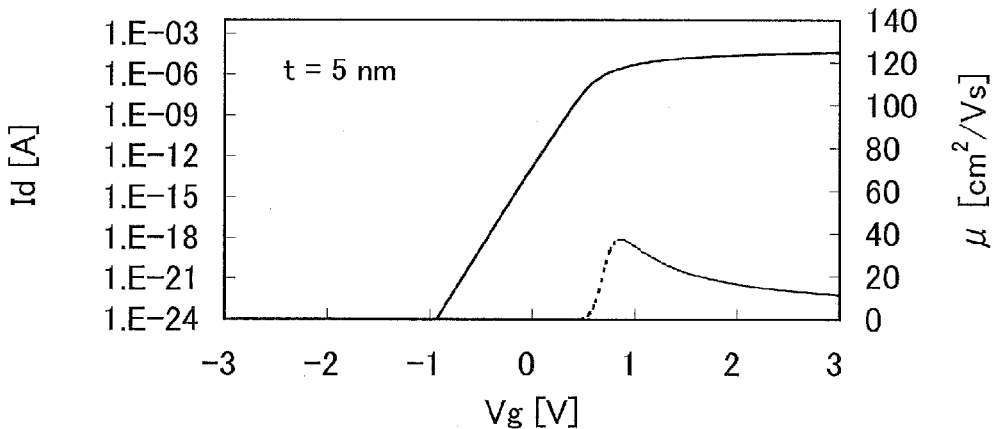

FIG. 21A shows the calculation result under the condition that the thickness of the gate insulating film is 15 nm FIG. 21B shows the calculation result under the condition that the thickness of the gate insulating film is 10 nm FIG. 21C shows the calculation result under the condition that the thickness of the gate insulating film is 5 nm FIGS. 22A to 22C show the gate voltage dependence of the drain current $I_d$ (indicated by a solid line) and the mobility μ (indicated by a dotted line) under the condition that the offset length (sidewall length) $L_{off}$ is 15 nm.

The drain current $I_d$ is obtained by calculation under the assumption that the drain voltage is +1 V and the mobility μ is obtained by calculation under the assumption that the drain voltage is +0.1 V.

FIG. 22A shows the calculation result under the condition that the thickness of the gate insulating film is 15 nm.

FIG. 22B shows the calculation result under the condition that the thickness of the gate insulating film is 10 nm.

FIG. 22C shows the calculation result under the condition that the thickness of the gate insulating film is 5 nm.

In either of the structures, as the gate insulating film is thinner, the off-state current is significantly decreased, whereas no noticeable change arises in the peak value of the mobility μ and the on-state current.

The peak of the mobility m is about 80 cm$^2$/Vs in FIGS. 20A to 20C, about 60 cm$^2$/Vs in FIGS. 21A to 21C, and about 40 cm$^2$/Vs in FIGS. 22A to 22C; thus, the peak of the mobility μ decreases as the offset length $L_{off}$ is increased.

Further, the same applies to the off-state current.

The on-state current is also decreased as the offset length $L_{off}$ is increased; however, the decrease in the on-state current is much more gradual than the decrease in the off-state current.

Further, the graphs show that in either of the structures, the drain current exceeds 10 μA, which is required in a memory element and the like, at a gate voltage of around 1 V.

This embodiment can be implemented in combination with any of the other embodiments as appropriate.

Example 1

A transistor including an oxide semiconductor containing In, Sn, and Zn (In—Sn—Zn-based oxide semiconductor) can have favorable characteristics by deposition of the oxide semiconductor while heating a substrate or by heat treatment after deposition of an oxide semiconductor film.

Note that each of In, Sn, and Zn is preferably contained in a composition ratio at greater than or equal to 5 atomic %.

By intentionally heating the substrate after the deposition of the oxide semiconductor film including In, Sn, and Zn, the field-effect mobility of the transistor can be improved.

The threshold voltage of an n-channel transistor can be positively shifted in the positive direction.

When the threshold voltage of the n-channel transistor is positively shifted, an absolute value of voltage used for holding an off state of the n-channel transistor can be decreased, and power consumption can be reduced.

Further, when the threshold voltage of the n-channel transistor is positively shifted, and the threshold voltage is greater than or equal to 0 V, a normally-off transistor can be formed.

Characteristics of transistors using an oxide semiconductor containing In, Sn, and Zn will be described below.

(Common Conditions of Samples A to C)

An oxide semiconductor layer was formed over a substrate to have a thickness of 15 nm under the following conditions: a target having a composition ratio of In:Sn:Zn=1:1:1 is used; the gas flow rate is Ar/O$_2$=6/9 sccm; the deposition pressure is 0.4 Pa; and the deposition power is 100 W.

Next, the oxide semiconductor layer was etched in an island shape.

Then, a tungsten layer was deposited over the oxide semiconductor layer to have a thickness of 50 nm, and was etched, so that a source electrode and a drain electrode were formed.

Next, a silicon oxynitride film (SiON) was formed so as to have a thickness of 100 nm, using silane gas (SiH$_4$) and dinitrogen monoxide (N$_2$O) by a plasma CVD method, so that the silicon oxynitride film served as a gate insulating layer.

Then, a gate electrode was formed in the following manner: a tantalum nitride layer was formed to have a thickness of 15 nm; a tungsten layer was formed to have a thickness of 135 nm; and these were etched.

After that, a silicon oxynitride (SiON) film with a thickness of 300 nm and a polyimide film with a thickness of 1.5 μm were formed as an interlayer insulating film by a plasma CVD method.

Next, a pad for measurement was formed in the following manner: a contact hole was formed in the interlayer insulating film; a first titanium film was formed to have a thickness of 50 nm; an aluminum film was formed to have a thickness of 100 nm; a second titanium film was formed to have a thickness of 50 nm; and these films were etched.

In this manner, a semiconductor device including a transistor was manufactured.

(Sample A)

In Sample A, heating was not performed on the substrate during the deposition of the oxide semiconductor layer.

Further, in Sample A, heat treatment was not performed after the deposition of the oxide semiconductor layer and before the etching of the oxide semiconductor layer.

(Sample B)

In Sample B, the oxide semiconductor layer was deposited with the substrate heated at 200° C.

Further, in Sample B, heat treatment was not performed after the deposition of the oxide semiconductor layer and before the etching of the oxide semiconductor layer.

The oxide semiconductor layer was deposited while the substrate was heated in order to remove hydrogen serving as a donor in the oxide semiconductor layer.

(Sample C)

In Sample C, the oxide semiconductor layer was deposited with the substrate heated at 200° C.

Further, in Sample C, after the oxide semiconductor layer was deposited and before the oxide semiconductor layer was etched, heat treatment in a nitrogen atmosphere was performed at 650° C. for 1 hour and then heat treatment in an oxygen atmosphere was performed at 650° C. for 1 hour.

The heat treatment at 650° C. for 1 hour in a nitrogen atmosphere was performed in order to remove hydrogen serving as a donor in the oxide semiconductor layer.

Oxygen is also removed by the heat treatment for removing hydrogen which serves as a donor in the oxide semiconductor layer, causing oxygen vacancy serving as a carrier in the oxide semiconductor layer.

Hence, heat treatment was performed at 650° C. for 1 hour in an oxygen atmosphere to reduce oxygen vacancy.

(Characteristics of Transistors of Sample A to Sample C)

Figure 23A:
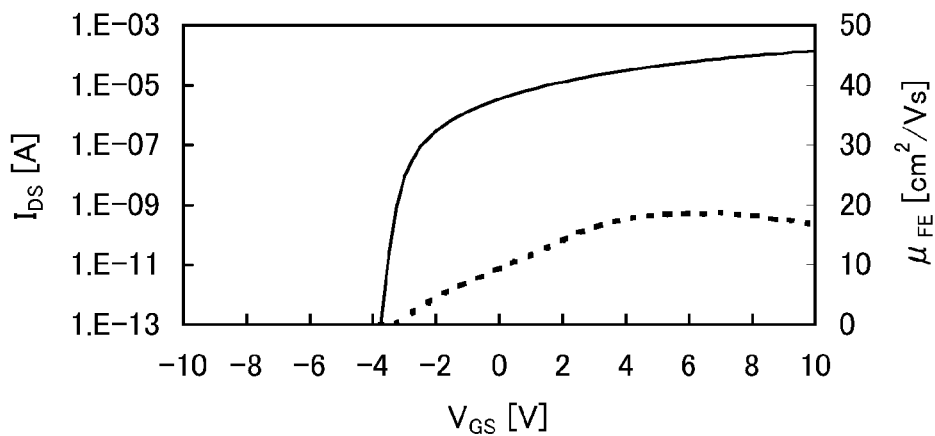
FIGS. 23A to 23C each show characteristics of a transistor.

FIG. 23A shows initial characteristics of a transistor of Sample A.

Figure 23B:
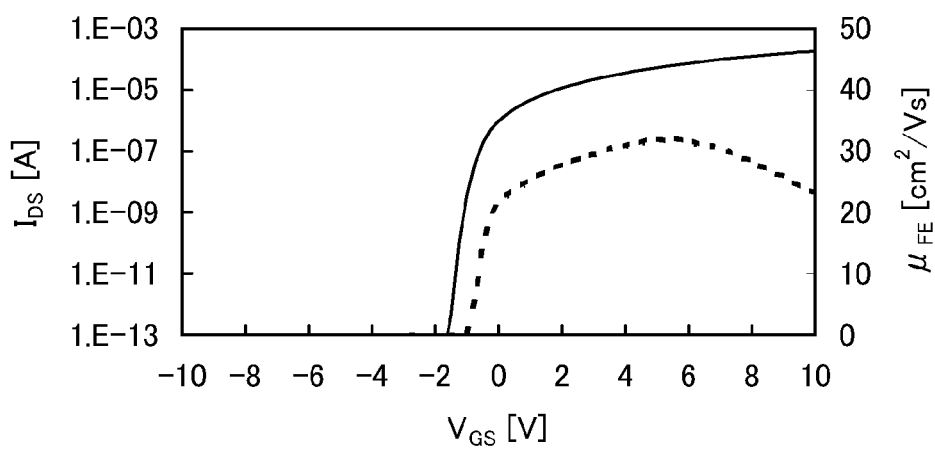

FIG. 23B shows initial characteristics of a transistor of Sample B.

Figure 23C:
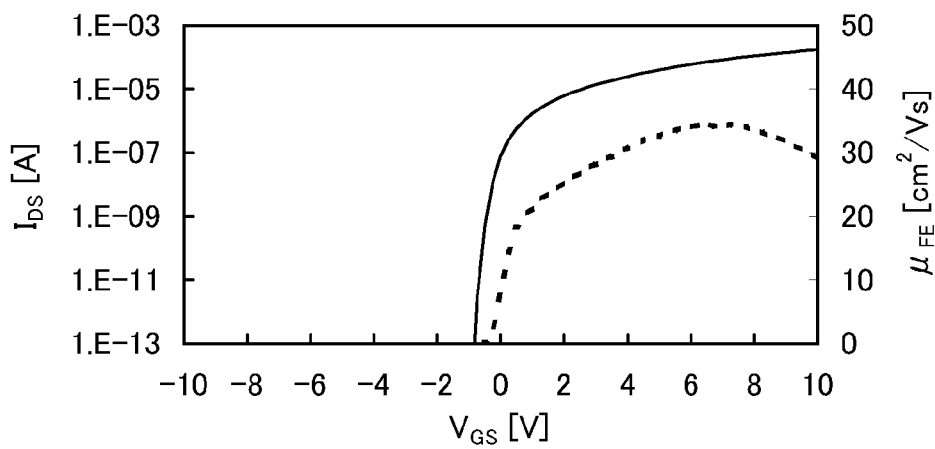

FIG. 23C shows initial characteristics of a transistor of Sample C.

The field-effect mobility of the transistor of Sample A was 18.8 cm$^2$/Vsec.

The field-effect mobility of the transistor of Sample B was 32.2 cm$^2$/Vsec.

The field-effect mobility of the transistor of Sample C was 34.5 cm$^2$/Vsec.

According to observation of cross sections of oxide semiconductor layers, which were formed by deposition methods similar to those of Samples A to C, with a transmission electron microscope (TEM), crystallinity was observed in samples formed by the deposition methods similar to those of Sample B and Sample C, substrates of which were heated during deposition.

Further, surprisingly, the samples, the substrates of which were heated during deposition, had a non-crystalline portion and a crystalline portion having a c-axis crystalline orientation.

In a conventional polycrystal, crystals in the crystalline portion are not aligned and point in different directions. This means that the samples, the substrates of which were heated during deposition, have a novel structure.

Comparison between FIGS. 23A to 23C brings understanding that heat treatment performed on the substrate during or after deposition can remove an hydrogen element serving as a donor, thereby shifting the threshold voltage of the n-channel transistor in the positive direction.

That is, the threshold voltage of Sample B in which heating was performed on the substrate during deposition is shifted in the positive direction as compared to the threshold voltage of Sample A in which heating was not performed on the substrate during deposition.

In addition, comparison between Sample B and Sample C, the substrates of which were heated during deposition, shows that the threshold voltage of Sample C with the heat treatment after deposition is more shifted in the positive direction than the threshold voltage of Sample B without the heat treatment after deposition.

As the temperature of heat treatment is higher, a light element such as hydrogen is removed more easily; therefore, hydrogen is more likely to be removed as the temperature of heat treatment is higher.

It is therefore likely that the threshold voltage can be more shifted in the positive direction by further increasing the temperature of the heat treatment during or after deposition.

(Results of the Gate BT Stress Test of Sample B and Sample C)

The gate BT stress test was performed on Sample B (without heat treatment after deposition) and Sample C (with heat treatment after deposition).

First, the $V_{gs}$-$I_{ds}$ characteristics of each transistor were measured at a substrate temperature of 25° C. and $V_{ds}$ of 10 V to measure the characteristics of the transistor before heating and application of high positive voltage.

Then, the substrate temperature was set to 150° C. and $V_{ds}$ was set to 0.1 V.

After that, $V_{gs}$ of 20 V was applied to the gate insulating film and the condition was kept for 1 hour.

Then, $V_{gs}$ was set to 0 V.

Next, the $V_{gs}$-$I_{ds}$ characteristics of the transistor were measured at a substrate temperature of 25° C. and $V_{ds}$ of 10 V to measure the characteristics of the transistor after heating and application of high positive voltage.

Comparison of the characteristics of the transistor before and after heating and application of high positive voltage as described above is referred to as a positive BT test.

On the other hand, first, the $V_{gs}$-$I_{ds}$ characteristics of each transistor were measured at a substrate temperature of 25° C. and $V_{ds}$ of 10 V to measure the characteristics of the transistor before heating and application of high negative voltage.

Then, the substrate temperature was set to 150° C. and $V_{ds}$ was set to 0.1 V.

After that, −20 V of $V_{gs}$ was applied to the gate insulating film and the condition was kept for 1 hour.

Then, $V_{gs}$ was set to 0 V.

On the other hand, the $V_{gs}$-$I_{ds}$ characteristics of each transistor were measured at a substrate temperature of 25° C. and $V_{ds}$ of 10 V to measure the characteristics of the transistor before heating and application of high negative voltage.

Comparison of the characteristics of the transistor before and after heating and application of high negative voltage as described above is referred to as a negative BT test.

Figure 24A:
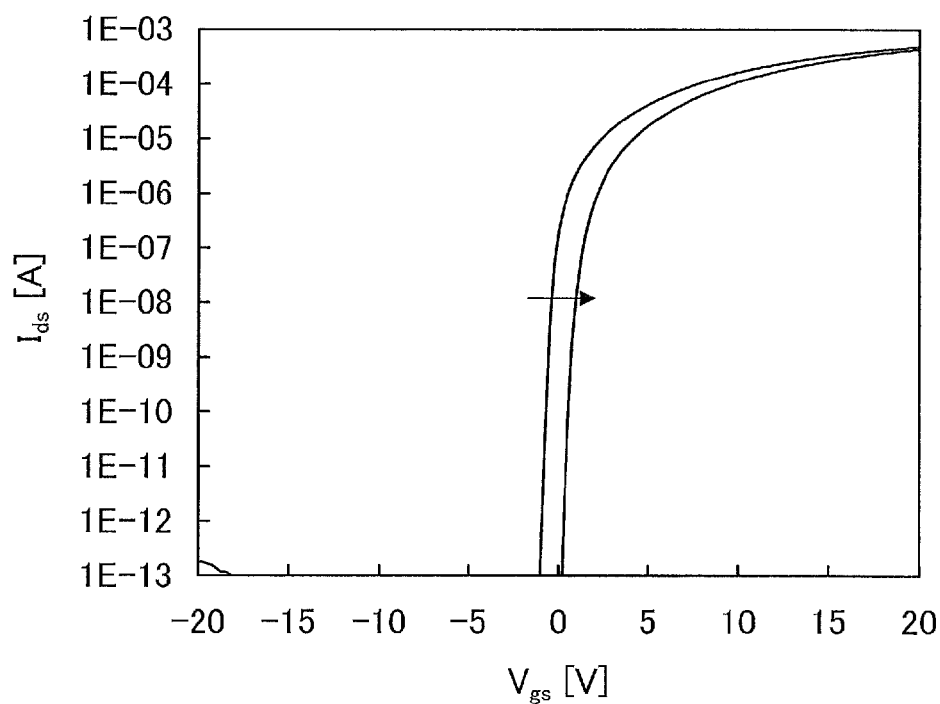
FIGS. 24A and 24B each show characteristics of a transistor.
Figure 24:
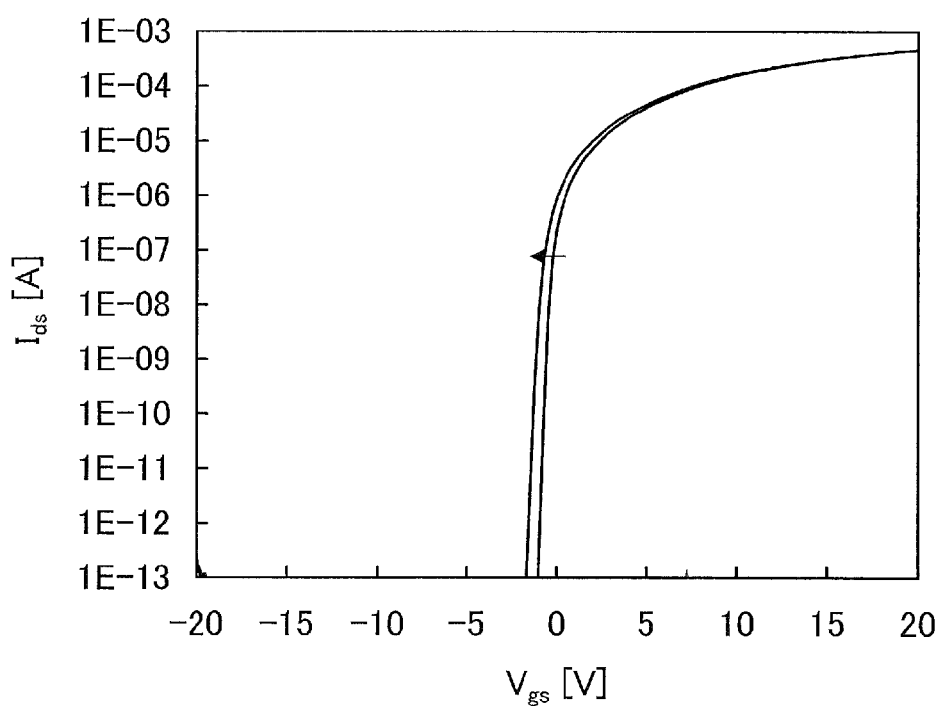

FIG. 24A shows results of the positive BT test of Sample B, and FIG. 24B shows results of the negative BT test of Sample B.

Figure 25A:
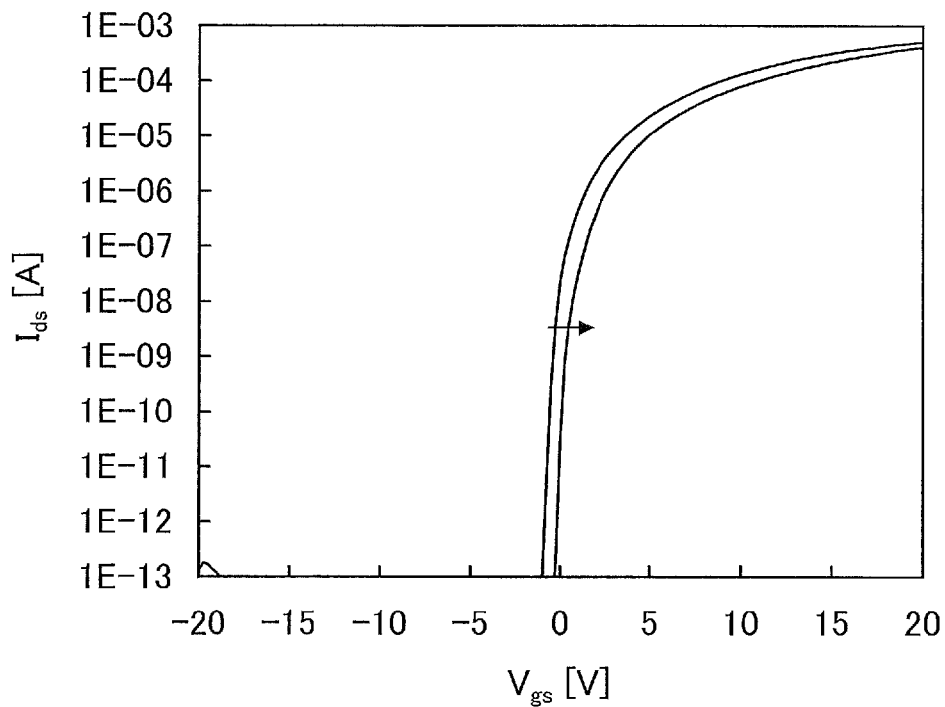
FIGS. 25A and 25B each show characteristics of a transistor.
Figure 25B:
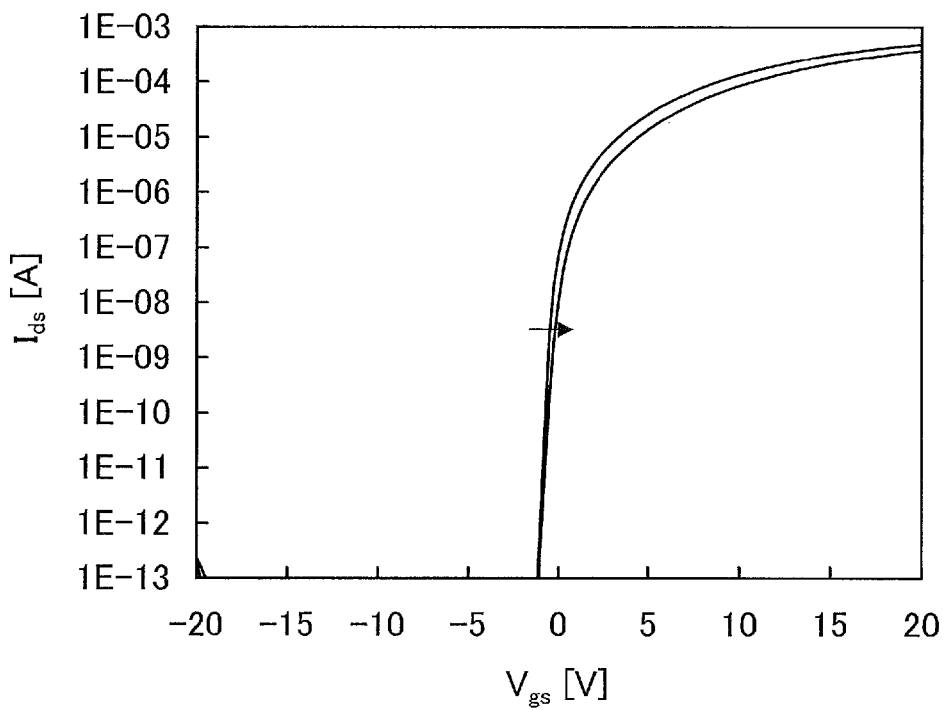

FIG. 25A shows results of the positive BT test of Sample C, and FIG. 25B shows results of the negative BT test of Sample C.

The positive BT test and the negative BT test are tests used to determine deterioration of the transistors; FIGS. 24A and 25A show that the threshold voltage can be shifted in the positive direction by performing at least the positive BT test.

In particular, FIG. 24A shows that the positive BT test made the transistor a normally-off transistor.

It is therefore found that performing the positive BT test in addition to the heat treatment in the manufacturing process of the transistor makes it possible to promote a shift of the threshold voltage in the positive direction and consequently a normally-off transistor can be manufactured.

Figure 26:
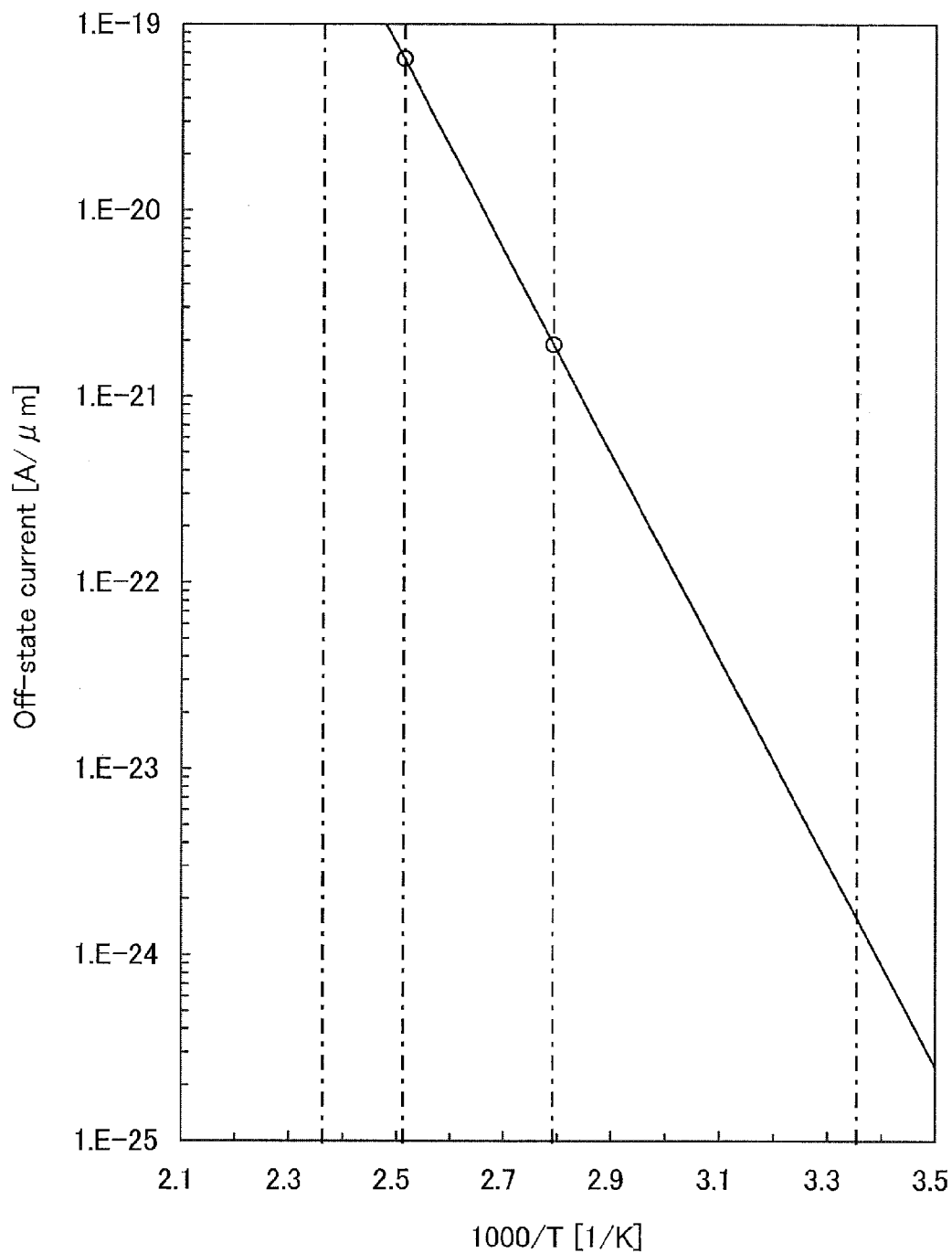
FIG. 26 shows temperature dependence of off-state current of a transistor.

FIG. 26 shows the relation between the off-state current of the transistor of Sample A and the inverse of the substrate temperature (absolute temperature) at measurement.

In FIG. 26, the horizontal axis represents a value (1000/T) obtained by multiplying the inverse of the substrate temperature at measurement by 1000.

The amount of current in FIG. 26 is the amount of current per micrometer in the channel width.

The off-state current was lower than or equal to $1 \times 10^{-19}$ A at a substrate temperature of 125° C. (1000/T is about 2.51).

The off-state current was less than or equal to $1 \times 10^{-20}$ A at a substrate temperature of 85° C. (1000/T is about 2.79).

That is, the off-state current of the transistor containing an oxide semiconductor is found to be extremely low as compared to a transistor containing a silicon semiconductor.

The off-state current is decreased as the temperature is lower; therefore, it is clear that lower off-state current is obtained at room temperature.

The contents of this example or part thereof can be implemented in combination with any of the embodiments.

This application is based on Japanese Patent Application serial no. 2011-112957 filed with Japan Patent Office on May 20, 2011, the entire contents of which are hereby incorporated by reference.

EXPLANATION OF REFERENCE

11: transistor, 12: capacitor, 100: semiconductor device, 110: transistor, 111: transistor, 112: transistor, 113: transistor, 115: inverter, 116: output terminal, 133: transistor, 300: semiconductor device, 310: transistor, 311: capacitor, 312: resistor, 313: node, 400: semiconductor device, 410: transistor, 421: RF circuit, 422: analog baseband circuit, 423: digital baseband circuit, 424: battery, 425: power supply circuit, 426: application processor, 427: CPU, 428: DSP, 429: interface, 430: flash memory, 431: display controller, 432: memory circuit, 433: display, 434: display portion, 435: source driver, 436: gate driver, 437: audio circuit, 438: keyboard, 439: touch sensor, 451: battery, 452: power supply circuit, 453: microprocessor, 454: flash memory, 455: audio circuit, 456: keyboard, 457: memory circuit, 458: touch panel, 459: display, 460: display controller, 461: CPU, 462: DSP, 463: interface, 500: semiconductor device, 512: transistor, 520: inverter, 601: three-state inverter circuit, 602: three-state inverter circuit, 603: three-state inverter circuit, 700: substrate, 701: insulating film, 702: semiconductor film, 703: gate insulating film, 704: semiconductor layer, 707: gate electrode, 709: impurity region, 710: channel formation region, 712: insulating film, 713: insulating film, 716: oxide semiconductor layer, 719: conductive layer, 720: conductive layer, 721: gate insulating film, 722: gate electrode, 724: insulating film, 726: wiring, 727: insulating film, 908: high-concentration region, 918: high-concentration region, 919: channel formation region, 928: high-concentration region, 929: low-concentration region, 930: sidewall, 931: channel formation region, 948: high-concentration region, 949: low-concentration region, 950: sidewall, 951: channel formation region, 7301: conductive layer, 7302: insulating film, 7303: conductive film, 9900: substrate, 9901: ALU, 9902: ALU☐controller, 9903: instruction☐decoder, 9904: interrupt☐controller, 9905: timing☐controller, 9906: register, 9907: register☐controller, 9908: Bus☐I/F, 9909: ROM, and 9920: ROM☐I/F.

The invention claimed is:

1. A semiconductor device comprising:
first to fourth transistors;
an output terminal,
wherein an input signal is input to a gate of the first transistor and a gate of the second transistor,
wherein one of a source and a drain of the first transistor is electrically connected to one of a source and a drain of the second transistor and the output terminal,
wherein the other of the source and the drain of the first transistor is electrically connected to one of a source and a drain of the third transistor,
wherein the other of the source and the drain of the second transistor is electrically connected to one of a source and a drain of the fourth transistor, and
wherein the third transistor and the fourth transistor comprise an oxide semiconductor and have same type conductivity.

2. The semiconductor device according to claim 1,
wherein the first transistor and the second transistor are provided over a substrate or in the substrate, and
wherein the third transistor and the fourth transistor are provided over the first transistor and the second transistor.

3. The semiconductor device according to claim 1, wherein the oxide semiconductor is an In—Ga—Zn-based oxide semiconductor or an In—Sn—Zn-based oxide semiconductor.

4. The semiconductor device according to claim 1, wherein the first transistor has p-type conductivity and the second transistor has n-type conductivity.

5. A semiconductor device comprising:
first to fifth transistors;
a capacitor; and
a resistor,
wherein a gate of the first transistor is electrically connected to a gate of the second transistor,
wherein one of a source and a drain of the first transistor is electrically connected to one of a source and a drain of the second transistor,
wherein one of a source and a drain of the third transistor is electrically connected to the other of the source and the drain of the first transistor,
wherein the other of the source and the drain of the third transistor is electrically connected to a wiring having a function of supplying first potential,
wherein a gate of the third transistor is electrically connected to a first terminal of the capacitor, one of a source and a drain of the fifth transistor, and a first terminal of the resistor,
wherein one of a source and a drain of the fourth transistor is electrically connected to the other of the source and the drain of the second transistor,
wherein the other of the source and the drain of the fourth transistor is electrically connected to a wiring having a function of supplying second potential lower than the first potential,
wherein a gate of the fourth transistor is electrically connected to a second terminal of the capacitor and a first wiring,
wherein the other of the source and the drain of the fifth transistor is electrically connected to the wiring having the function of supplying the first potential,
wherein a gate of the fifth transistor is electrically connected to a second wiring, and
wherein the third transistor, the fourth transistor, and the fifth transistor comprise an oxide semiconductor.

6. The semiconductor device according to claim 5,
wherein the first transistor and the second transistor are provided over a substrate or in the substrate, and wherein the third transistor and the fourth transistor are provided over the first transistor and the second transistor.

7. The semiconductor device according to claim 5,
wherein the first transistor and the second transistor are provided over a substrate or in the substrate,
wherein the third transistor and the fourth transistor are provided over the first transistor and the second transistor, and
wherein the capacitor is provided over the third transistor and the fourth transistor.

8. The semiconductor device according to claim 5, wherein the oxide semiconductor is an In—Ga—Zn-based oxide semiconductor or an In—Sn—Zn-based oxide semiconductor.

9. The semiconductor device according to claim 5, wherein the first transistor has p-type conductivity and the second transistor has n-type conductivity.

10. A semiconductor device comprising:
first to sixth transistors; and
a capacitor,
wherein a gate of the first transistor is electrically connected to a gate of the second transistor,
wherein one of a source and a drain of the first transistor is electrically connected to one of a source and a drain of the second transistor,
wherein one of a source and a drain of the third transistor is electrically connected to the other of the source and the drain of the first transistor,
wherein the other of the source and the drain of the third transistor is electrically connected to a wiring having a function of supplying first potential,
wherein a gate of the third transistor is electrically connected to a first terminal of the capacitor, one of a source and a drain of the fifth transistor and one of a source and a drain of the sixth transistor,
wherein one of a source and a drain of the fourth transistor is electrically connected to the other of the source and the drain of the second transistor,
wherein the other of the source and the drain of the fourth transistor is electrically connected to a wiring having a function of supplying second potential lower than the first potential,
wherein a gate of the fourth transistor is electrically connected to a second terminal of the capacitor and a first wiring,
wherein the other of the source and the drain of the fifth transistor is electrically connected to the wiring having the function of supplying the first potential,
wherein a gate of the fifth transistor is electrically connected to a second wiring,
wherein the other of the source and the drain of the sixth transistor is electrically connected to the wiring having the function of supplying the second potential,
wherein a gate of the sixth transistor is electrically connected to a third wiring, and
wherein the third transistor, the fourth transistor, the fifth transistor, and the sixth transistor comprise an oxide semiconductor.

11. The semiconductor device according to claim 10,
wherein the first transistor and the second transistor are provided over a substrate or in the substrate, and
wherein the third transistor and the fourth transistor are provided over the first transistor and the second transistor.

12. The semiconductor device according to claim 10,
wherein the first transistor and the second transistor are provided over a substrate or in the substrate,
wherein the third transistor and the fourth transistor are provided over the first transistor and the second transistor, and
wherein the capacitor is provided over the third transistor and the fourth transistor.

13. The semiconductor device according to claim 10, wherein the oxide semiconductor is an In—Ga—Zn-based oxide semiconductor or an In—Sn—Zn-based oxide semiconductor.

14. The semiconductor device according to claim 10, wherein the first transistor has p-type conductivity and the second transistor has n-type conductivity.

15. The semiconductor device according to claim 1,
wherein the other of the source and the drain of the third transistor is electrically connected to a wiring having a function of supplying first potential, and
wherein the other of the source and the drain of the fourth transistor is electrically connected to a wiring having a function of supplying second potential lower than the first potential.

* * * * *